(12) United States Patent
Masuoka et al.

(10) Patent No.: US 10,734,391 B2
(45) Date of Patent: Aug. 4, 2020

(54) SGT-INCLUDING PILLAR-SHAPED SEMICONDUCTOR DEVICE AND METHOD FOR PRODUCING THE SAME

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/238,816

(22) Filed: Jan. 3, 2019

(65) Prior Publication Data

US 2019/0252392 A1 Aug. 15, 2019

Related U.S. Application Data

(60) Division of application No. 15/655,168, filed on Jul. 20, 2017, now Pat. No. 10,217,865, which is a
(Continued)

(30) Foreign Application Priority Data

Apr. 6, 2015 (WO) .................... PCTJP2015060763
Jul. 8, 2015 (WO) .................... PCTJP2015069689

(51) Int. Cl.
*H01L 21/225* (2006.01)
*H01L 27/11* (2006.01)
(Continued)

(52) U.S. Cl.
CPC ...... *H01L 27/1104* (2013.01); *H01L 21/2018* (2013.01); *H01L 21/2253* (2013.01);
(Continued)

(58) Field of Classification Search
CPC ......... H01L 21/76805; H01L 21/76831; H01L 21/76877; H01L 23/5226; H01L 27/11;
(Continued)

(56) References Cited

U.S. PATENT DOCUMENTS

2003/0136978 A1 7/2003 Takaura et al.
2004/0262635 A1 12/2004 Lee
(Continued)

FOREIGN PATENT DOCUMENTS

JP H02-188966 A 7/1990
JP H03-024753 A 2/1991
(Continued)

OTHER PUBLICATIONS

Gandhi, R. et al. "Vertical Si-Nanowire n-Type Tunneling FETs With Low Subthreshold Swing(<50mV/decade) at Room Temperature", *IEEE Electron Device Letter*, vol. 32, No. 4, 2011 pp. 437-439.
(Continued)

*Primary Examiner* — Shahed Ahmed
(74) *Attorney, Agent, or Firm* — Brinks Gilson & Lione

(57) ABSTRACT

A first contact hole is formed so as to extend to a NiSi layer as a lower wiring conductor layer connecting to an N+ layer of an SGT formed within a Si pillar, and so as to extend through a NiSi layer as an upper wiring conductor layer connecting to a gate TiN layer, and a NiSi layer as an intermediate wiring conductor layer connecting to an N+ layer. A second contact hole is formed so as to extend to the NiSi layer, and surround, in plan view, the first contact hole. An insulating SiO2 layer is formed on a side surface of the NiSi layer. A wiring metal layer in the contact holes connects the NiSi layer and the NiSi layer to each other.

6 Claims, 57 Drawing Sheets

Related U.S. Application Data continuation of application No. PCT/JP2015/078776, filed on Oct. 9, 2015.

(51) Int. Cl.

| | | |
|---|---|---|
| H01L 23/485 | (2006.01) | |
| H01L 29/423 | (2006.01) | |
| H01L 21/768 | (2006.01) | |
| H01L 23/522 | (2006.01) | |
| H01L 29/66 | (2006.01) | |
| H01L 29/78 | (2006.01) | |
| H01L 21/20 | (2006.01) | |
| H01L 21/28 | (2006.01) | |
| H01L 21/285 | (2006.01) | |
| H01L 21/76 | (2006.01) | |
| H01L 21/764 | (2006.01) | |
| H01L 21/822 | (2006.01) | |
| H01L 21/8234 | (2006.01) | |
| H01L 23/528 | (2006.01) | |
| H01L 29/04 | (2006.01) | |
| H01L 29/06 | (2006.01) | |
| H01L 29/10 | (2006.01) | |
| H01L 29/40 | (2006.01) | |
| H01L 29/417 | (2006.01) | |
| H01L 29/49 | (2006.01) | |
| H01L 21/308 | (2006.01) | |
| H01L 21/8238 | (2006.01) | |
| H01L 29/16 | (2006.01) | |
| H01L 29/51 | (2006.01) | |
| H01L 21/311 | (2006.01) | |
| H01L 23/532 | (2006.01) | |

(52) U.S. Cl.
CPC ...... *H01L 21/2255* (2013.01); *H01L 21/2257* (2013.01); *H01L 21/28088* (2013.01); *H01L 21/28114* (2013.01); *H01L 21/28123* (2013.01); *H01L 21/28132* (2013.01); *H01L 21/28518* (2013.01); *H01L 21/28568* (2013.01); *H01L 21/3086* (2013.01); *H01L 21/76* (2013.01); *H01L 21/764* (2013.01); *H01L 21/7684* (2013.01); *H01L 21/76831* (2013.01); *H01L 21/76834* (2013.01); *H01L 21/76877* (2013.01); *H01L 21/76897* (2013.01); *H01L 21/76898* (2013.01); *H01L 21/8221* (2013.01); *H01L 21/823418* (2013.01); *H01L 21/823456* (2013.01); *H01L 21/823475* (2013.01); *H01L 21/823481* (2013.01); *H01L 21/823487* (2013.01); *H01L 21/823807* (2013.01); *H01L 21/823828* (2013.01); *H01L 21/823871* (2013.01); *H01L 23/485* (2013.01); *H01L 23/528* (2013.01); *H01L 23/5226* (2013.01); *H01L 23/5283* (2013.01); *H01L 27/11* (2013.01); *H01L 29/04* (2013.01); *H01L 29/0657* (2013.01); *H01L 29/1037* (2013.01); *H01L 29/16* (2013.01); *H01L 29/401* (2013.01); *H01L 29/41741* (2013.01); *H01L 29/4238* (2013.01); *H01L 29/42356* (2013.01); *H01L 29/42376* (2013.01); *H01L 29/42392* (2013.01); *H01L 29/4966* (2013.01); *H01L 29/517* (2013.01); *H01L 29/66666* (2013.01); *H01L 29/66787* (2013.01); *H01L 29/7827* (2013.01); *H01L 21/31111* (2013.01); *H01L 21/31116* (2013.01); *H01L 21/76805* (2013.01); *H01L 21/76829* (2013.01); *H01L 23/53257* (2013.01); *H01L 29/665* (2013.01)

(58) Field of Classification Search
CPC ......... H01L 29/42356; H01L 29/66666; H01L 29/7827; H01L 27/11807; H01L 29/42392; H01L 21/823885; H01L 27/092; H01L 27/1104; H01L 21/2018; H01L 21/2253; H01L 21/2255; H01L 21/2257; H01L 21/28088; H01L 21/28114; H01L 21/28123; H01L 21/28132; H01L 21/28518; H01L 21/28568; H01L 21/3086; H01L 27/2454; H01L 21/823487
See application file for complete search history.

(56) References Cited

U.S. PATENT DOCUMENTS

| | | | |
|---|---|---|---|
| 2010/0219483 A1 | 9/2010 | Masuoka et al. | |
| 2011/0084314 A1* | 4/2011 | Or-Bach | G03F 9/7076 257/209 |
| 2013/0056698 A1* | 3/2013 | Satoh | H01L 27/101 257/2 |
| 2014/0061808 A1 | 3/2014 | Nakatsuka et al. | |

FOREIGN PATENT DOCUMENTS

| | | |
|---|---|---|
| JP | 2003-224211 A | 8/2003 |
| JP | 2007-525004 A | 8/2007 |
| JP | 2010-040538 A | 2/2010 |
| JP | 2012-209340 | 10/2012 |
| JP | 2014-53424 | 3/2014 |
| JP | 5692884 B | 4/2015 |
| WO | WO2014/184933 | 11/2014 |

OTHER PUBLICATIONS

Morimoto, T. et al., "Self-Aligned Nickel-Mono-Silicide Technology for High-Speed Deep Submicrometer Logic CMOS ULSI" *IEEE Transaction on Electron Devices*, vol. 42, No. 5, 1995, pp. 915-922.

Shibata, T. et al., "A New Field Isolation Technology for High Density MOS LSI", *Japanese Journal of Applied Physics*, vol. 18, 1979, pp. 263-267.

Takato, H. et al., "Impact of Surrounding Gate Transistor (SGT) for Ultra-High-Density LSI's", *IEEE Transaction on Electron Devices*, vol. 38, No. 3, 1991, pp. 573-578.

International Search Report, and English language translation thereof, in corresponding International Application No. PCT/JP2015/060763, dated May 26, 2015, 8 pages.

International Search Report, and English language translation thereof, in corresponding International Application No. PCT/JP2015/069689, dated Aug. 4, 2015, 4 pages.

International Search Report, and English language translation thereof, in corresponding International Application No. PCT/JP2015/078776, dated Nov. 10, 2015, 10 pages.

International Search Report, and English language translation thereof, in corresponding International Application No. PCT/JP2016/066151, dated Aug. 2, 2016, 7 pages.

International Preliminary Report on Patentability in corresponding International Application No. PCT/JP2015/078776, dated Oct. 12, 2017, 6 pages.

International Preliminary Report on Patentability in corresponding International Application No. PCT/JP2015/060763, dated Oct. 19, 2017, 5 pages.

English language translation of International Preliminary Examination Report in International Application No. PCT/JP2015/069689, dated Jan. 11, 2018, 6 pages.

* cited by examiner

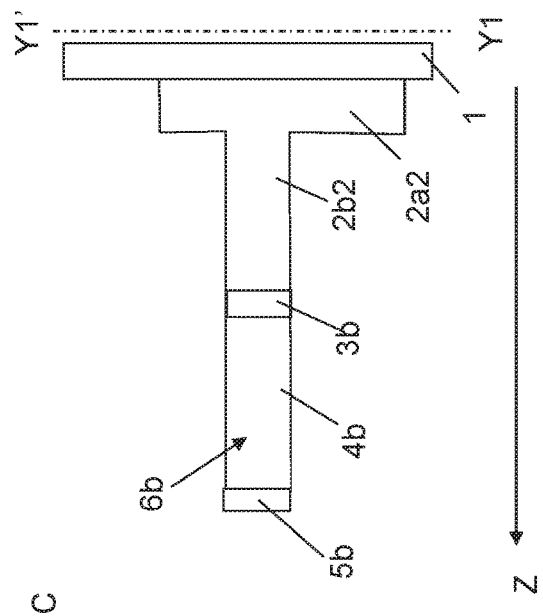
FIG.2BC
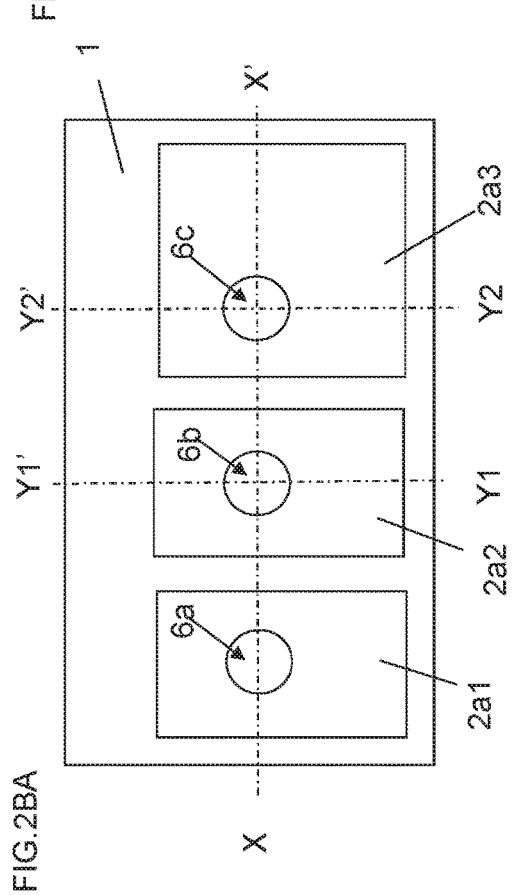
FIG.2BA
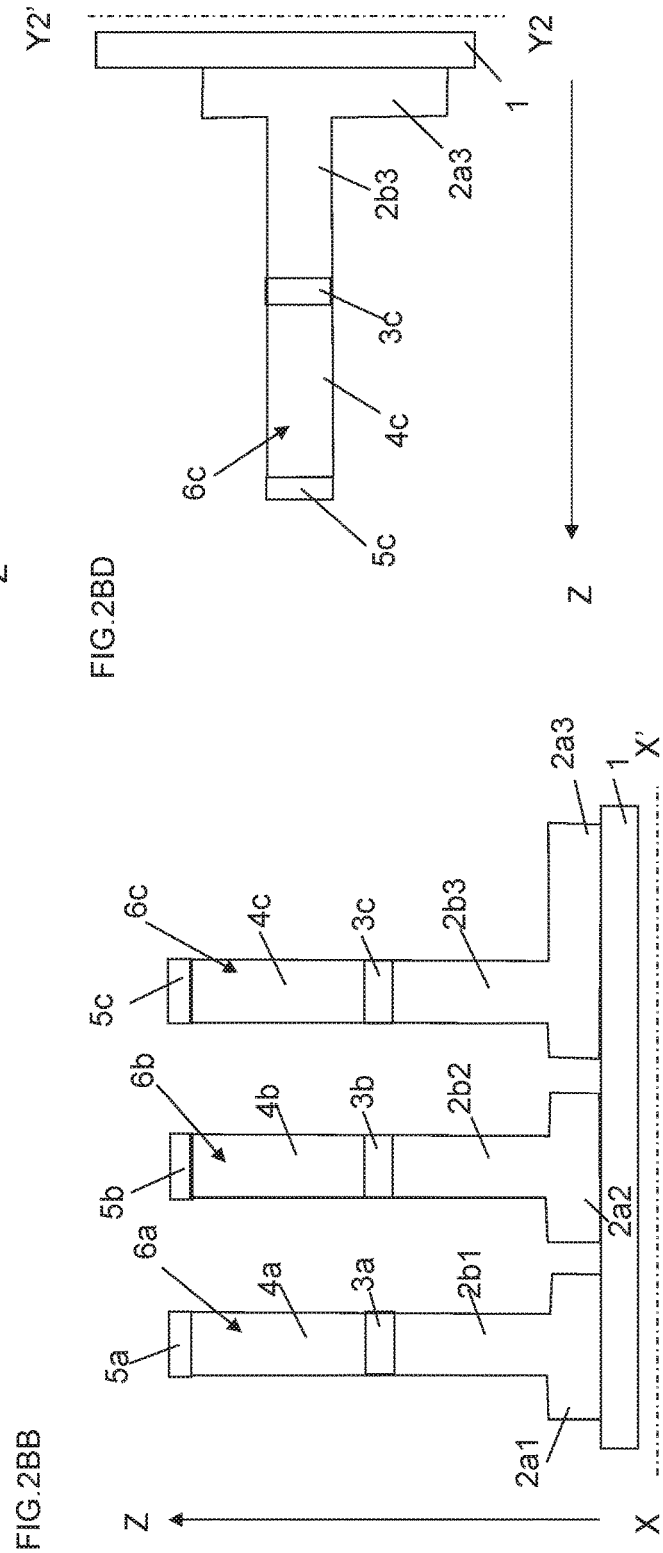
FIG.2BD / FIG.2BB

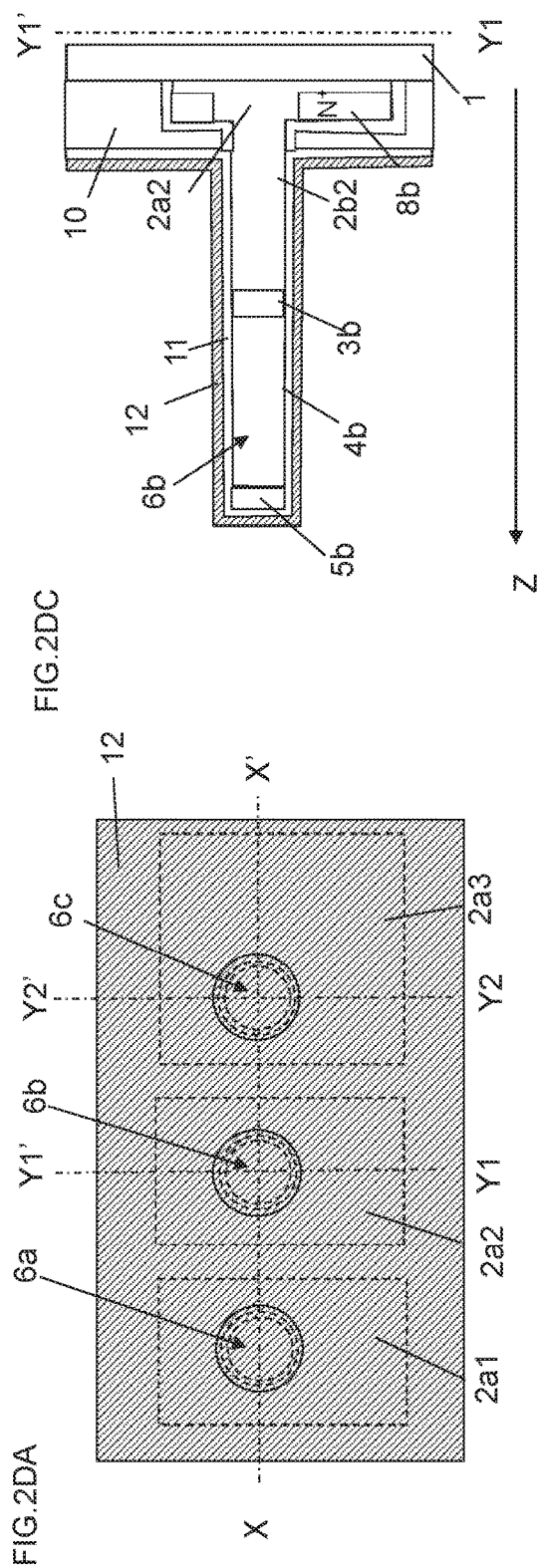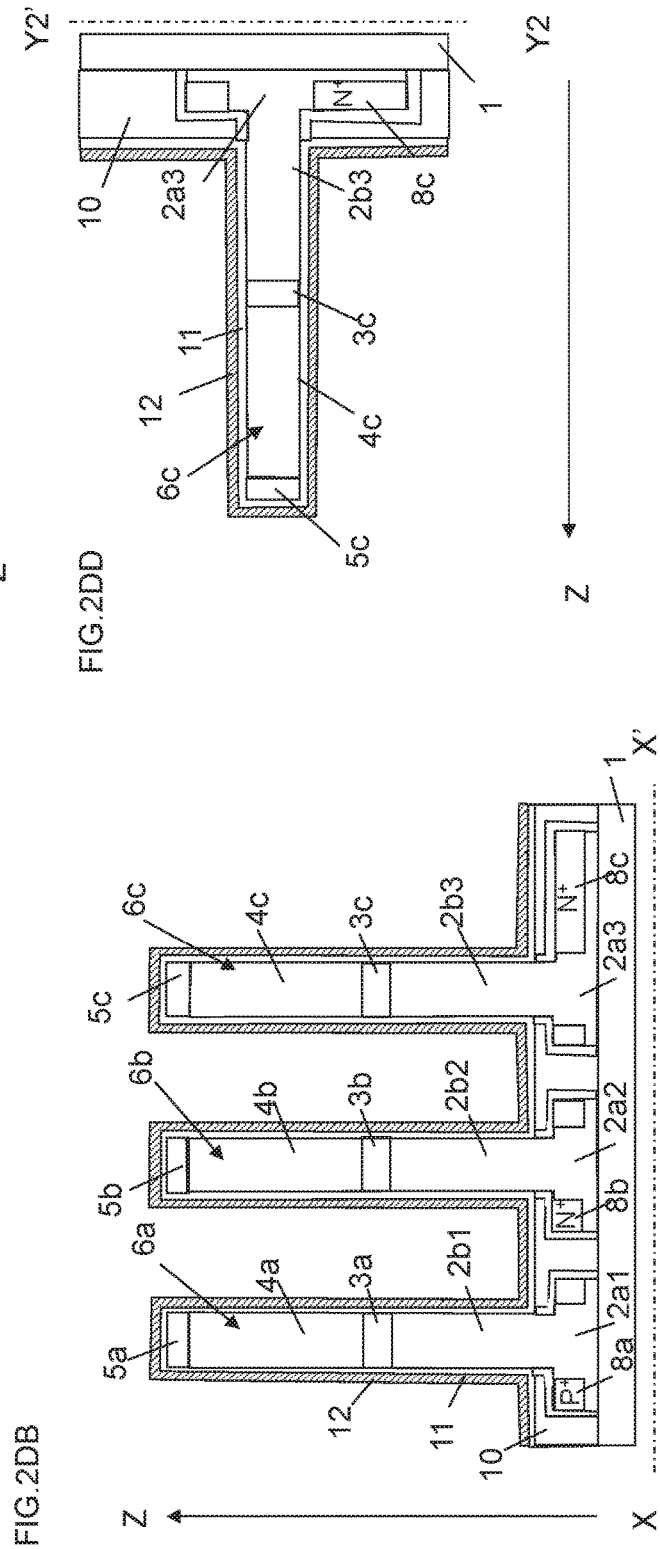
FIG.2DA
FIG.2DB
FIG.2DC
FIG.2DD

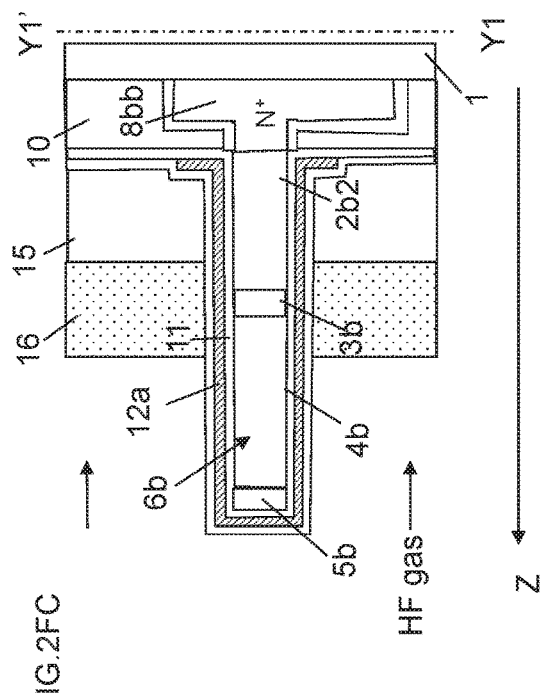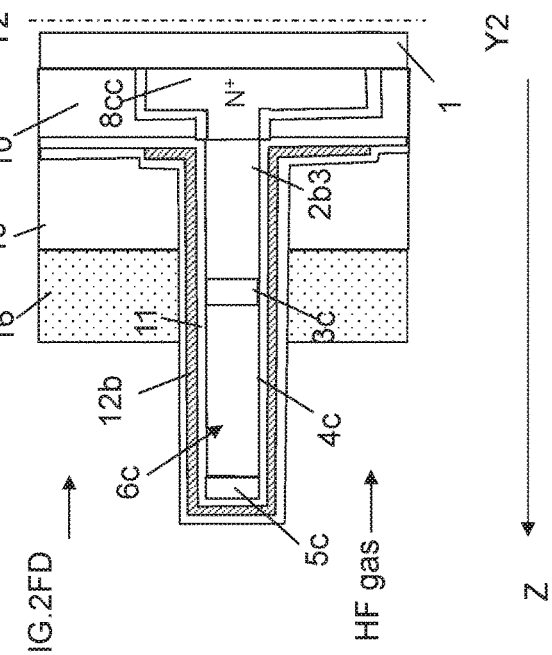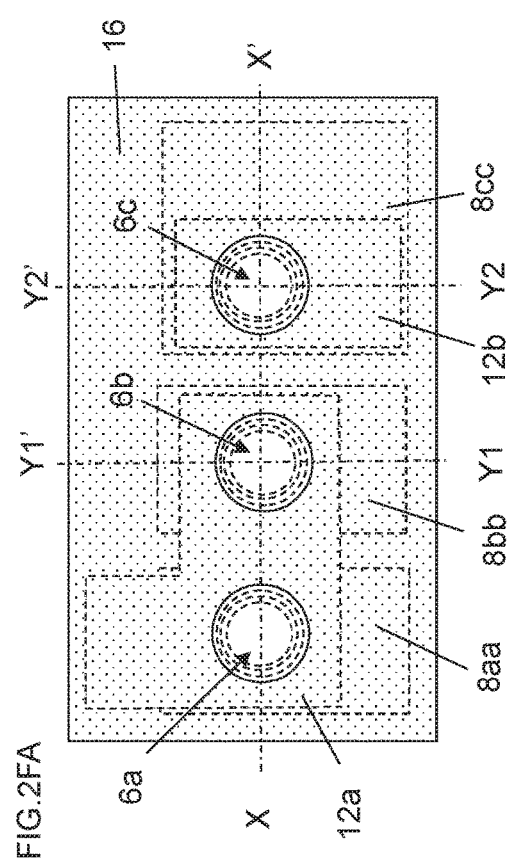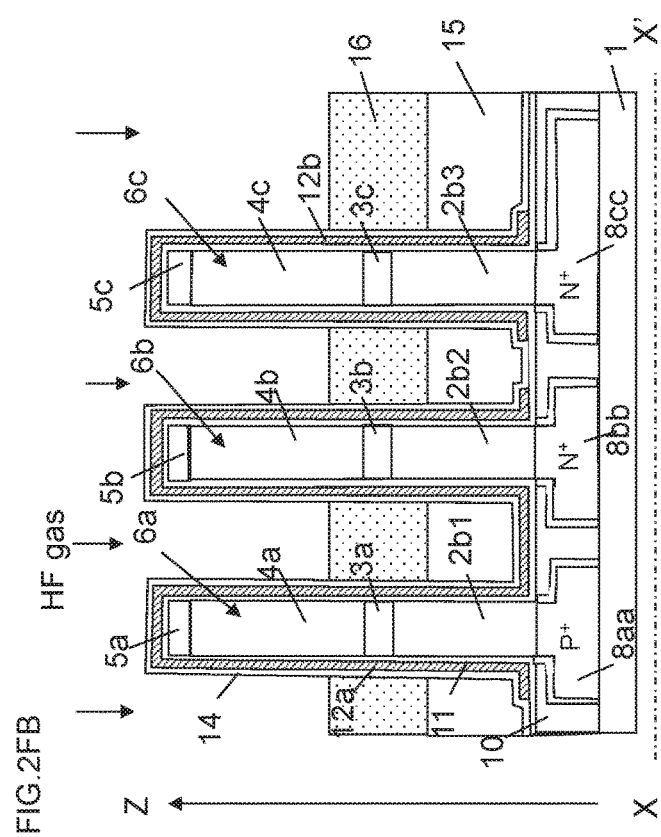

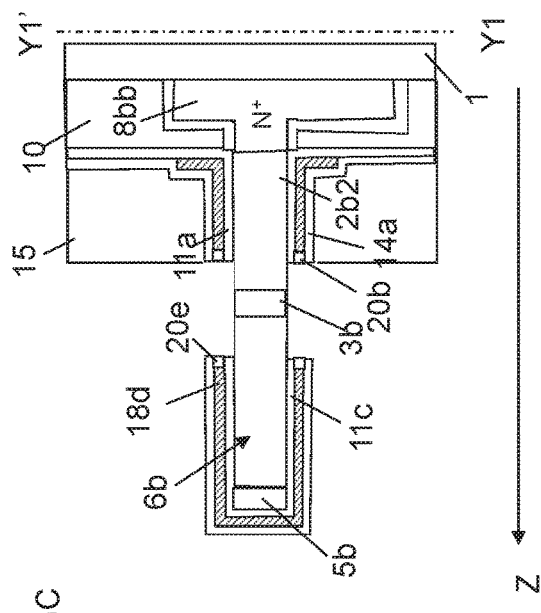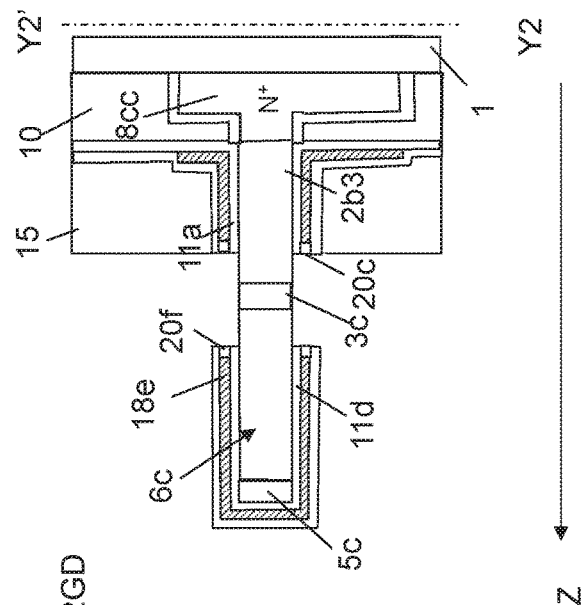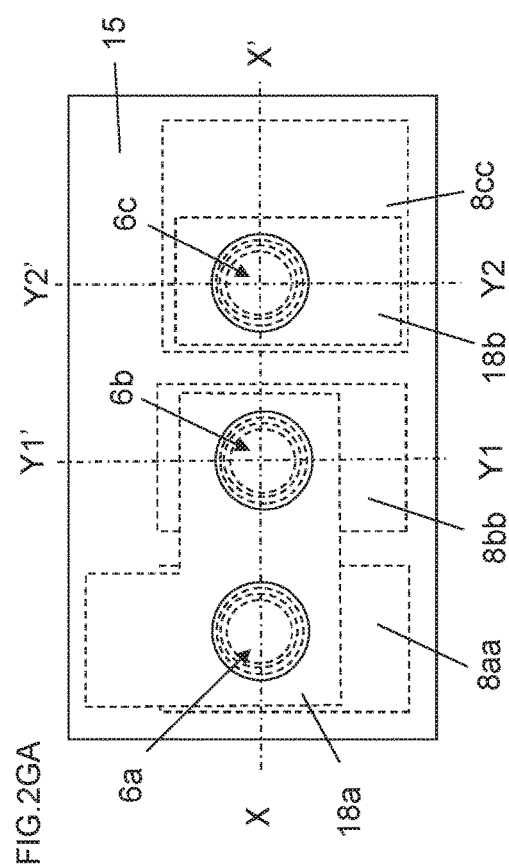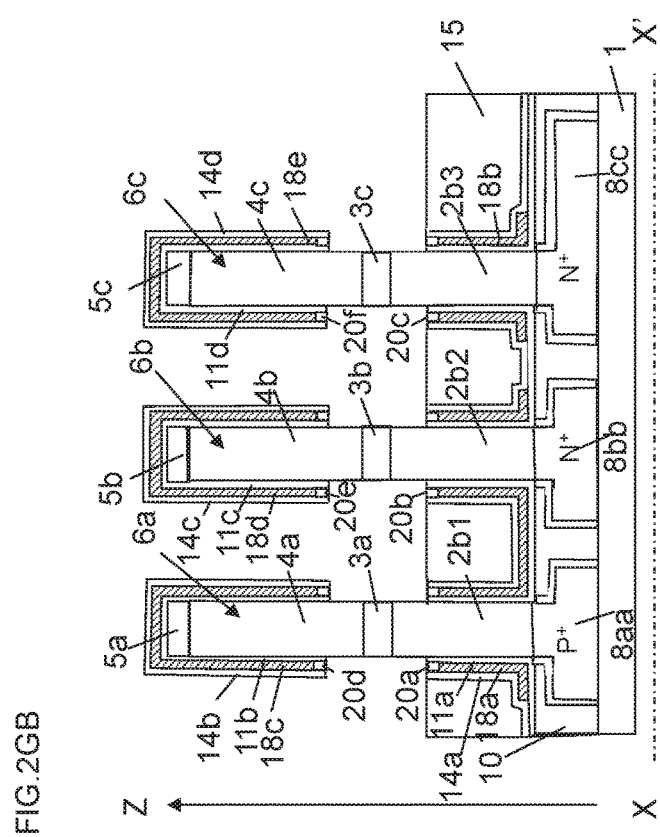

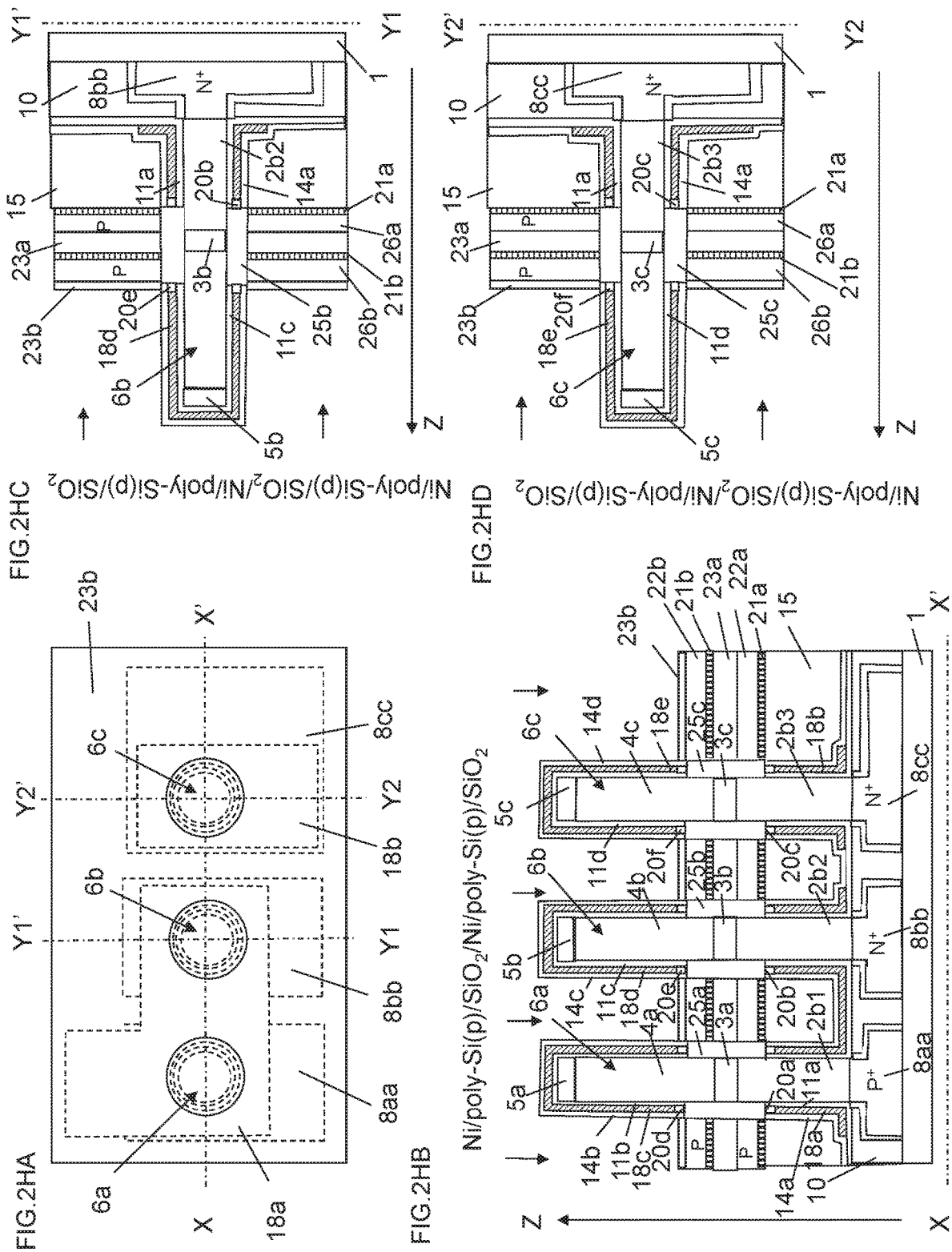

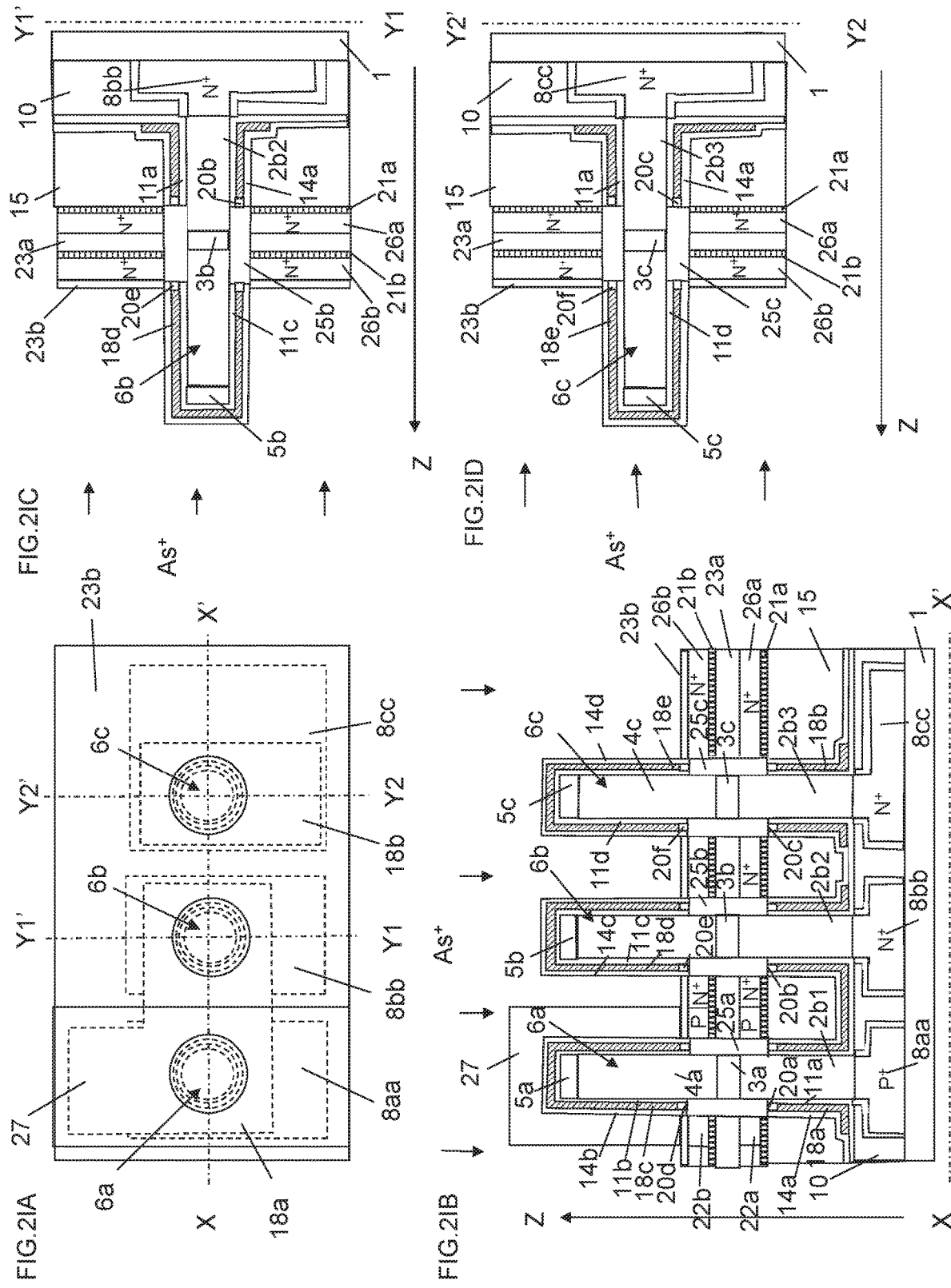

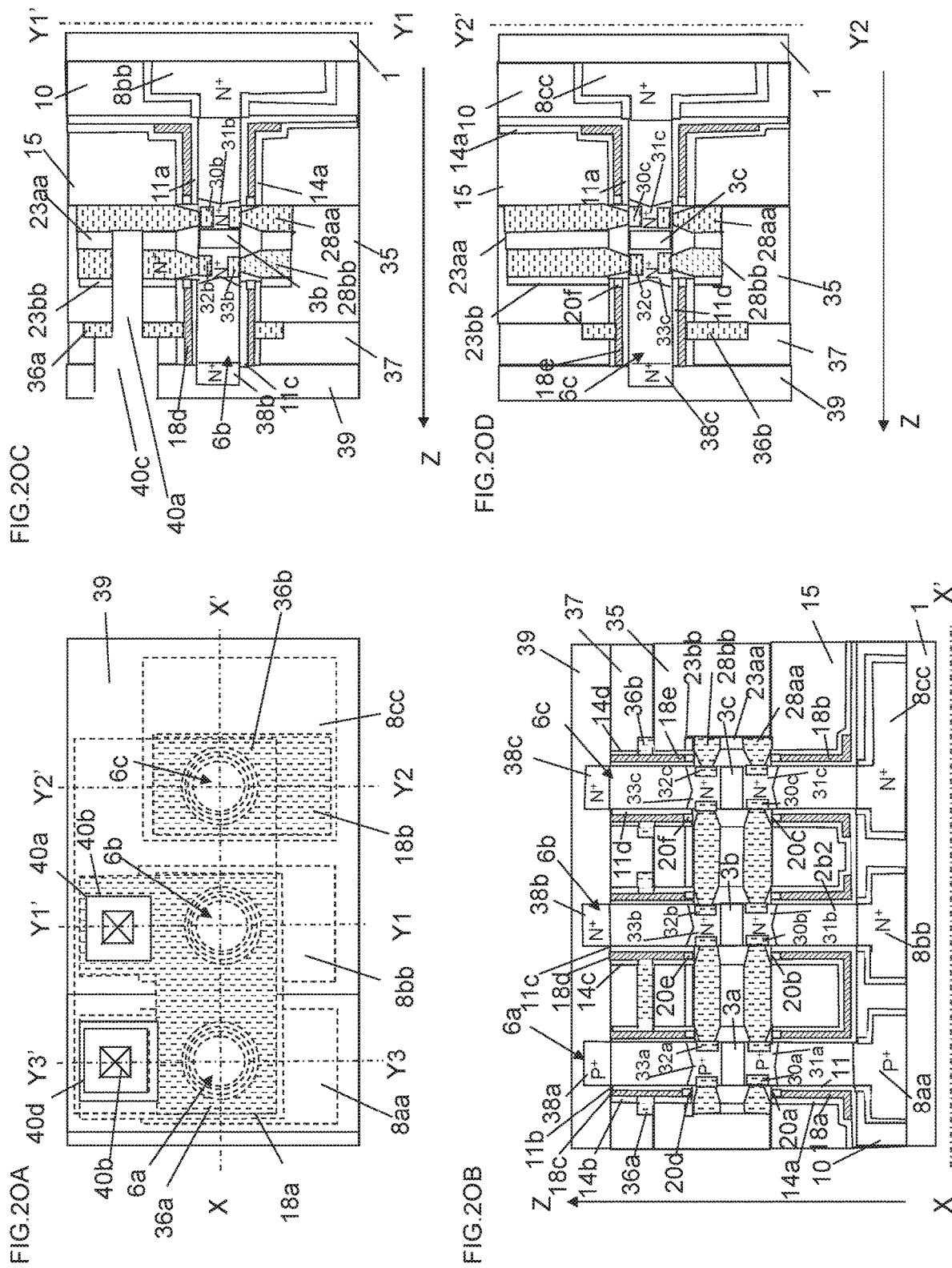

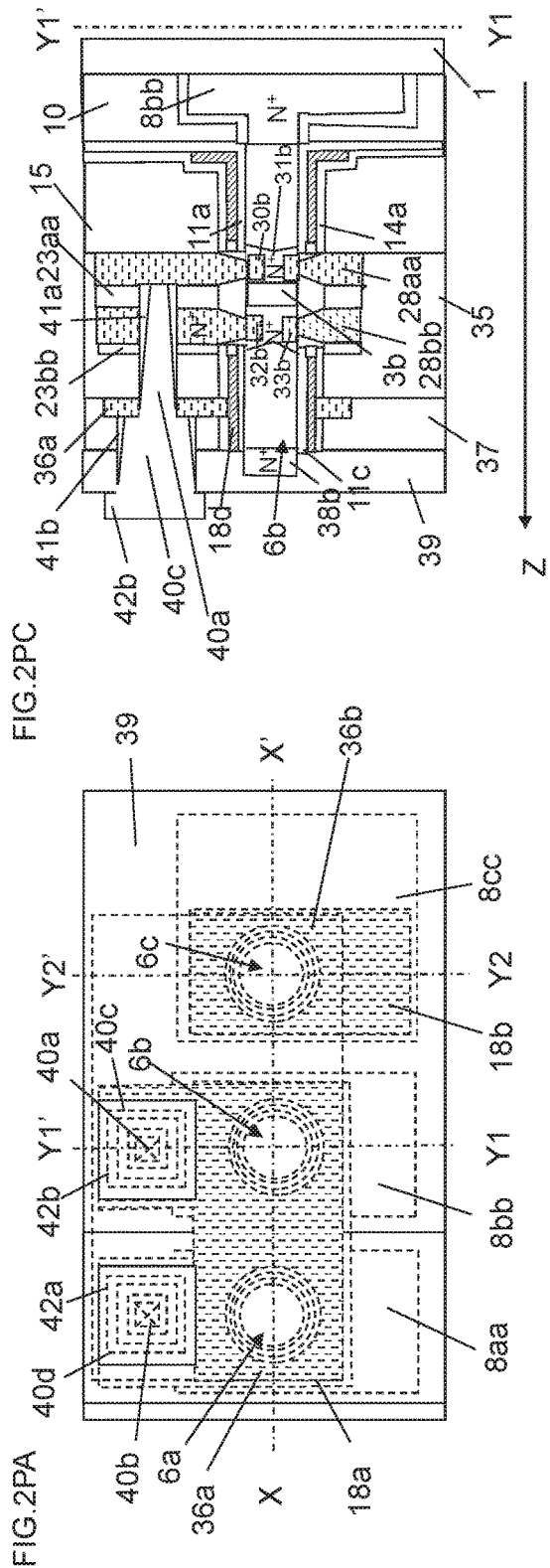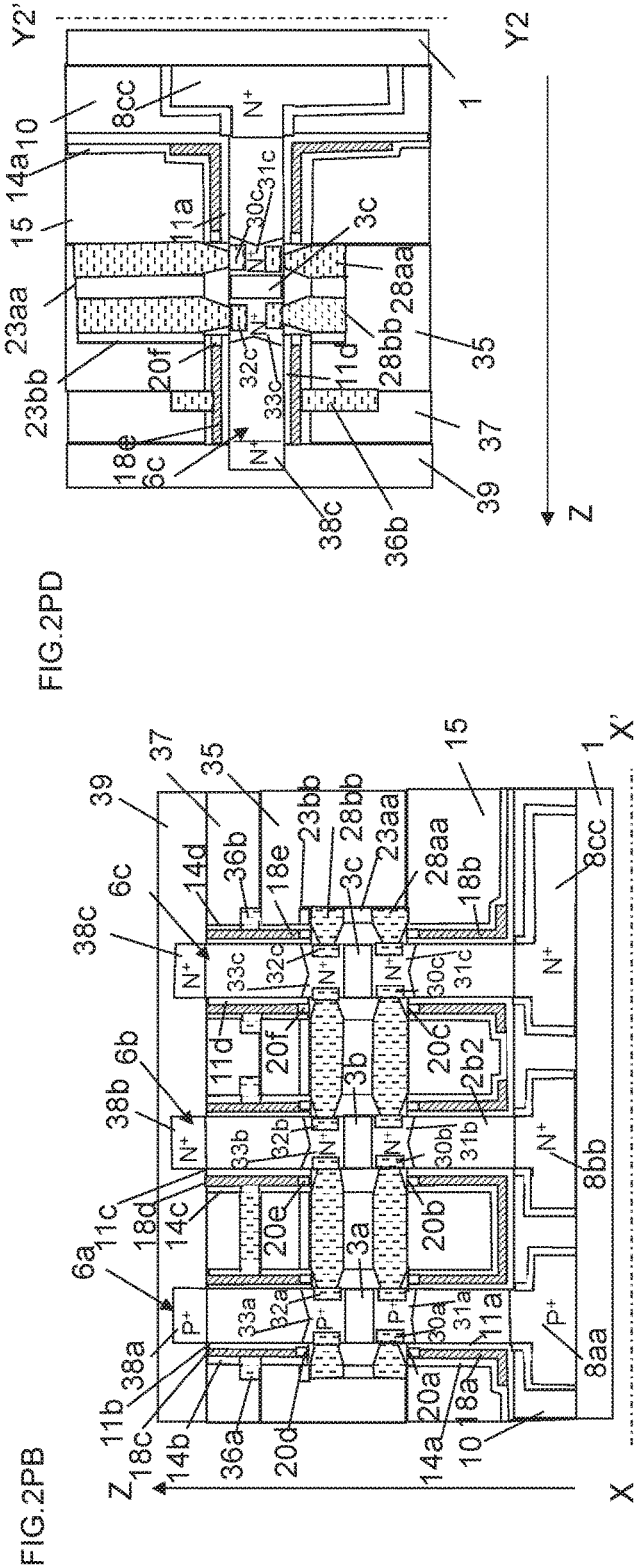
FIG.2PA  FIG.2PC
FIG.2PB  FIG.2PD

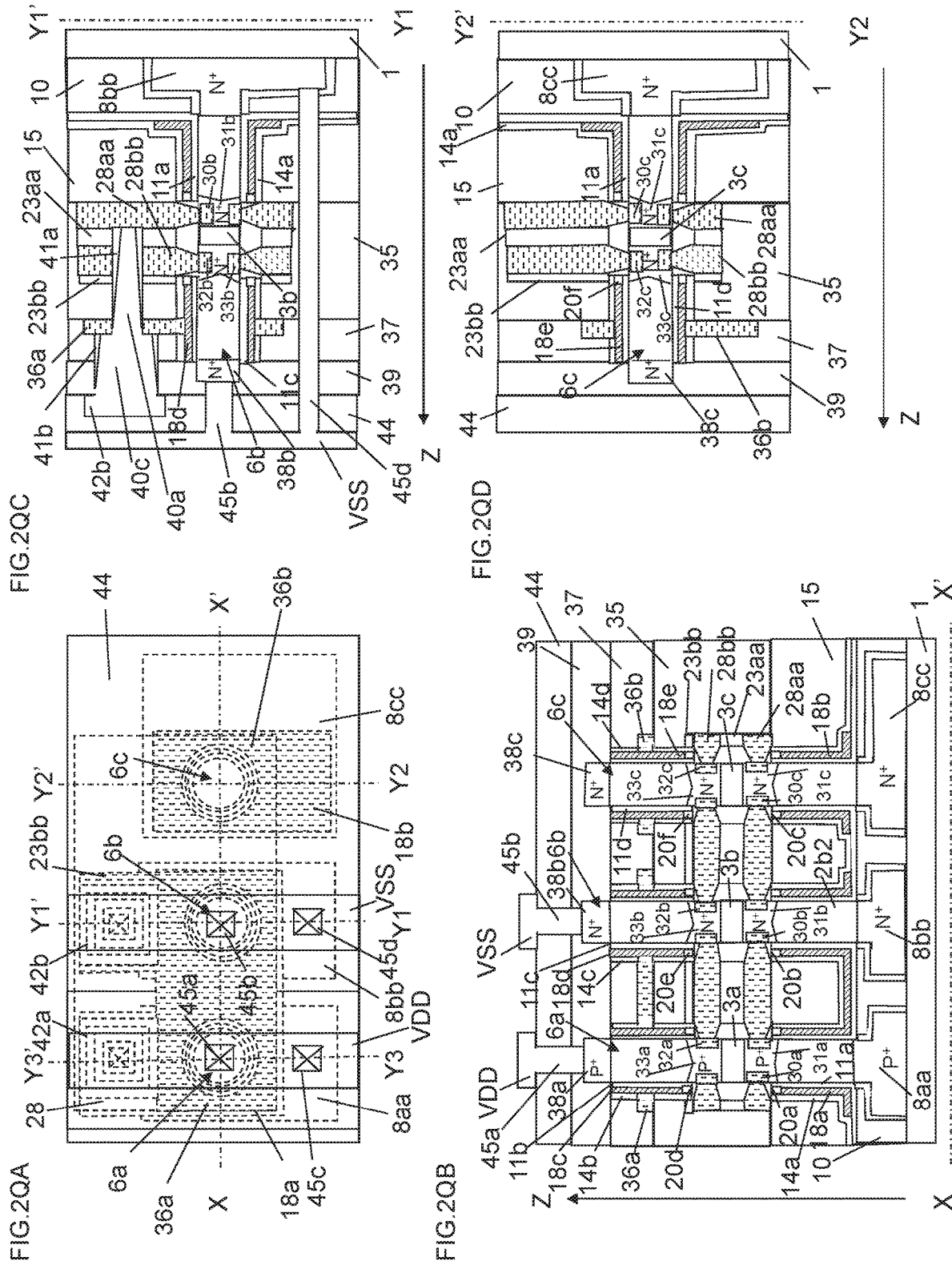

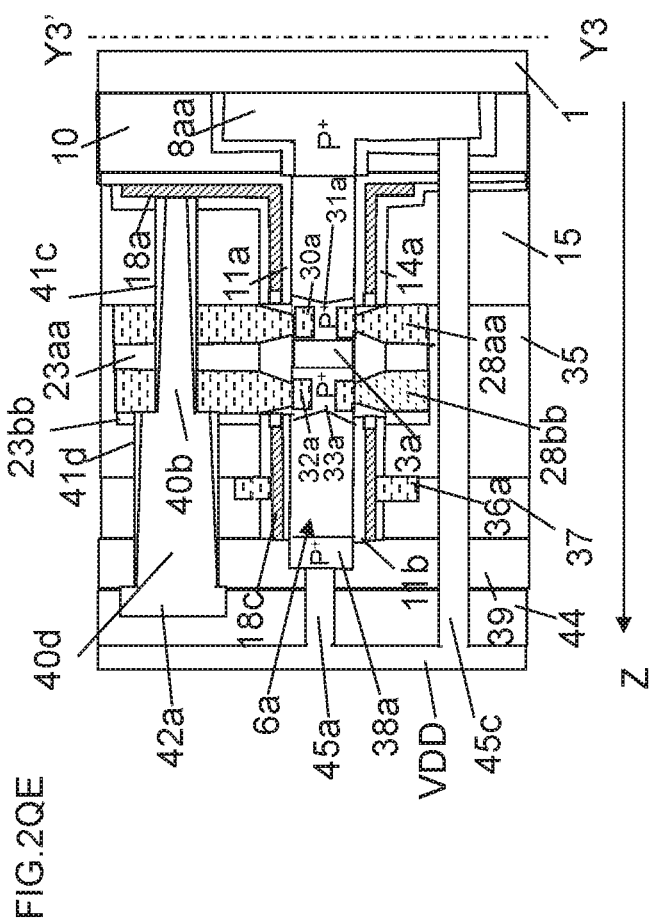

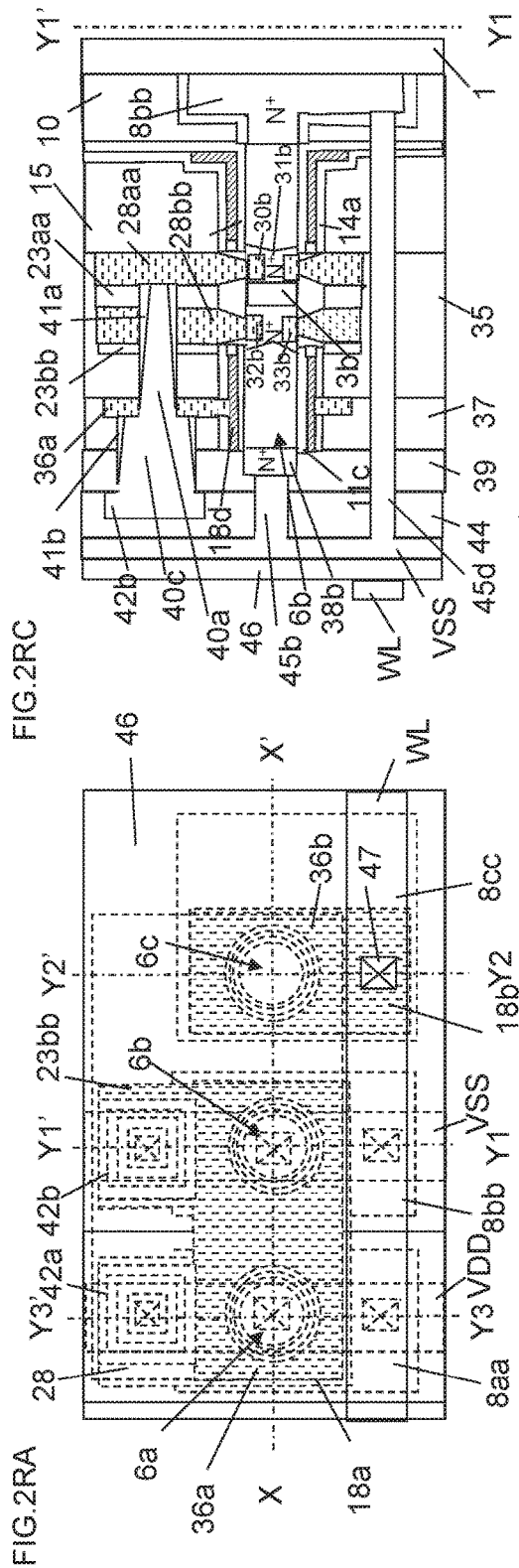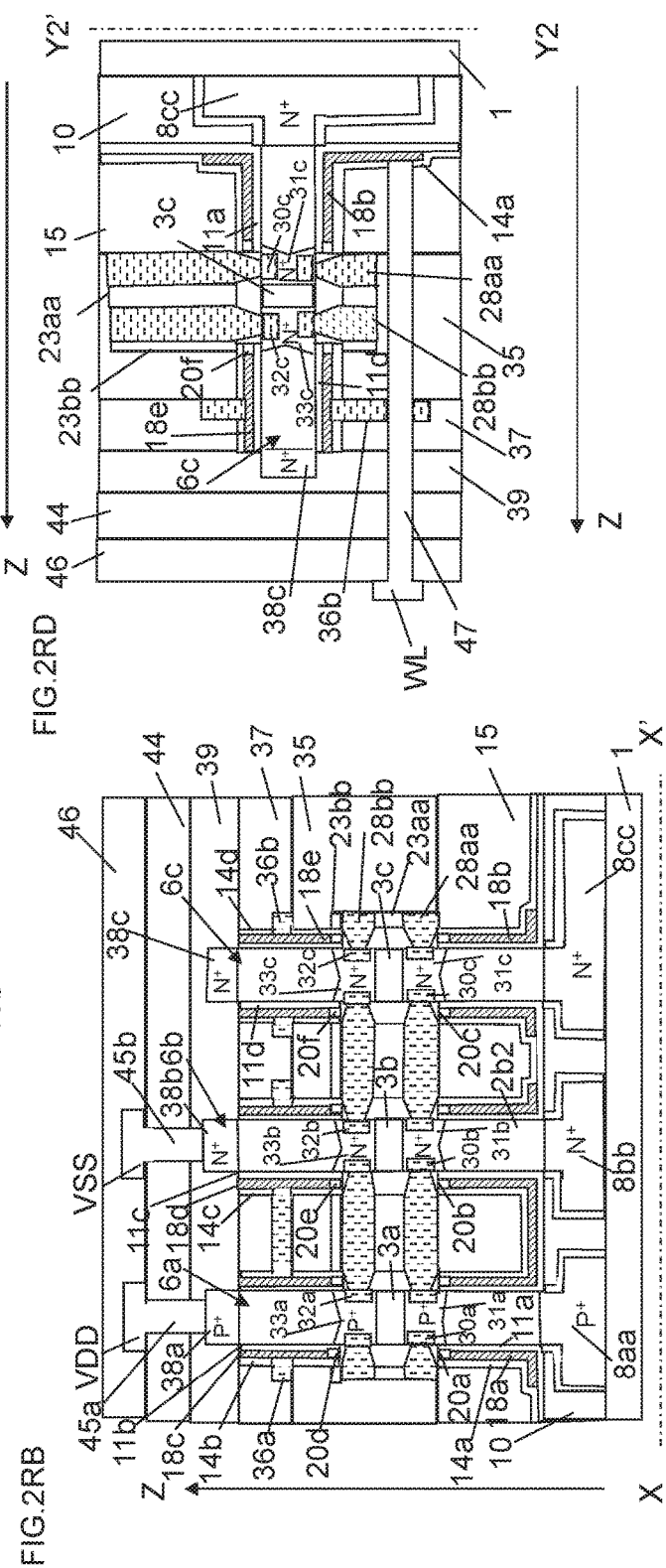

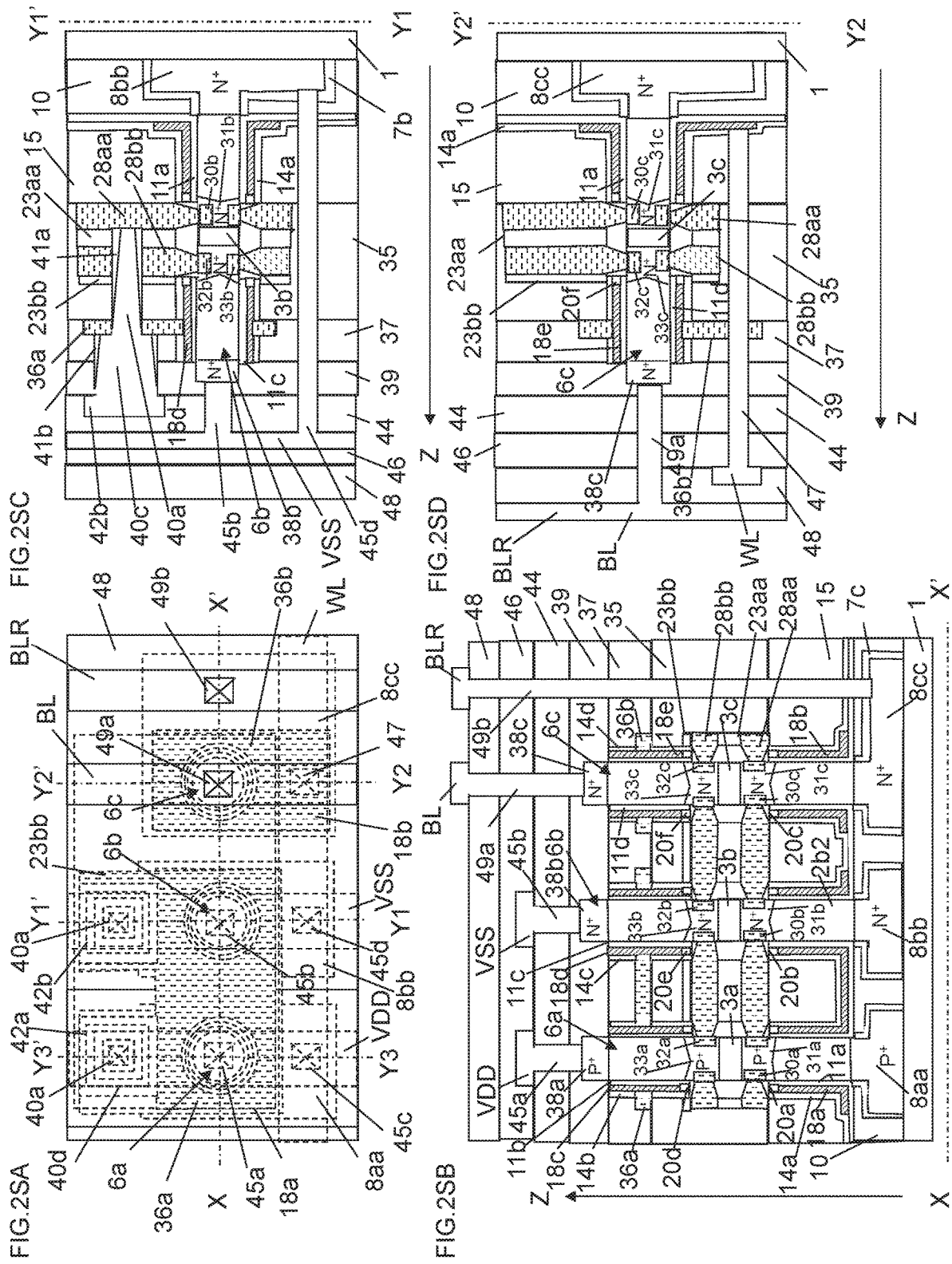

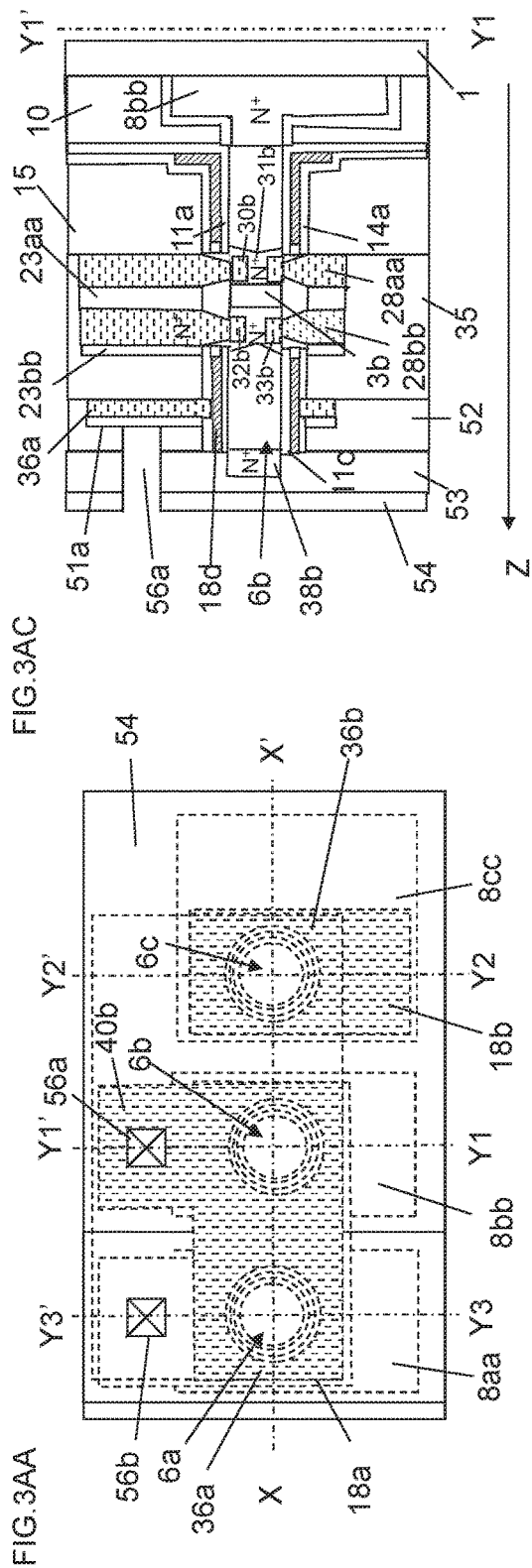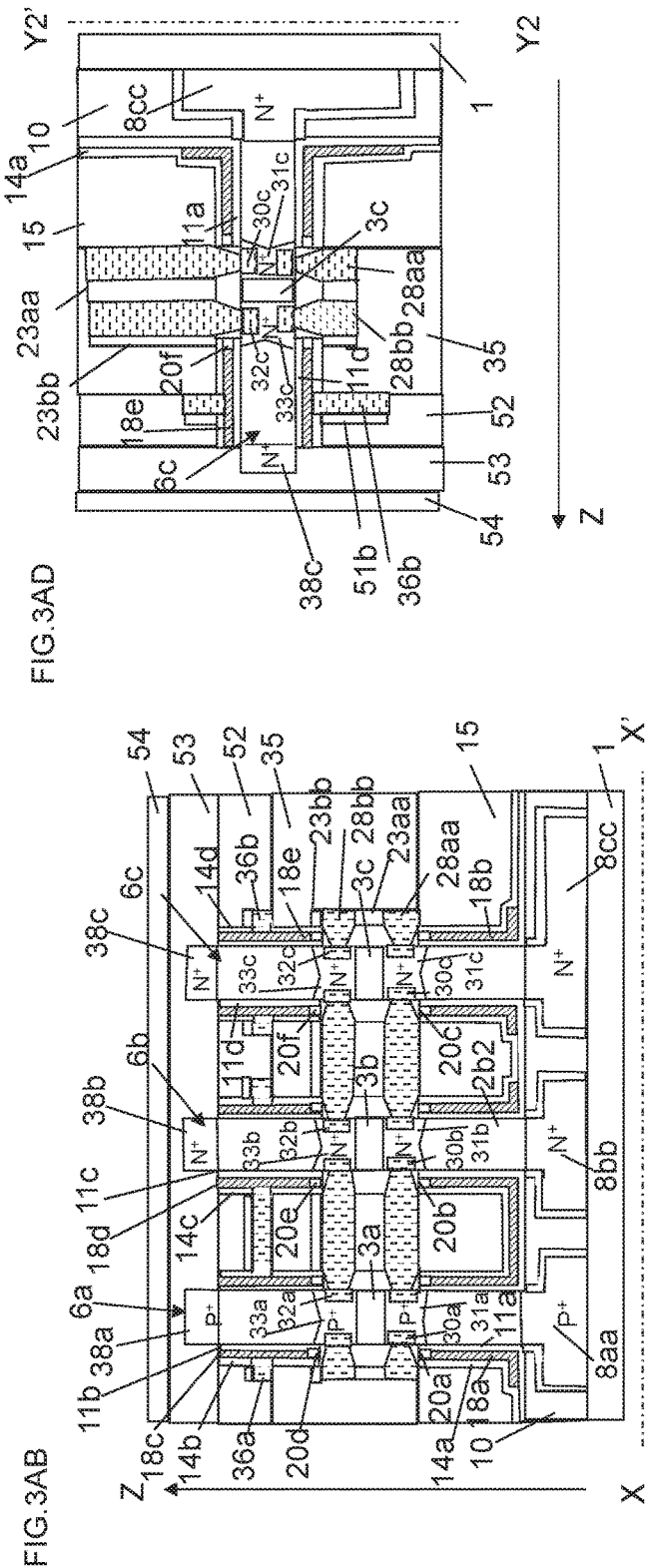

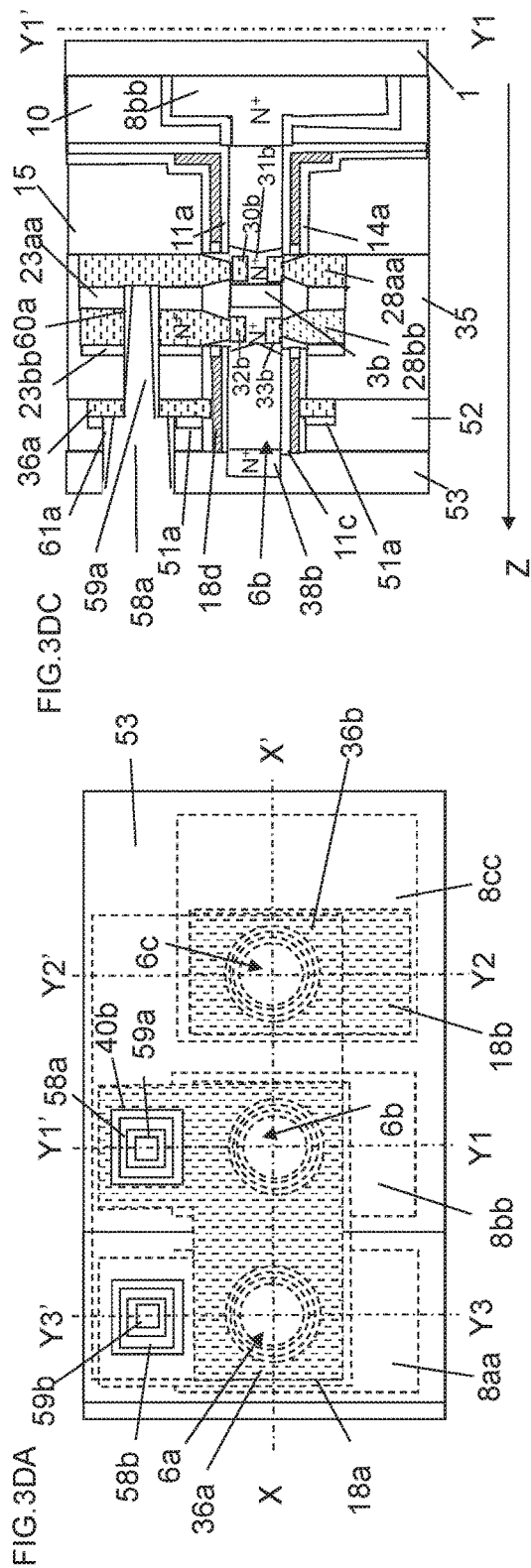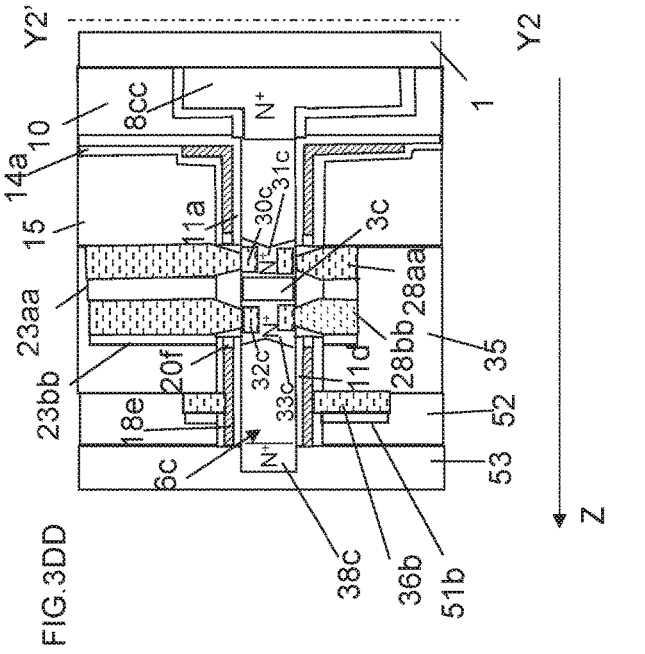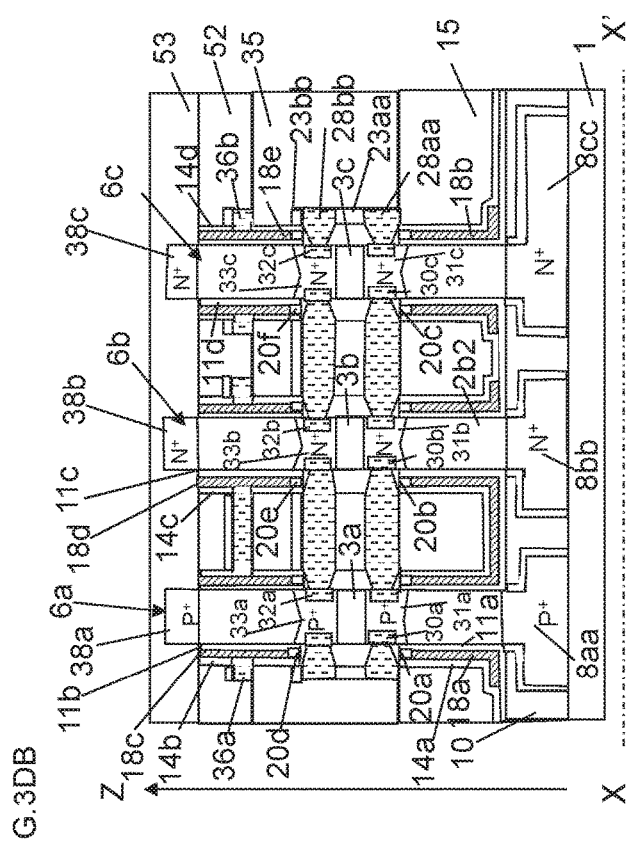

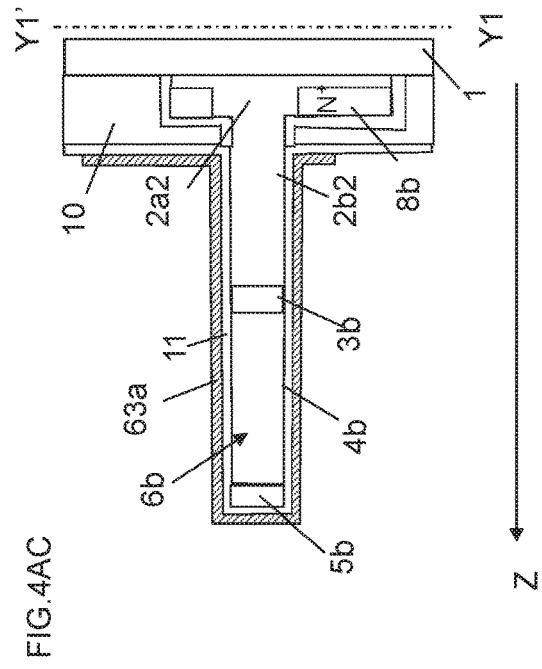
FIG.4AA
FIG.4AB
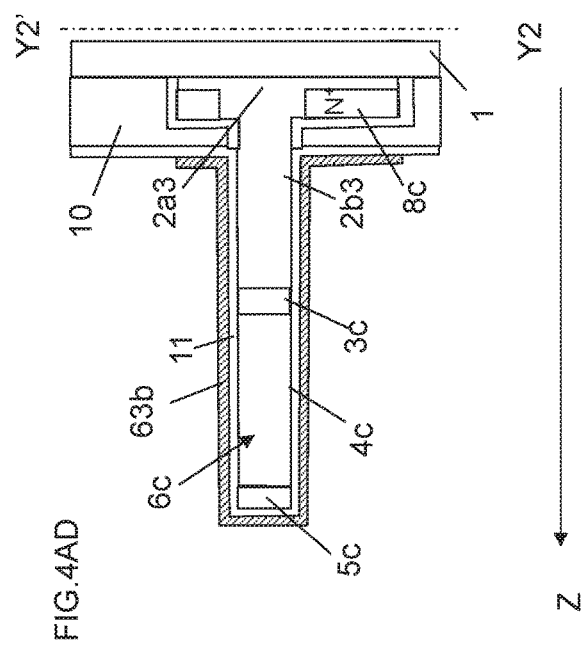
FIG.4AC
FIG.4AD

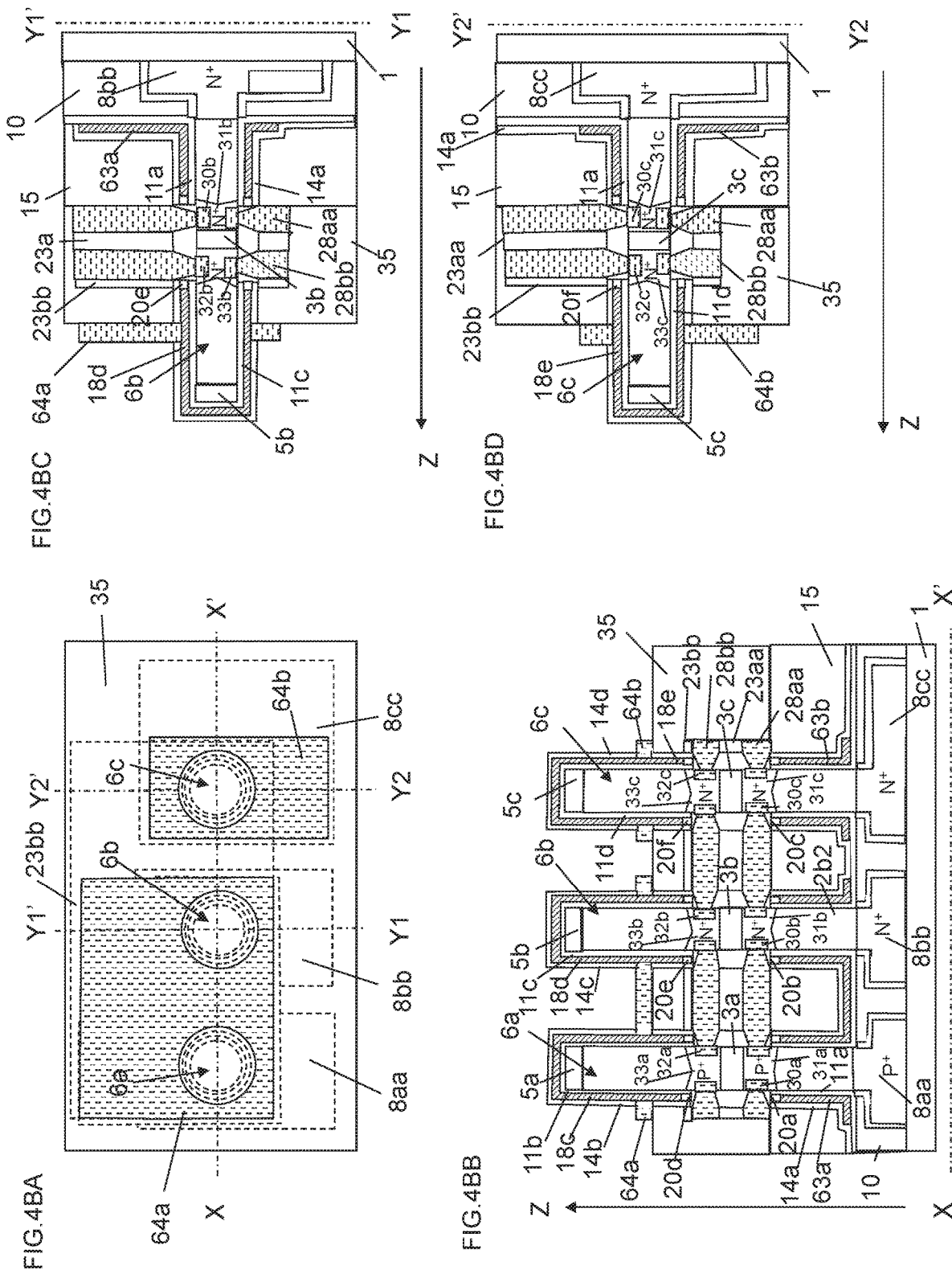

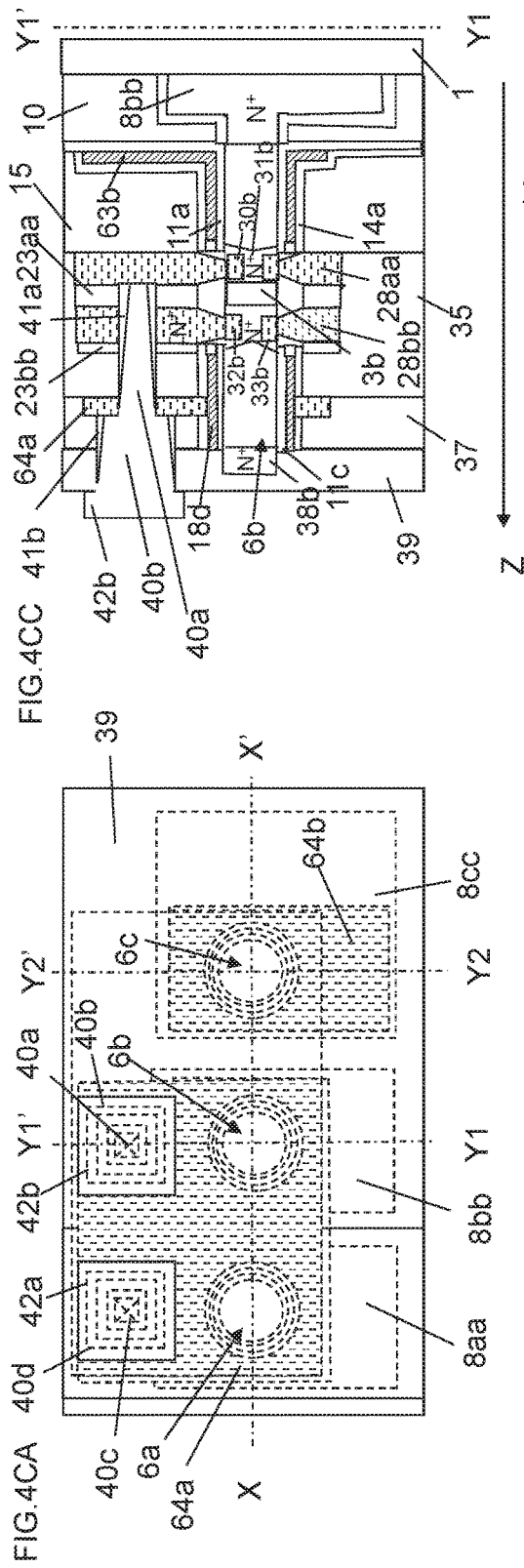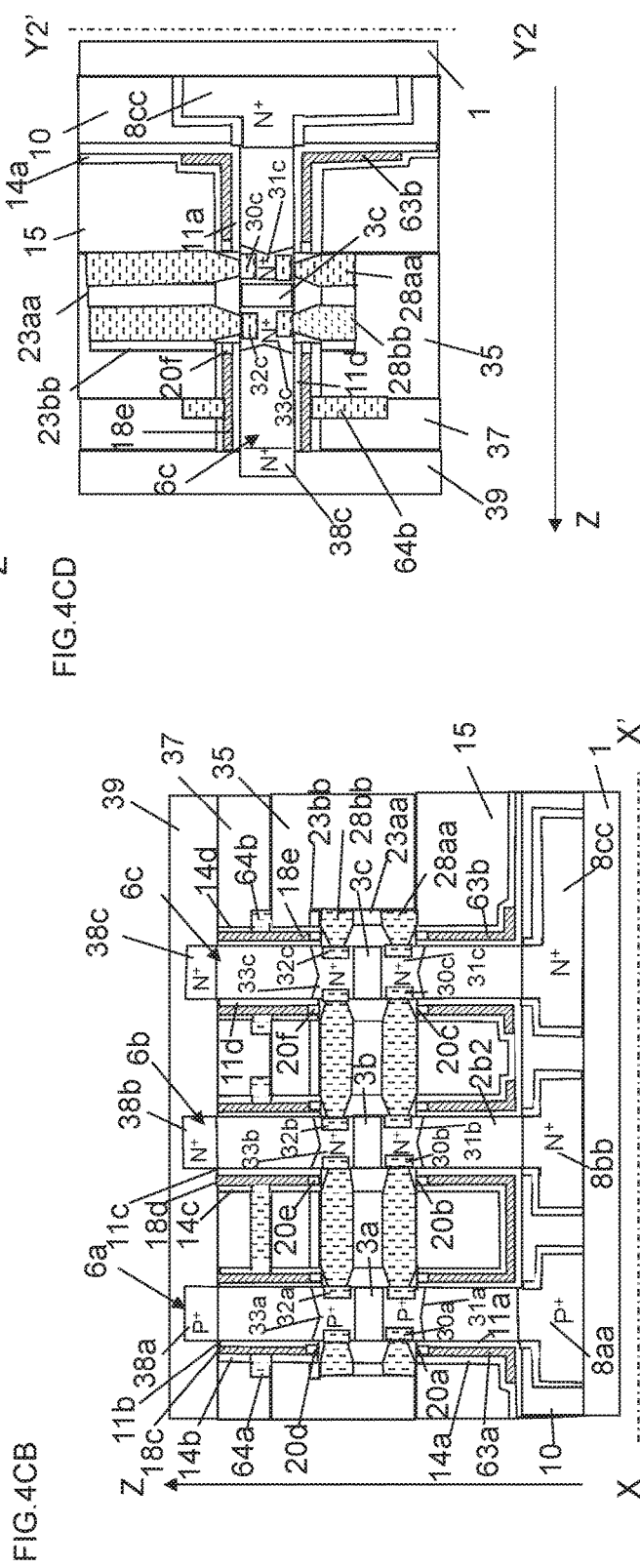

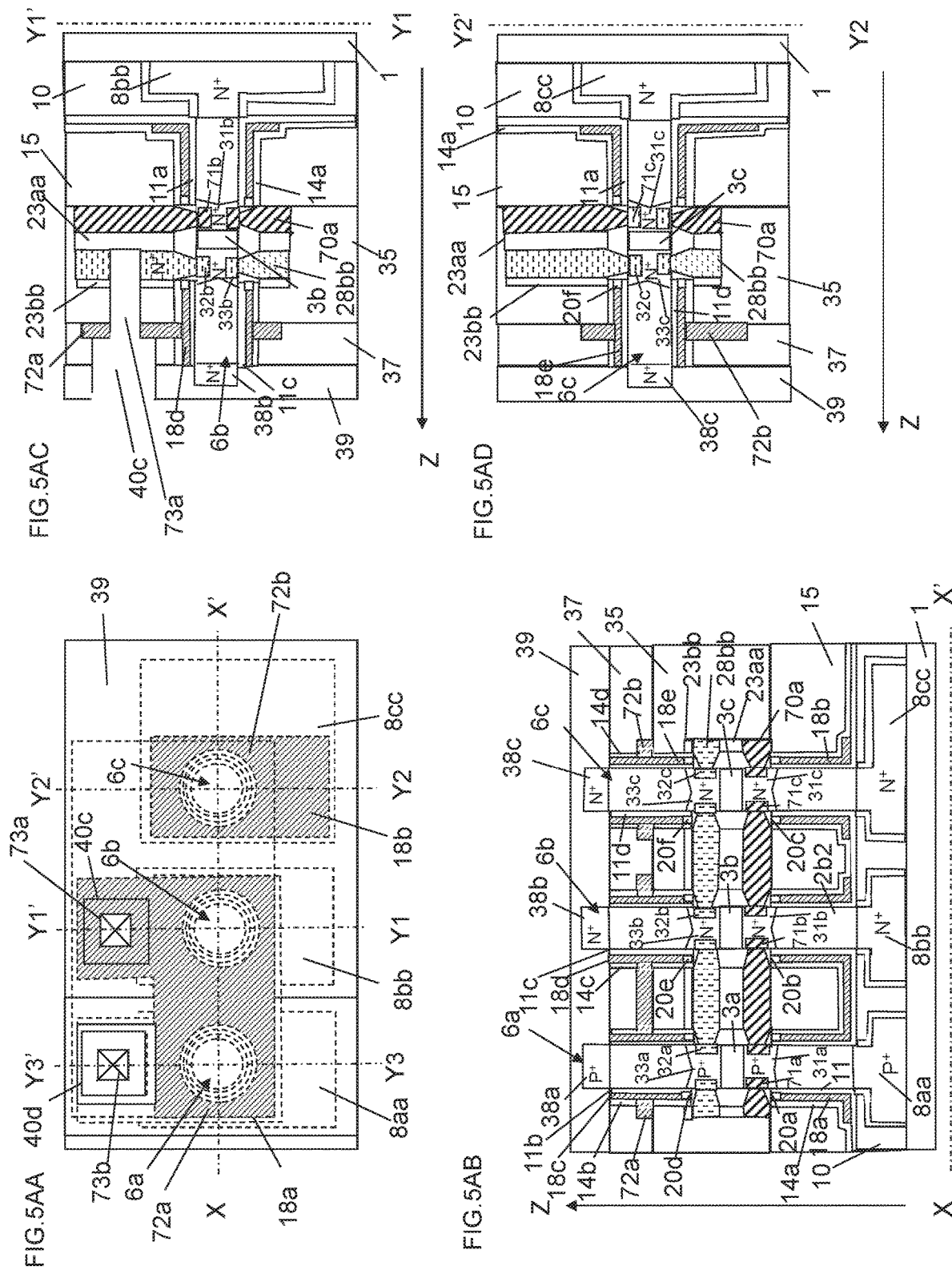

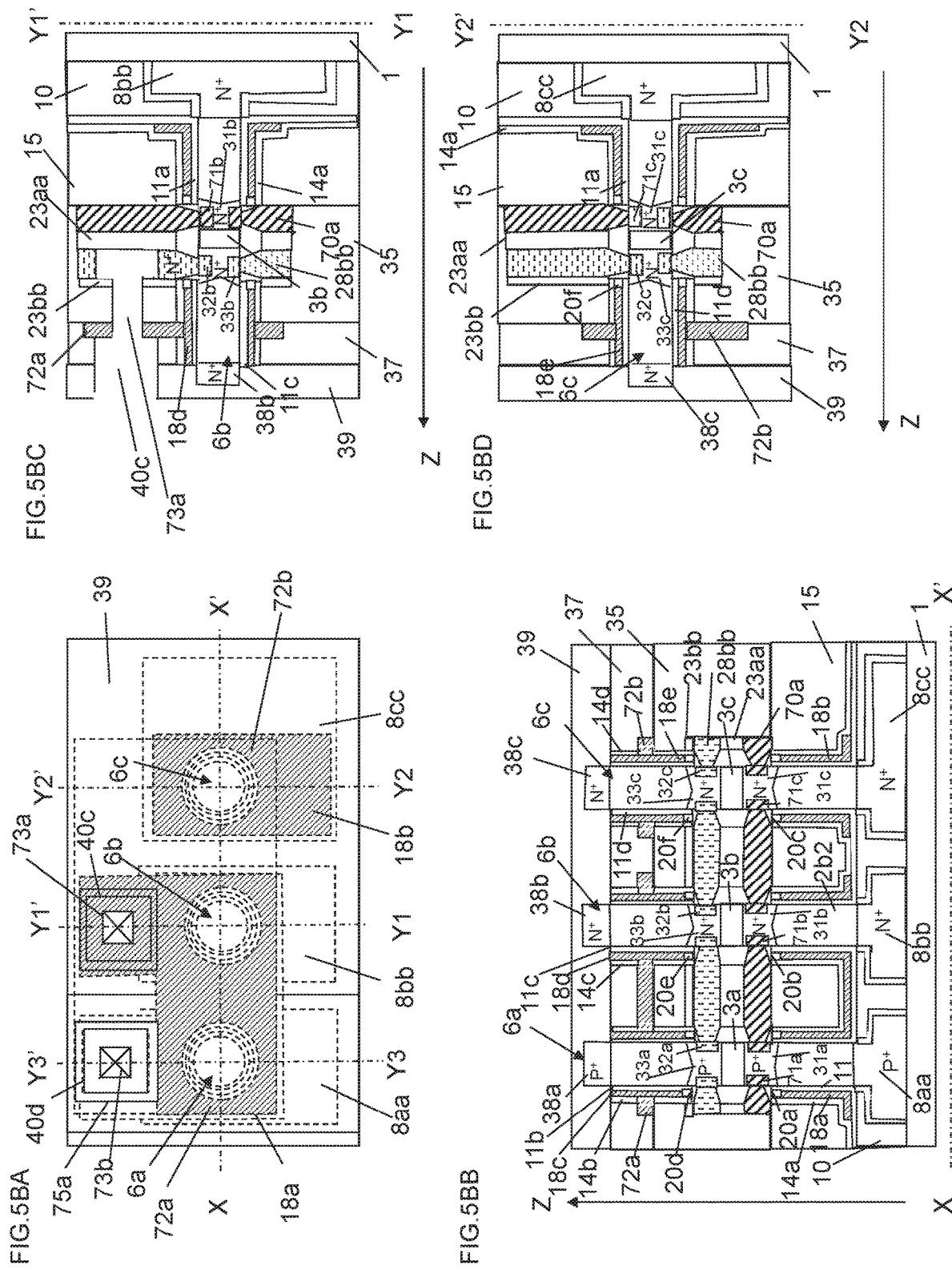

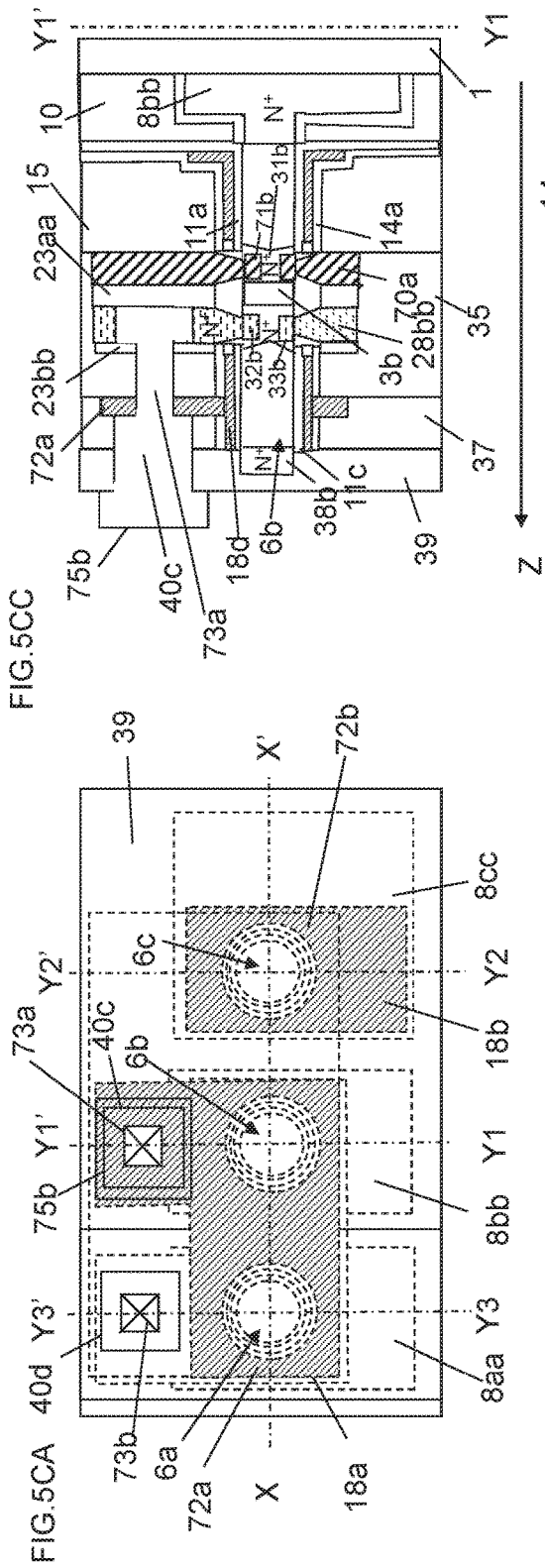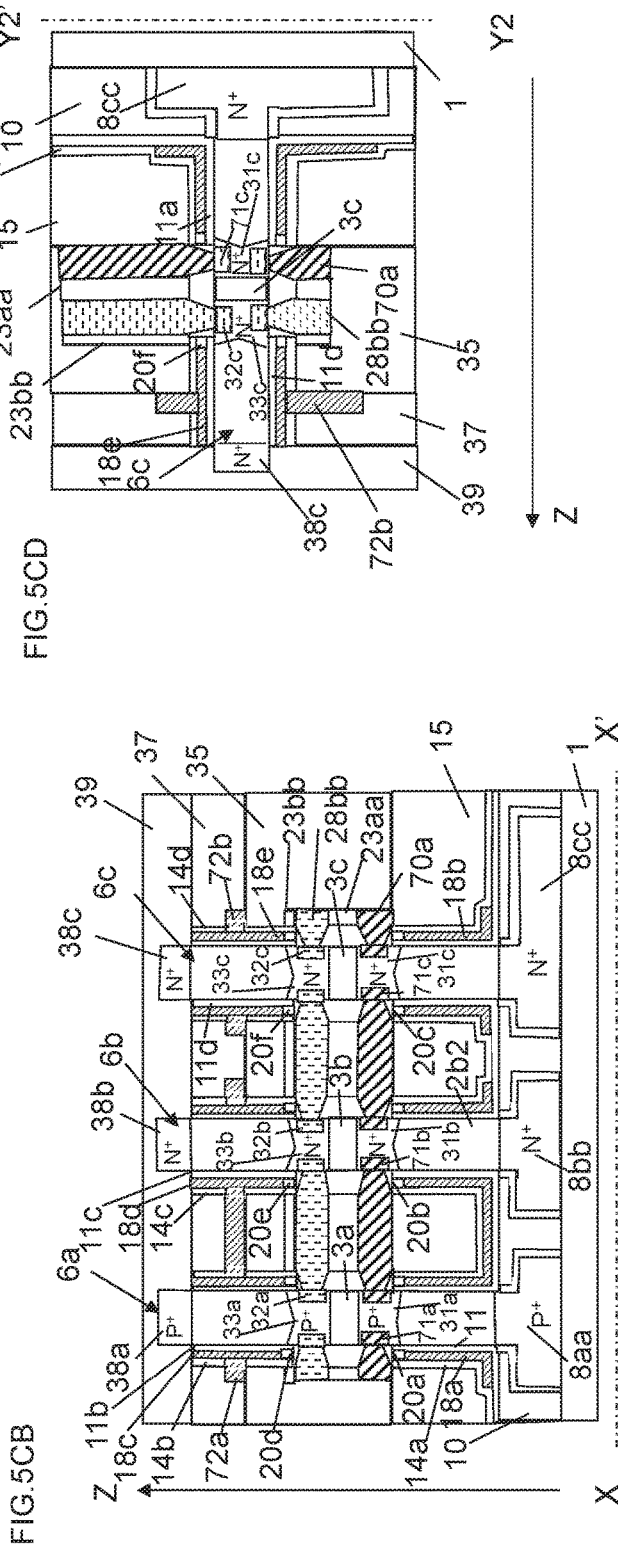

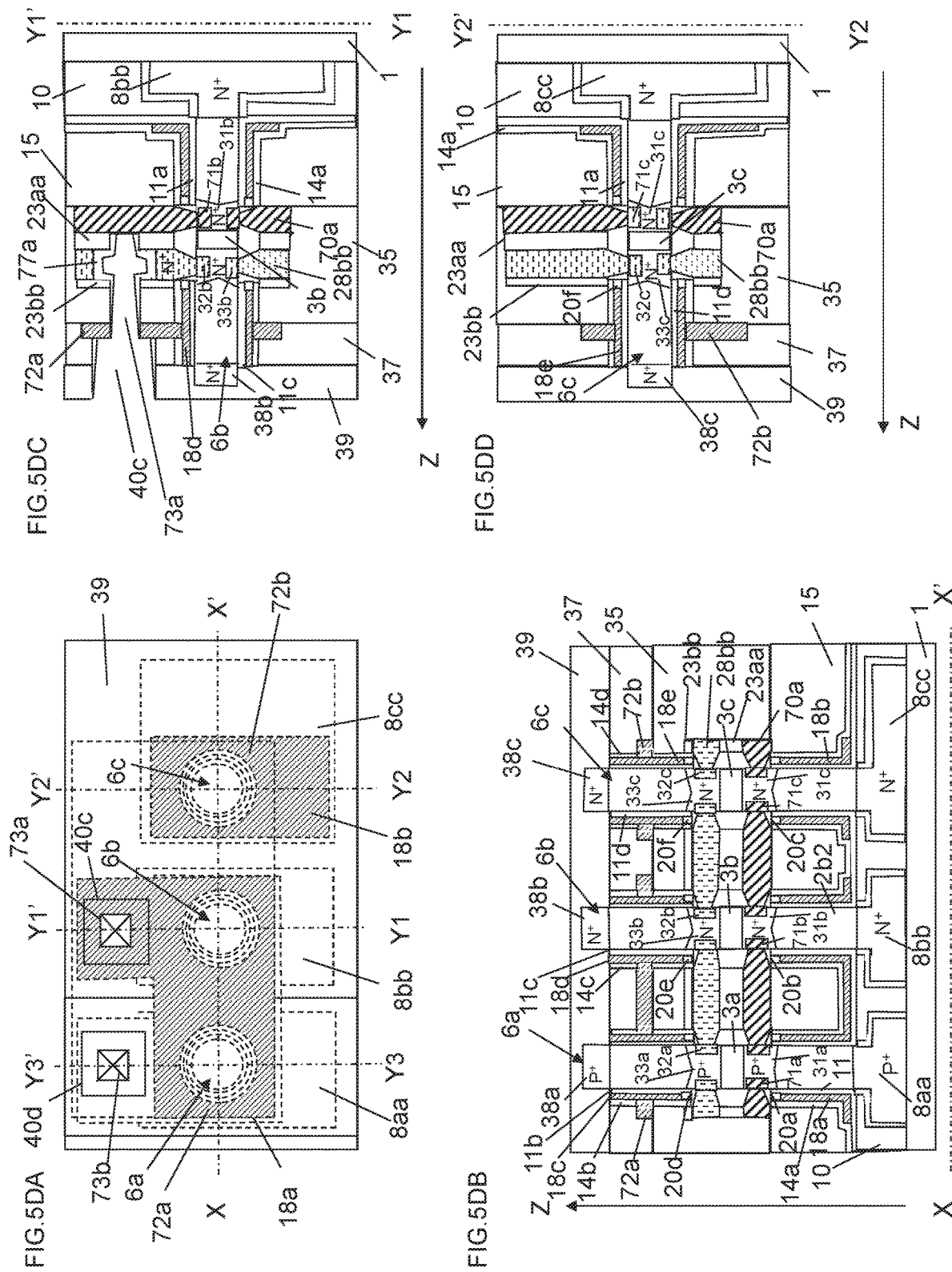

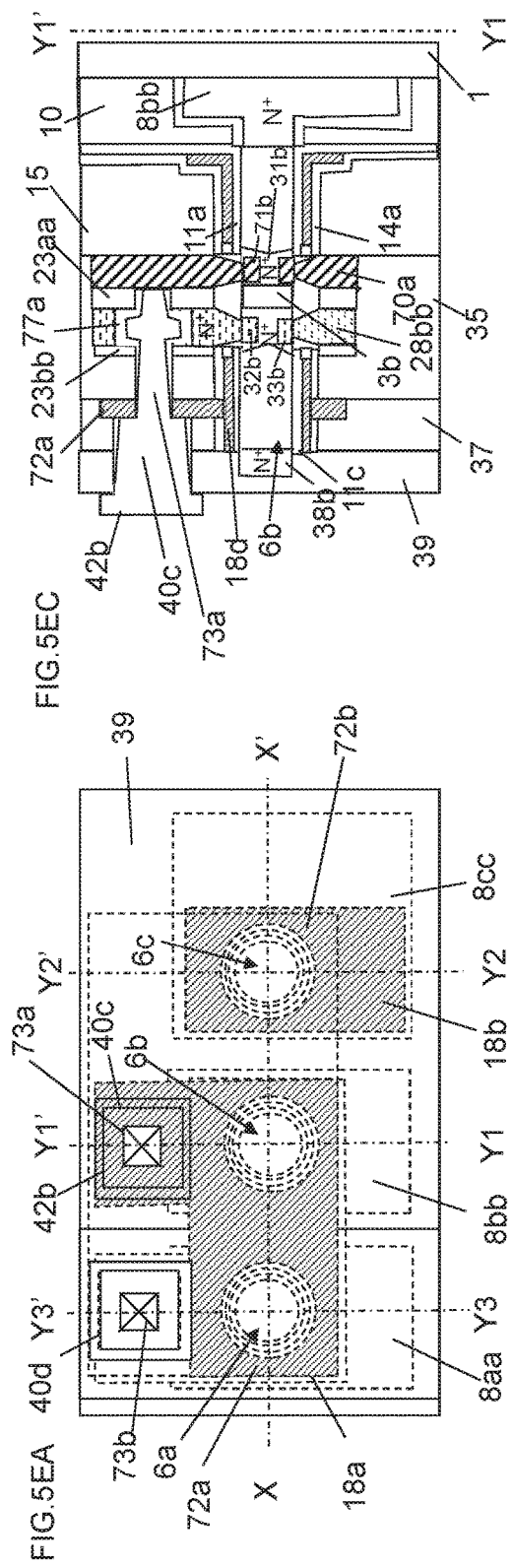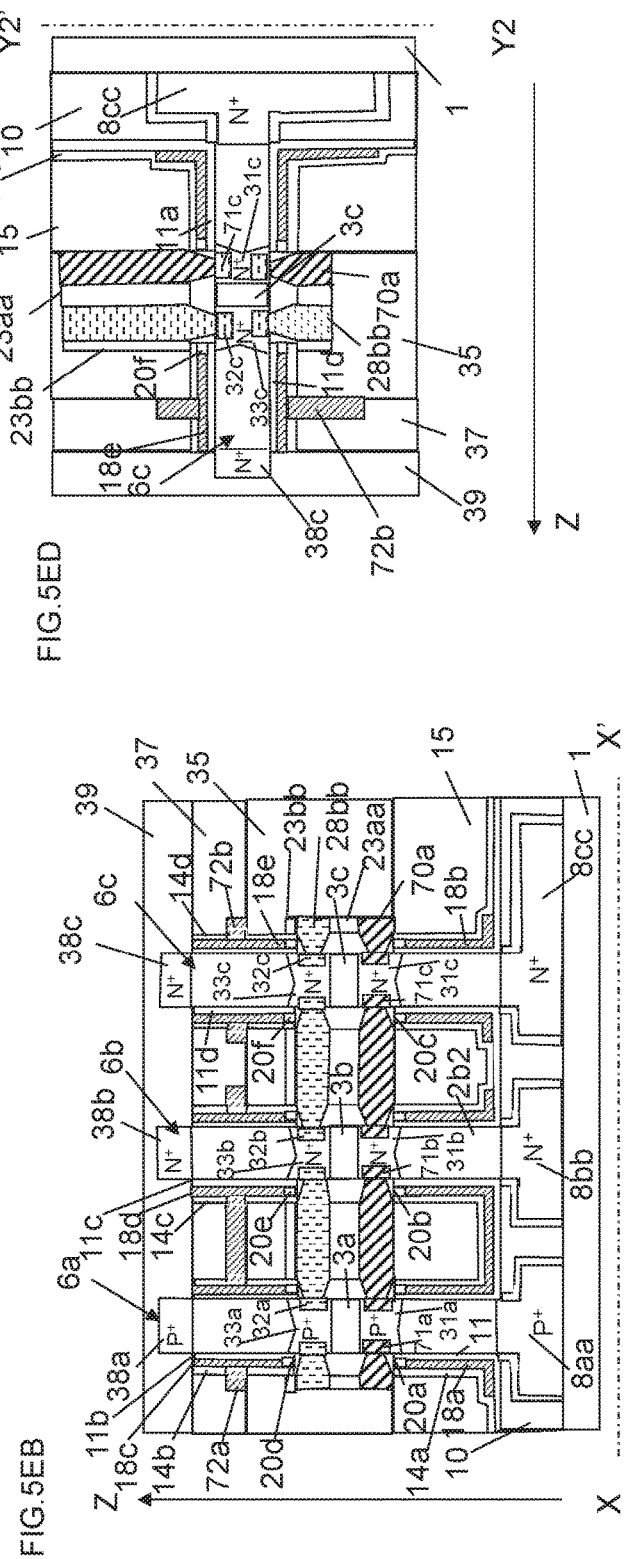

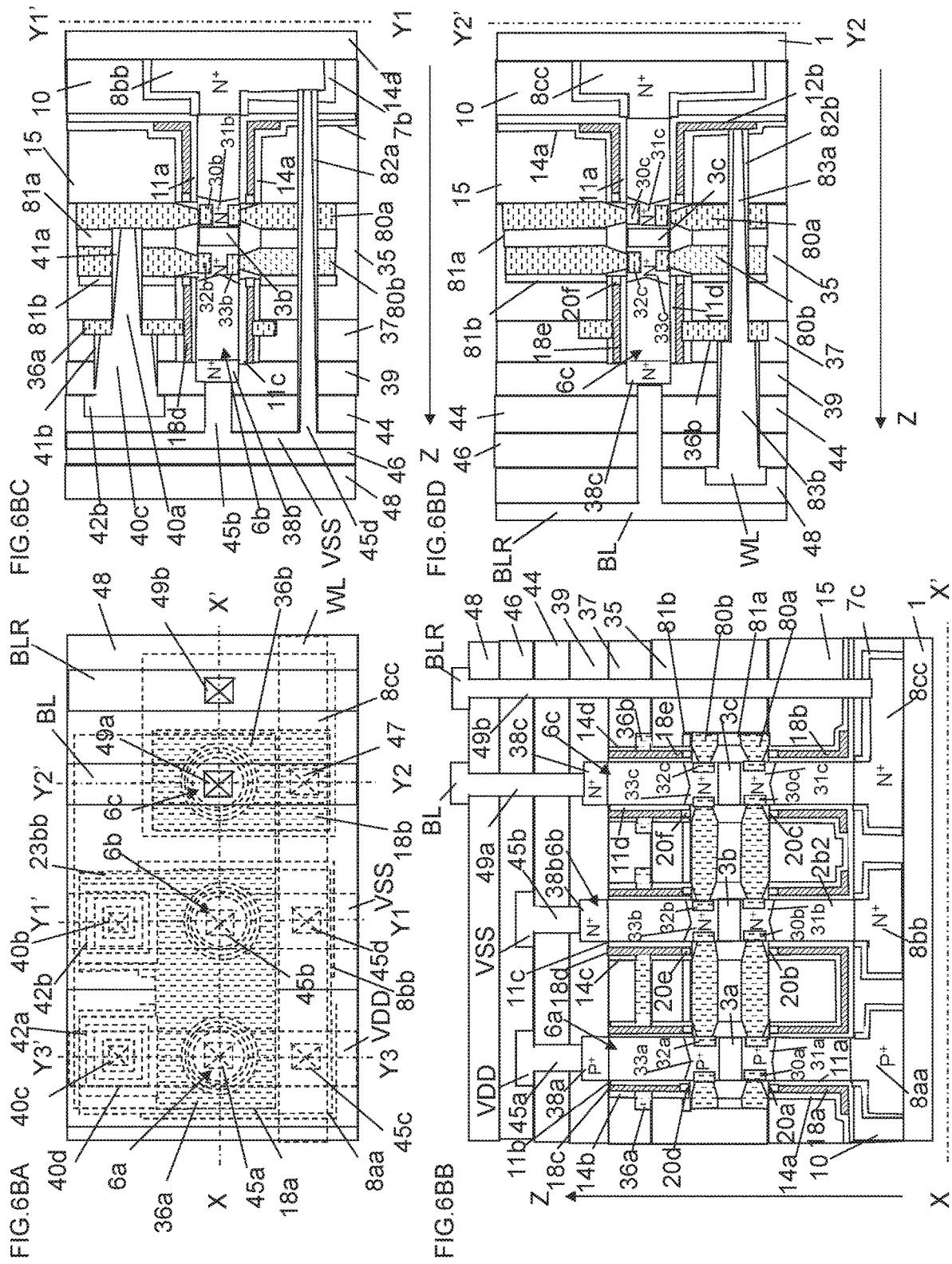

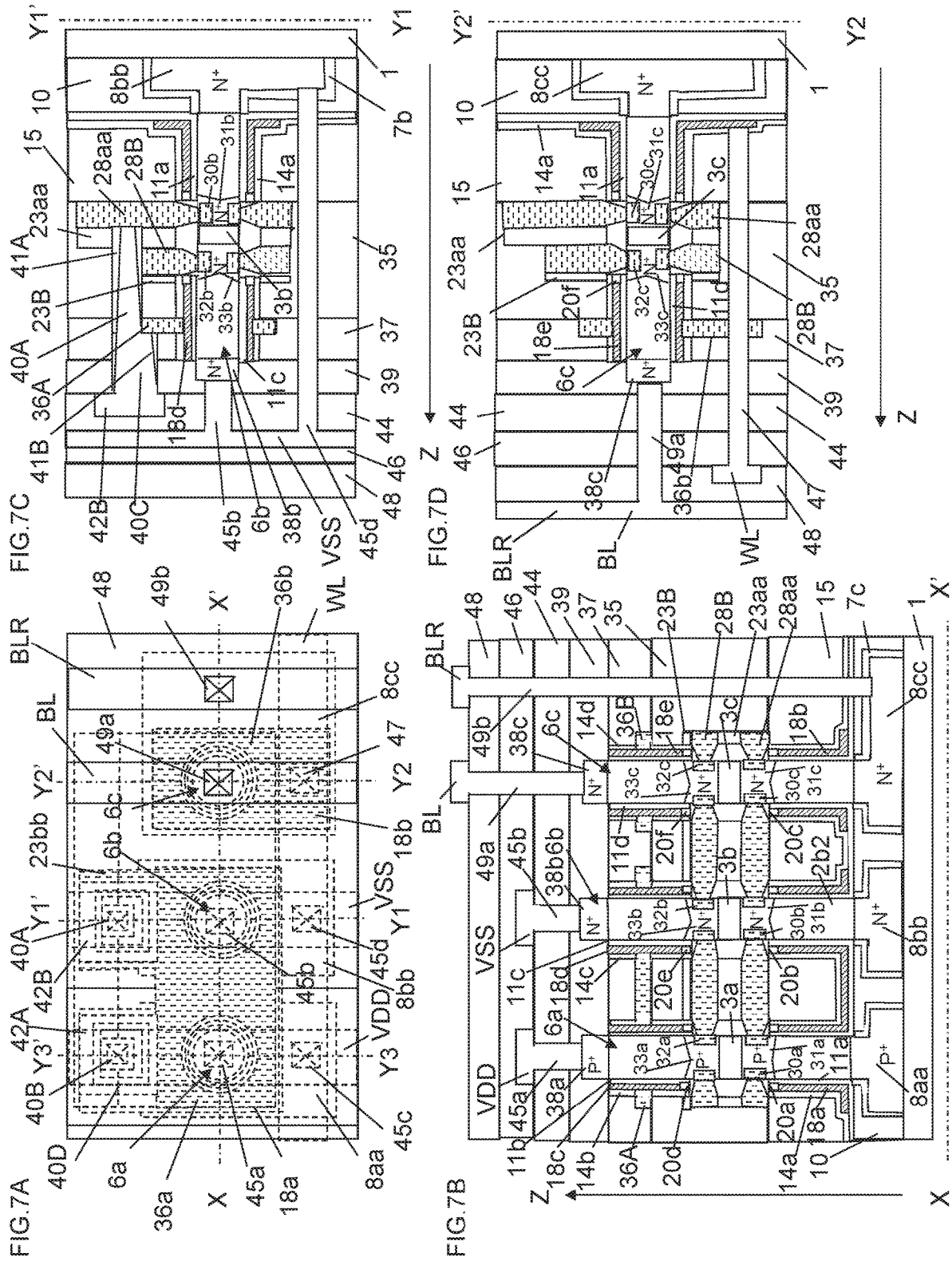

US 10,734,391 B2

SGT-INCLUDING PILLAR-SHAPED SEMICONDUCTOR DEVICE AND METHOD FOR PRODUCING THE SAME

RELATED APPLICATIONS

This application is a divisional patent application of U.S. patent application Ser. No. 15,655,168, filed Jul. 20, 2017, which is a continuation of International Application No. PCT/JP2015/078776, with an international filing date of Oct. 9, 2015, which claims priority to International Applications No. PCT/JP2015/060763 filed Apr. 6, 2015 and No. PCT/JP2015/069689 filed Jul. 8, 2015, the entire contents of which are incorporated herein by reference.

BACKGROUND OF THE INVENTION

1. Field of the Invention

The present invention relates to an SGT-including pillar-shaped semiconductor device and a method for producing the SGT-including pillar-shaped semiconductor device.

2. Description of the Related Art

In these years, three-dimensional transistors have been used in LSI (Large Scale Integration). In particular, surrounding gate transistors (SGTs), which are pillar-shaped semiconductor devices, have been attracting attention as semiconductor elements that provide highly integrated semiconductor devices. There has been a demand for an SGT-including semiconductor device that has a higher degree of integration and a higher performance.

Ordinary planar MOS transistors have a channel that is present in a horizontal direction along the upper surface of the semiconductor substrate. By contrast, SGTs have a channel that is present in a direction perpendicular to the upper surface of the semiconductor substrate (for example, refer to Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). For this reason, compared with planar MOS transistors, SGTs enable an increase in the density of semiconductor devices.

FIG. 8 is a schematic structural view of an N-channel SGT. A Si pillar 100 of a P or i (intrinsic) conductivity type (hereafter, silicon semiconductor pillars will be referred to as "Si pillars") has, in its upper and lower portions, $N^+$ layers 101$a$ and 101$b$ one of which functions as a source and the other one of which functions as a drain (hereafter, semiconductor regions containing a donor impurity at a high concentration will be referred to as "$N^+$ layers"). A portion of the Si pillar 100 between the $N^+$ layers 101$a$ and 101$b$, which function as a source and a drain, functions as a channel region 102. Around this channel region 102, a gate insulating layer 103 is formed. Around this gate insulating layer 103, a gate conductor layer 104 is formed. In the SGT, the $N^+$ layers 101$a$ and 101$b$ functioning as the source and the drain, the channel region 102, the gate insulating layer 103, and the gate conductor layer 104 are formed within a single Si pillar 100. Thus, in plan view, the area occupied by the SGT corresponds to the area occupied by a single source-or-drain $N^+$ layer of a planar MOS transistor. Therefore, compared with a circuit chip including a planar MOS transistor, an SGT-including circuit chip enables a further reduction in the size of the chip.

In the SGT illustrated in FIG. 8, a single SGT is formed in a single Si pillar. Alternatively, plural SGTs may be formed so as to be stacked in a single Si pillar. In this case, wiring conductor layers that are connected to the source/drain semiconductor regions and the gate conductor layers of SGTs and that are formed at the same heights in the perpendicular direction as the source/drain semiconductor regions, overlap in plan view. In a final step of forming the SGT circuit, the wiring conductor layers need to be connected, via a contact hole formed on the wiring conductor layers, to a wiring metal layer formed above the wiring conductor layers. For this reason, in order to achieve an increase in the degree of integration of an SGT circuit, how to form wiring conductor layers, contact holes, and wiring metal layers is important.

SUMMARY OF THE INVENTION

There has been a demand for an SGT-including pillar-shaped semiconductor device having a higher density and a higher performance.

An SGT-including pillar-shaped semiconductor device according to a first aspect of the present invention includes:

at least one surrounding gate transistor (SGT) including a semiconductor pillar formed on a substrate so as to be perpendicular to a surface of the substrate; a gate insulating layer formed so as to surround an outer periphery of the semiconductor pillar; a gate conductor layer formed so as to surround the gate insulating layer; a first impurity region formed within the semiconductor pillar and functioning as a source; and a second impurity region formed within the semiconductor pillar and functioning as a drain;

a first wiring conductor layer and at least one second wiring conductor layer present above the first wiring conductor layer that individually connect to any one of the gate conductor layer, the first impurity region, and the second impurity region of the at least one SGT, that extend in a horizontal direction along the surface of the substrate, and that at least partially overlap in plan view;

an interlayer insulating layer present between the first wiring conductor layer and the at least one second wiring conductor layer;

a tubular insulating film whose bottom portion is in contact with the first wiring conductor layer, and whose side surface is in contact with the at least one second wiring conductor layer and the interlayer insulating layer; and a lead-out conductor layer formed so as to fill the tubular insulating film and connect to the first wiring conductor layer.

The SGT-including pillar-shaped semiconductor device preferably further includes:

a third wiring conductor layer that connects to any one of the gate conductor layer, the first impurity region, and the second impurity region of the at least one SGT, that extends in a horizontal direction along the surface of the substrate, that at least partially overlap the first wiring conductor layer and the at least one second wiring conductor layer in plan view, and that is present above the at least one second wiring conductor layer;

another tubular insulating film whose bottom portion is in contact with an uppermost layer of the third wiring conductor layer; and another lead-out conductor layer that is formed within the other tubular insulating film, and that connects to an upper surface of the lead-out conductor layer and an upper surface of the uppermost layer of the third wiring conductor layer.

In the SGT-including pillar-shaped semiconductor device, preferably, in plan view, the other lead-out conductor layer surrounds the lead-out conductor layer.

In the SGT-including pillar-shaped semiconductor device, preferably, in plan view, at least one of the at least one second wiring conductor layer surrounds a whole periphery of the lead-out conductor layer.

In the SGT-including pillar-shaped semiconductor device, preferably, in plan view, the tubular insulating film includes an extension portion that extends in an outer peripheral direction of the tubular insulating film so as to be in contact with a side surface of at least one of the at least one second wiring conductor layer.

A method for producing an SGT-including pillar-shaped semiconductor device according to a second aspect of the present invention includes:

a stack structure-providing step of providing a stack structure including at least one semiconductor structure including a semiconductor pillar formed on a substrate so as to be perpendicular to a surface of the substrate, a gate insulating layer formed so as to surround an outer periphery of the semiconductor pillar, a gate conductor layer formed so as to surround the gate insulating layer, a first impurity region formed within the semiconductor pillar, and a second impurity region formed within the semiconductor pillar, a first wiring conductor layer and at least one second wiring conductor layer present above the first wiring conductor layer that individually connect to any one of the gate conductor layer, the first impurity region, and the second impurity region of the at least one semiconductor structure, that extend in a horizontal direction along the surface of the substrate, and that at least partially overlap in plan view, and an interlayer insulating layer present between the first wiring conductor layer and the at least one second wiring conductor layer;

a contact hole formation step of forming a contact hole so as to extend to an upper surface of or into the first wiring conductor layer, so as to extend through the at least one second wiring conductor layer or be in contact with the at least one second wiring conductor layer, and so as to extend through the interlayer insulating layer or be in contact with the interlayer insulating layer;

a tubular insulating film formation step of forming a tubular insulating film on a side surface of the stack structure except for an exposed surface of the first wiring conductor layer, the side surface being in the contact hole; and a lead-out conductor layer formation step of forming a lead-out conductor layer within the contact hole so as to connect to the exposed surface of the first wiring conductor layer.

In the method for producing an SGT-including pillar-shaped semiconductor device, preferably, in the stack structure-providing step, a third wiring conductor layer is further formed that connects to any one of the gate conductor layer, the first impurity region, and the second impurity region of the at least one SGT, that extends in a horizontal direction along the surface of the substrate, that at least partially overlaps the first wiring conductor layer and the at least one second wiring conductor layer in plan view, and that is present above the at least one second wiring conductor layer, in the contact hole formation step, before or after formation of the contact hole, another contact hole is further formed so as to extend to an upper surface of an uppermost layer of the third wiring conductor layer or into the third wiring conductor layer, in the tubular insulating film formation step, another tubular insulating film is further formed on a side surface of the stack structure except for an exposed surface of the uppermost layer of the third wiring conductor layer, the side surface being in the other contact hole, and in the lead-out conductor layer formation step, another lead-out conductor layer is further formed within the other contact hole so as to connect to the exposed surface of the uppermost layer of the third wiring conductor layer and to the tubular insulating film.

In the method for producing an SGT-including pillar-shaped semiconductor device, preferably, in the contact hole formation step, after the contact hole is formed, the other contact hole is formed, and the other contact hole is formed so as to surround, in plan view, a whole or a portion of the contact hole.

In the method for producing an SGT-including pillar-shaped semiconductor device, preferably, the contact hole formation step includes a mask material layer formation step of forming, on the stack structure, a mask material layer having an opening, an upper contact hole formation step of etching, in a direction perpendicular to, the stack structure through the mask material layer as a mask to form the other contact hole that extends to the upper surface of the uppermost layer of the third wiring conductor layer or into the third wiring conductor layer, and subsequently subjecting the stack structure to isotropic etching such that the other contact hole in plan view is larger in width than the opening;

a lower contact hole formation step of etching, in a direction perpendicular to, the stack structure through the mask material layer as a mask, to form the contact hole that extends to the upper surface of or into the first wiring conductor layer, and that extends through the at least one second wiring conductor layer or is in contact with the at least one second wiring conductor layer; and a mask material layer removal step of removing the mask material layer.

In the method for producing an SGT-including pillar-shaped semiconductor device, preferably, in the tubular insulating film formation step, an insulating material is filled into the contact hole, and the insulating material filled is etched off to the exposed surface of the first wiring conductor layer while an insulating film is left on the side surface of the stack structure, the side surface being in the contact hole.

The method for producing an SGT-including pillar-shaped semiconductor device preferably further includes a contact hole expansion step of, after the contact hole formation step and before the tubular insulating film formation step, expanding a portion of the contact hole surrounded by the at least one second wiring conductor layer by etching, in plan view, outward with respect to the contact hole, a side surface of at least one of the at least one second wiring conductor layer, the side surface being in the contact hole.

The present invention provides a high-density SGT-including pillar-shaped semiconductor device.

BRIEF DESCRIPTION OF THE DRAWINGS

FIGS. 2BA to 2BD are a plan view and sectional structural views that illustrate a method for producing an SGT-including pillar-shaped semiconductor device according to a first embodiment.

FIGS. 2DA to 2DD are a plan view and sectional structural views that illustrate a method for producing an SGT-including pillar-shaped semiconductor device according to a first embodiment.

FIGS. 2FA to 2FD are a plan view and sectional structural views that illustrate a method for producing an SGT-including pillar-shaped semiconductor device according to a first embodiment.

FIGS. 2GA to 2GD are a plan view and sectional structural views that illustrate a method for producing an SGT-including pillar-shaped semiconductor device according to a first embodiment.

FIGS. 2HA to 2HD are a plan view and sectional structural views that illustrate a method for producing an SGT-including pillar-shaped semiconductor device according to a first embodiment.

FIGS. 2IA to 2ID are a plan view and sectional structural views that illustrate a method for producing an SGT-including pillar-shaped semiconductor device according to a first embodiment.

FIGS. 2QA to 2QE are a plan view and sectional structural views that illustrate a method for producing an SGT-including pillar-shaped semiconductor device according to a first embodiment.

FIGS. 4AA to 4AD are a plan view and sectional structural views that illustrate a method for producing an SGT-including pillar-shaped semiconductor device according to a third embodiment of the present invention.

FIGS. 4BA to 4BD are a plan view and sectional structural views that illustrate a method for producing an SGT-including pillar-shaped semiconductor device according to a third embodiment.

FIGS. 7A to 7E are a plan view and sectional structural views that illustrate a method for producing an SGT-including pillar-shaped semiconductor device according to a sixth embodiment of the present invention.

DETAILED DESCRIPTION OF THE PREFERRED EMBODIMENTS

Hereinafter, methods for producing pillar-shaped semiconductor devices according to embodiments of the present invention will be described with reference to drawings.

First Embodiment

Hereinafter, referring to FIGS. 1A, 1B, and 2AA to 2SE, a method for producing an SGT-including pillar-shaped semiconductor device according to a first embodiment of the present invention will be described.

Figure 1A:
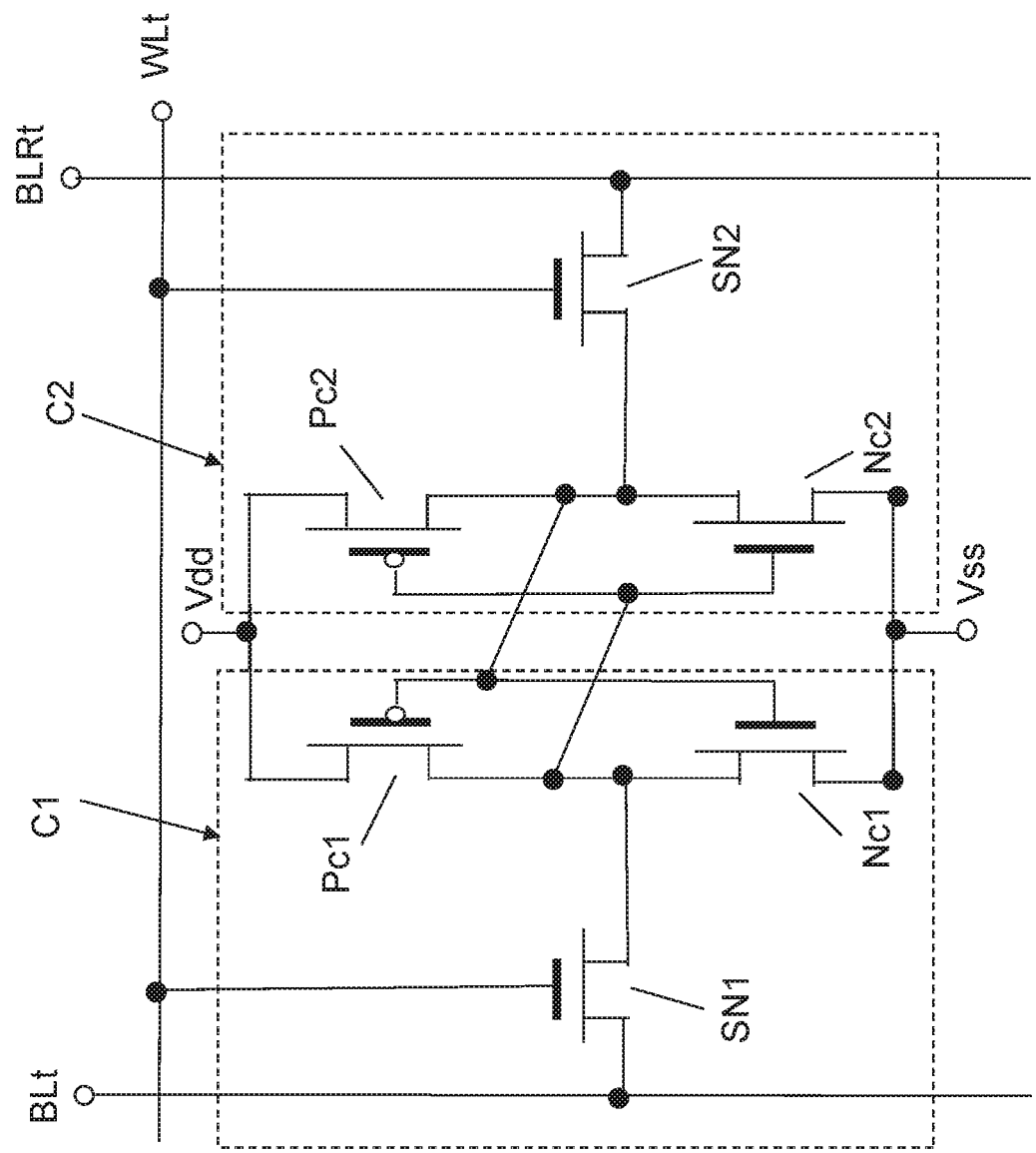
FIG. 1A is an SRAM cell circuit diagram that illustrates an SGT-including pillar-shaped semiconductor memory device according to a first embodiment of the present invention.

FIG. 1A illustrates a pillar-shaped semiconductor device according to this embodiment, that is, an SRAM cell circuit including SGTs. This SRAM cell circuit includes two inverter circuits. One of the inverter circuits is constituted by a P-channel SGT Pc1 serving as a load transistor, and an N-channel SGT Nc1 serving as a drive transistor. The other inverter circuit is constituted by a P-channel SGT Pc2 serving as a load transistor, and an N-channel SGT Nc2 serving as a drive transistor. The gate of the P-channel SGT Pc1, the gate of the N-channel SGT Nc1, the drain of the P-channel SGT Pc2, and the drain of the N-channel SGT Nc2 are connected together. The gate of the P-channel SGT Pc2, the gate of the N-channel SGT Nc2, the drain of the P-channel SGT Pc1, and the drain of the N-channel SGT Nc1 are connected together.

As illustrated in FIG. 1A, the sources of the P-channel SGTs Pc1 and Pc2 are connected to a power supply terminal Vdd. The sources of the N-channel SGTs Nc1 and Nc2 are connected to a ground terminal Vss. Selection N-channel SGTs SN1 and SN2 are disposed on both sides of the two inverter circuits. The gates of the selection N-channel SGTs SN1 and SN2 are connected to a word line terminal WLt. The source and drain of the selection N-channel SGT SN1 are connected to a bit line terminal BLt and the drains of the N-channel SGT Nc1 and the P-channel SGT Pc1. The source and drain of the selection N-channel SGT SN2 are connected to an inverted bit line terminal BLRt and the drains of the N-channel SGT Nc2 and the P-channel SGT Pc2. Thus, the circuit including an SRAM cell (hereafter, referred to as an "SRAM cell circuit") according to this embodiment is constituted by, in total, six SGTs that are two P-channel SGTs Pc1 and Pc2 and four N-channel SGTs Nc1, Nc2, SN1, and SN2. This SRAM cell circuit is constituted by a circuit area C1, which is constituted by the P-channel SGT Pc1 and the N-channel SGTs Nc1 and SN1, and a circuit area C2, which is constituted by the P-channel SGT Pc2 and the N-channel SGTs Nc2 and SN2.

Figure 1B:
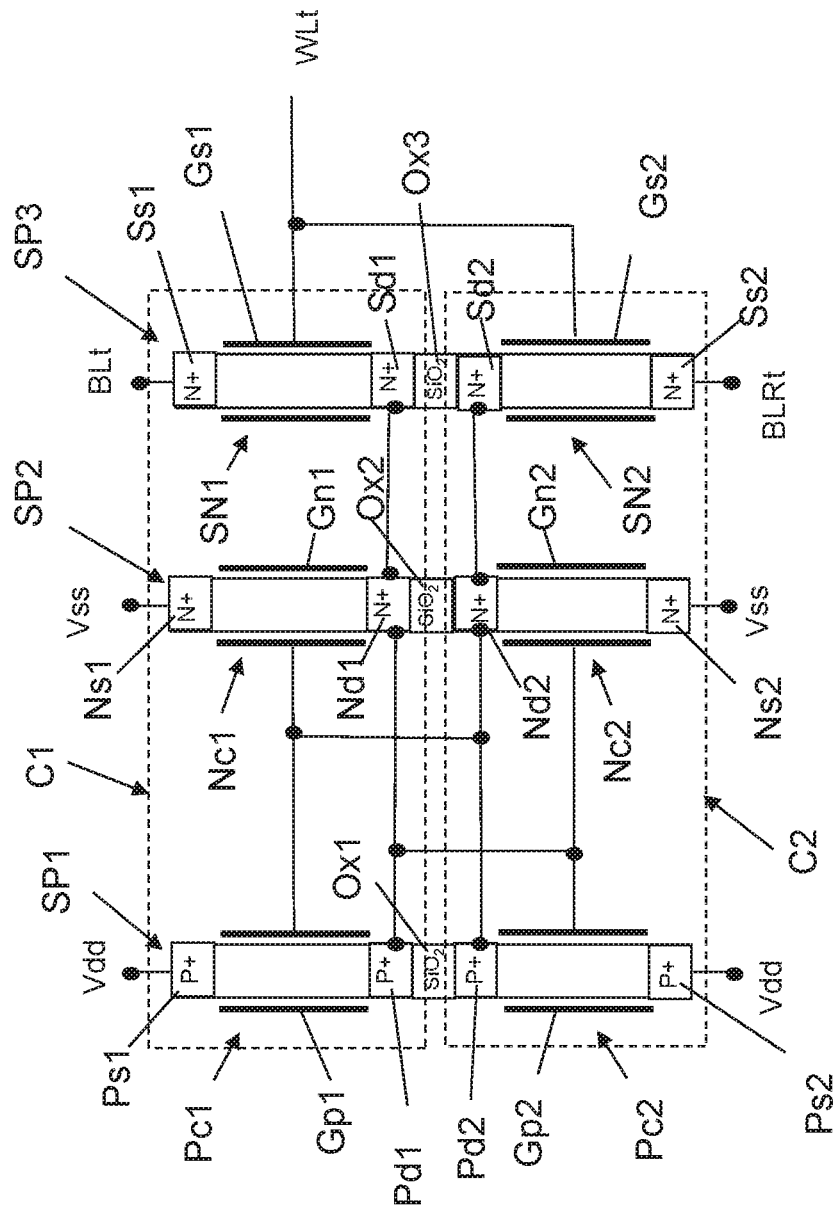
FIG. 1B is an SRAM cell schematic structural view that illustrates an SGT-including pillar-shaped semiconductor memory device according to a first embodiment.

FIG. 1B is a schematic structural view of the SRAM cell circuit according to the first embodiment. This SRAM cell circuit is constituted by three Si pillars SP1, SP2, and SP3.

In the Si pillar SP1, the P-channel SGT Pc1 in FIG. 1A is formed in an upper portion, and the P-channel SGT Pc2 in FIG. 1A is formed in a lower portion. The P-channel SGTs Pc1 and Pc2 are isolated from each other by a $SiO_2$ layer Ox1, which is formed in an intermediate portion of the Si pillar SP1. The P-channel SGT Pc1 is constituted by a channel portion of the Si pillar SP1, a gate Gp1 surrounding this portion of the Si pillar SP1, and a drain $P^+$ layer Pd1 and a source $P^+$ layer Ps1, which are present over and under the gate Gp1 and within the Si pillar SP1. The P-channel SGT Pc2 is constituted by a channel portion of the Si pillar SP1, a gate Gp2 surrounding this portion of the Si pillar SP1, and a drain $P^+$ layer Pd2 and a source $P^+$ layer Ps2, which are present over and under the gate Gp2 and within the Si pillar SP1.

In the Si pillar SP2, the N-channel SGT Nc1 in FIG. 1A is formed in an upper portion, and the N-channel SGT Nc2 in FIG. 1A is formed in a lower portion. The N-channel SGTs Nc1 and Nc2 are isolated from each other by a $SiO_2$ layer Ox2, which is formed in an intermediate portion of the Si pillar SP2. The N-channel SGT Nc1 is constituted by a channel portion of the Si pillar SP2, a gate Gn1 surrounding this portion of the Si pillar SP2, and a drain $N^+$ layer Nd1 and a source $N^+$ layer Ns1, which are formed over and under the gate Gn1 and within the Si pillar SP2. The N-channel SGT Nc2 is constituted by a channel portion of the Si pillar SP2, a gate Gn2 surrounding this portion of the Si pillar SP2, and a drain $N^+$ layer Nd2 and a source $N^+$ layer Ns2, which are formed over and under the gate Gn2 and within the Si pillar SP2.

In the Si pillar SP3, the N-channel SGT SN1 in FIG. 1A is formed in an upper portion, and the N-channel SGT SN2 in FIG. 1A is formed in a lower portion. The N-channel SGTs SN1 and SN2 are isolated from each other by a $SiO_2$ layer Ox3, which is formed in an intermediate portion of the Si pillar SP3. The N-channel SGT SN1 is constituted by a channel portion of the Si pillar SP3, a gate Gs1 surrounding this portion of the Si pillar SP3, and a drain $N^+$ layer Sd1 and a source $N^+$ layer Ss1, which are formed over and under the gate Gs1 and within the Si pillar SP3. The N-channel SGT SN2 is constituted by a channel portion of the Si pillar SP3, a gate Gs2 surrounding this portion of the Si pillar SP3, and a drain $N^+$ layer Sd2 and a source $N^+$ layer Ss2, which are formed over and under the gate Gs2 and within the Si pillar SP3.

As illustrated in FIG. 1B, components positioned at the same heights are connected to each other in the Si pillars SP1, SP2, and SP3. Specifically, the gates Gp1 and Gn1 are connected to each other; the drain $P^+$ layer Pd1, the drain $N^+$ layer Nd1, and the drain $N^+$ layer Sd1 are connected together; the drain $P^+$ layer Pd2, the drain $N^+$ layer Nd2, and the drain $N^+$ layer Sd2 are connected together; and the gates Gp2 and Gn2 are connected to each other. Furthermore, the gates Gp1 and Gn1, the drain $P^+$ layer Pd2, the drain $N^+$ layer Nd2, and the drain $N^+$ layer Sd2 are connected together; and the gates Gp2 and Gn2, the drain $P^+$ layer Pd1, the drain $N^+$ layer Nd1, and the drain $N^+$ layer Sd1 are connected together.

As illustrated in FIG. 1B, the source $P^+$ layers Ps1 and Ps2 in the Si pillar SP1 are connected to the power supply terminal Vdd; the source $N^+$ layers Ns1 and Ns2 in the Si pillar SP2 are connected to the ground terminal Vss; the source $N^+$ layer Ss1 in the Si pillar SP3 is connected to the bit line terminal BLt; the source $N^+$ layer Ss2 in the Si pillar SP3 is connected to the inverted bit line terminal BLRt; and the gates Gs1 and Gs2 in the Si pillar SP3 are connected to the word line terminal WLt.

As illustrated in FIG. 1B, the circuit area C1 in the circuit diagram in FIG. 1A is formed in an upper portion of the Si pillars SP1, SP2, and SP3, and the circuit area C2 in the circuit diagram in FIG. 1A is formed in a lower portion of the Si pillars SP1, SP2, and SP3. Components at the same heights in the Si pillars SP1, SP2, and SP3 are connected to each other without a vertical connection path between Si pillars. Specifically, the gates Gp1 and Gn1 are connected to each other without a vertical connection path between the Si pillars SP1 and SP2; the drain $P^+$ layer Pd1 and the $N^+$ layers Nd1 and Sd1 are connected together without vertical connection paths between the Si pillars SP1, SP2, and SP3; the drain $P^+$ layer Pd2 and the $N^+$ layers Nd2 and Sd2 are connected together without vertical connection paths between the Si pillars SP1, SP2, and SP3; similarly, the gates Gp2 and Gn2 are connected to each other without a vertical connection path between the Si pillars SP1 and SP2. By contrast, the connection of the gates Gp1 and Gn1 to the drains Pd2 and Nd2 needs to be formed via a vertical connection wiring path. Similarly, the connection of the gates Gp2 and Gn2 to the drains Pd1 and Nd1 is formed via a vertical connection wiring path.

Figure 2A:
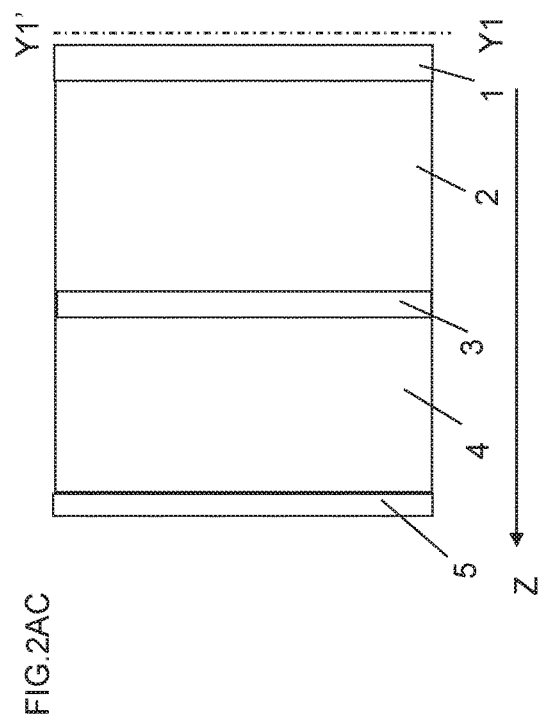
FIGS. 2AA to 2AD are a plan view and sectional structural views that illustrate a method for producing an SGT-including pillar-shaped semiconductor device according to a first embodiment.
Figure 2A:
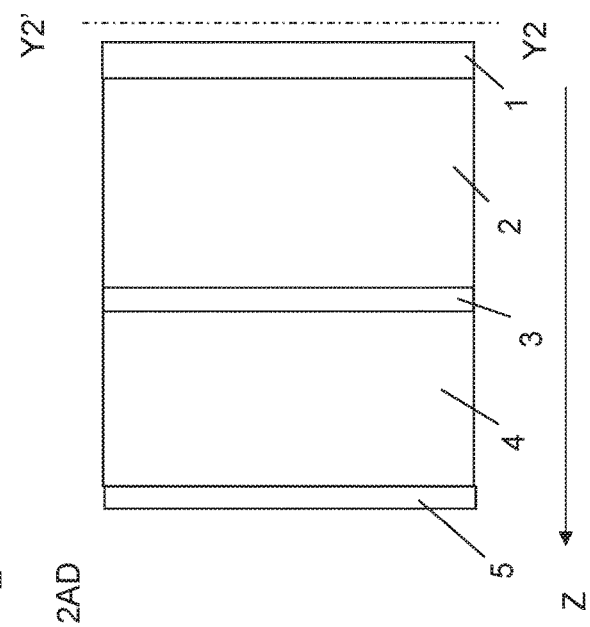
Figure 2A:
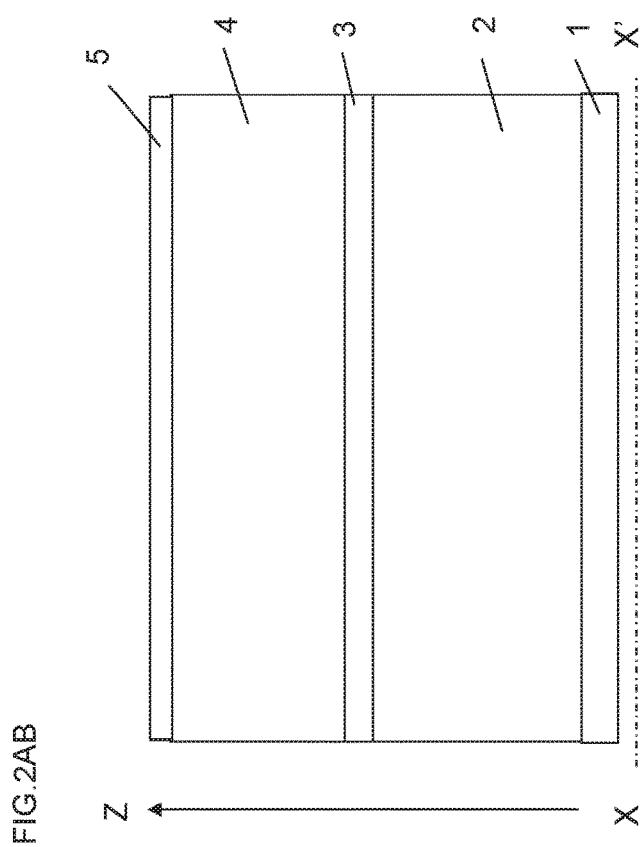
Figure 2A:
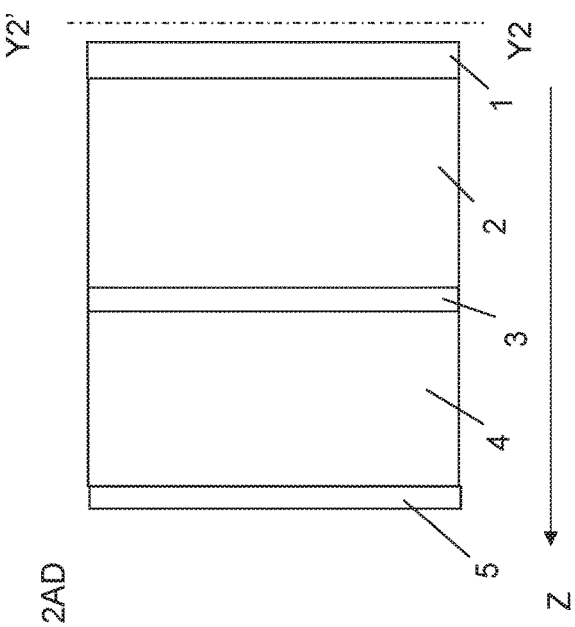

FIGS. 2AA to 2AD are a plan view and sectional views for illustrating a step for producing an SRAM cell circuit that is an SGT-including pillar-shaped semiconductor device. Among FIG. 2AA to FIG. 2SD, figures suffixed with A are plan views; figures suffixed with B are sectional structural views taken along lines X-X' in the corresponding figures suffixed with A; figures suffixed with C are sectional structural views taken along lines Y1-Y1' in the corresponding figures suffixed with A; and figures suffixed with D are sectional structural views taken along lines Y2-Y2' in the corresponding figures suffixed with A.

As illustrated in FIGS. 2AA to 2AD, on a $SiO_2$ layer substrate 1, an i layer 2, a $SiO_2$ layer 3, an i layer 4, and a $SiO_2$ layer 5 are formed so as to be stacked.

Subsequently, as illustrated in FIGS. 2BA to 2BD, a lithographic process and an RIE (Reactive Ion Etching) process are carried out with a resist layer (not shown) as a mask to form $SiO_2$ layers 5a, 5b, and 5c, which are circular in plan view. Subsequently, an RIE process is carried out through the resist layer and the $SiO_2$ layers 5a, 5b, and 5c as masks to etch the i layer 4, the $SiO_2$ layer 3, and the i layer 2 such that a lower layer of the i layer 2 is left on the $SiO_2$ layer substrate 1 to thereby form Si pillars 6a, 6b, and 6c. Subsequently, the resist layer is removed. As a result, the Si pillar 6a is formed so as to include an i layer 2b1, a $SiO_2$ layer 3a, an i layer 4a, and a $SiO_2$ layer 5a; the Si pillar 6b is formed so as to include an i layer 2b2, a $SiO_2$ layer 3b, an i layer 4b, and a $SiO_2$ layer 5b; and the Si pillar 6c is formed so as to include an i layer 2b3, a $SiO_2$ layer 3c, an i layer 4c, and a $SiO_2$ layer 5c.

Subsequently, a lithographic process and an RIE process are carried out to etch the i layer 2 remaining as a lower layer, to thereby form an i layer 2a1 in an outer peripheral portion around the Si pillar 6a, an i layer 2a2 in an outer peripheral portion around the Si pillar 6b, and an i layer 2a3 in an outer peripheral portion around the Si pillar 6c.

Figure 2C:
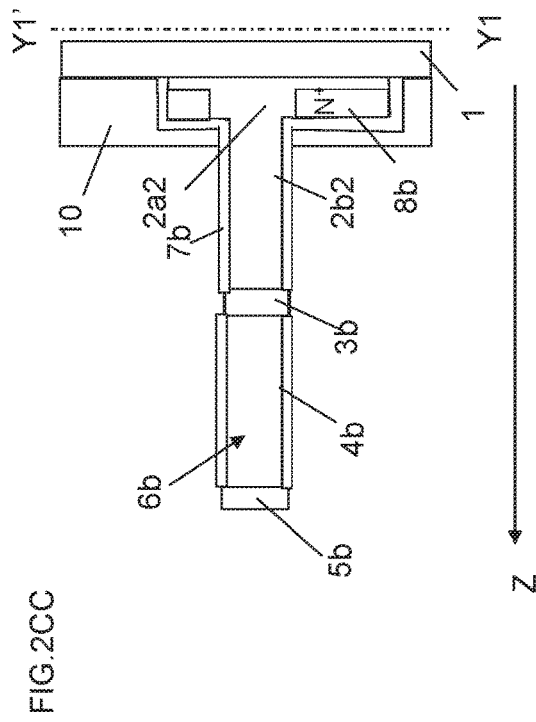
FIGS. 2CA to 2CD are a plan view and sectional structural views that illustrate a method for producing an SGT-including pillar-shaped semiconductor device according to a first embodiment.
Figure 2C:
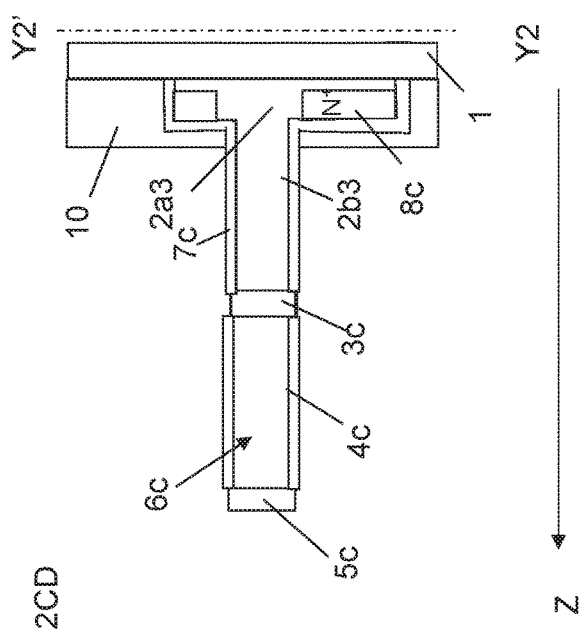
Figure 2C:
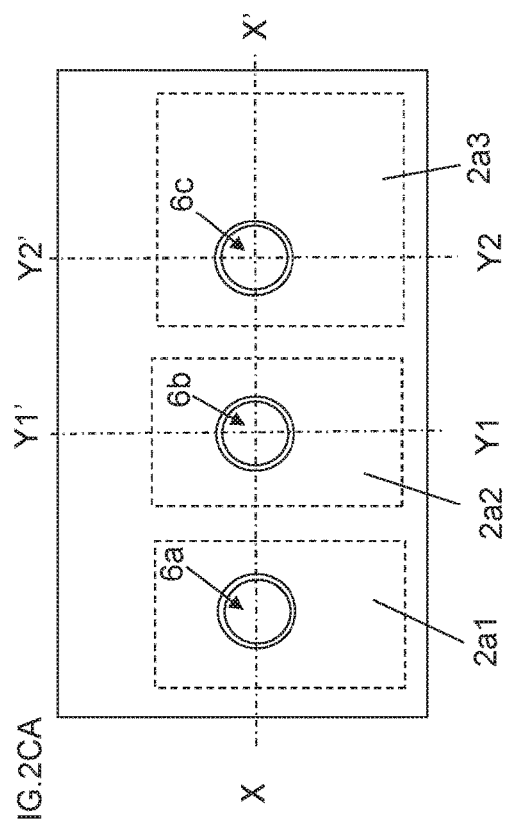
Figure 2C:
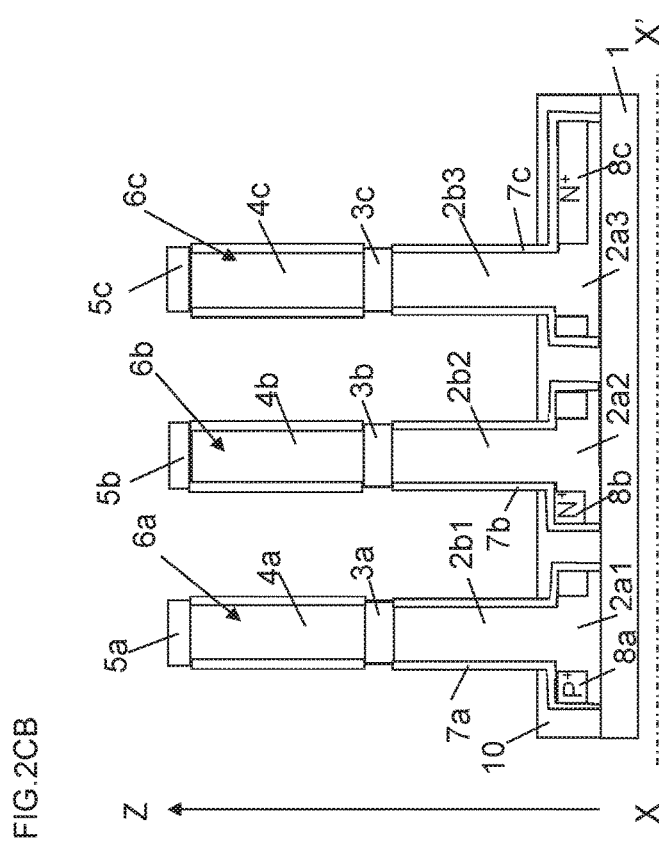

Subsequently, as illustrated in FIGS. 2CA to 2CD, for example, thermal oxidation is carried out, to thereby form $SiO_2$ layers 7a, 7b, and 7c on the outer peripheries of the Si pillars 6a, 6b, and 6c and the i layers 2a1, 2a2, and 2a3. Subsequently, a lithographic process and an ion implantation process are carried out such that a $P^+$ layer 8a is formed in the i layer 2a1 in the outer peripheral portion around the Si pillar 6a, an $N^+$ layer 8b is formed in the i layer 2a2 in the outer peripheral portion around the Si pillar 6b, and an $N^+$ layer 8c is formed in the i layer 2a3 in the outer peripheral portion around the Si pillar 6c. Subsequently, a $SiO_2$ layer 10 is formed so as to surround lower portions of the Si pillars 6a, 6b, and 6c and surround the i layers 2a1, 2a2, and 2a3.

Subsequently, as illustrated in FIGS. 2DA to 2DD, portions of the $SiO_2$ layers 7a, 7b, and 7c above the $SiO_2$ layer 10 are removed. Subsequently, a hafnium oxide ($HfO_2$) layer 11 and a titanium nitride (TiN) layer 12 are sequentially formed so as to cover the Si pillars 6a, 6b, and 6c and the $SiO_2$ layer 10 by, for example, ALD (Atomic Layer Deposition) processes. In the end, the $HfO_2$ layer 11 will function as gate insulating layers of SGTs; and the TiN layer 12 will function as gate conductor layers of SGTs.

Figure 2E:
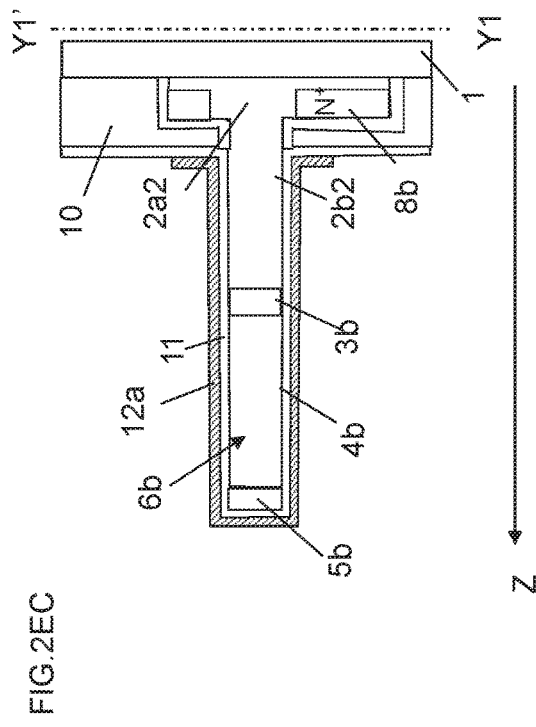
FIGS. 2EA to 2ED are a plan view and sectional structural views that illustrate a method for producing an SGT-including pillar-shaped semiconductor device according to a first embodiment.
Figure 2E:
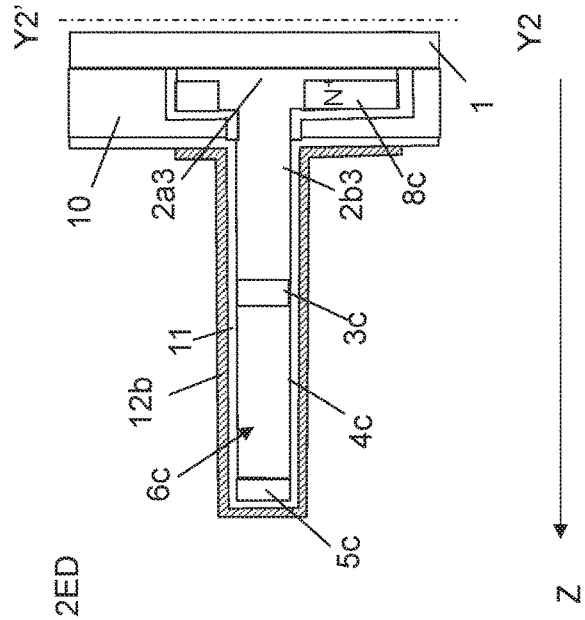
Figure 2E:
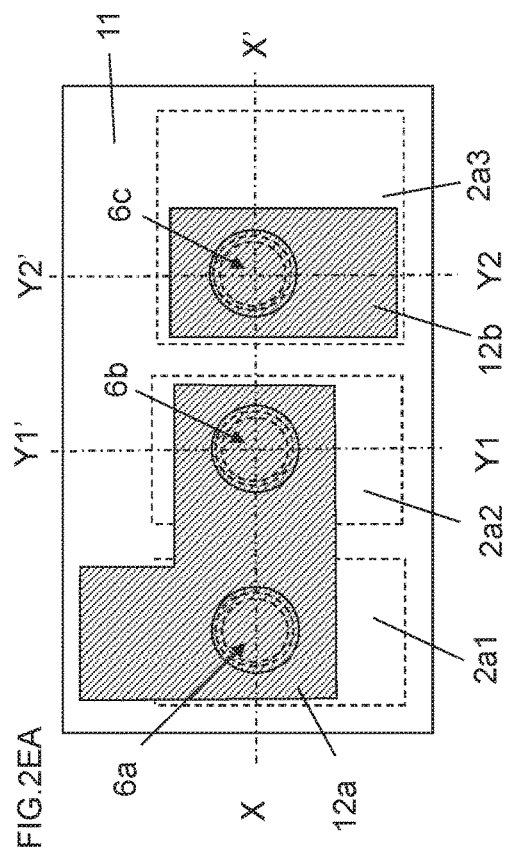
Figure 2E:
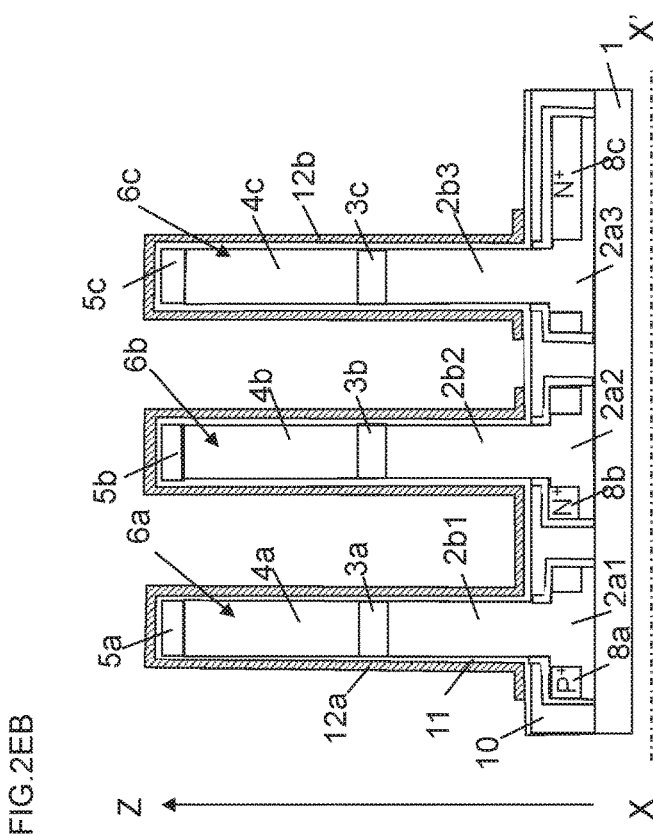

Subsequently, as illustrated in FIGS. 2EA to 2ED, a lithographic process and an RIE process are carried out to form a TiN layer 12a surrounding the Si pillars 6a and 6b, and a TiN layer 12b surrounding the Si pillar 6c.

Subsequently, as illustrated in FIGS. 2FA to 2FD, a $SiO_2$ layer 14 is formed so as to cover the whole structure. Subsequently, a heat treatment is carried out to thermally diffuse the donor/acceptor impurity atoms in the $P^+$ layer 8a and the $N^+$ layers 8b and 8c to the entirety of the i layers 2a1, 2a2, and 2a3, to thereby form a $P^+$ layer Baa and $N^+$ layers 8bb and 8cc. Subsequently, a silicon nitride (SiN) layer 15 is formed around the outer peripheries of the Si pillars 6a, 6b, and 6c. Subsequently, a resist layer 16 is formed on the SiN layer 15. The resist layer 16 is formed such that the $SiO_2$ layers 3a, 3b, and 3c are positioned in the center portions (in the vertical direction) of the resist layer 16. The resist layer 16 is formed in the following manner: a resist material is applied to the Si pillars 6a, 6b, and 6c and the upper surface of the SiN layer 15; subsequently, a heat treatment at 200° C., for example, is carried out to enhance the fluidity of the resist material, so that the resist material is uniformly distributed around the Si pillars 6a, 6b, and 6c and over the SiN layer 15. Subsequently, a hydrogen fluoride gas (hereafter, referred to as an "HF gas") is supplied to the whole structure. Subsequently, an environment of heating at 180° C., for example, is provided, so that the HF gas is ionized due to moisture contained within the resist layer 16, to form hydrogen fluoride ions ($HF_2^+$) (hereafter, referred to as "HF ions"). These HF ions diffuse through the resist layer 16 to etch portions of the $SiO_2$ layer 14 that are in contact with the resist layer 16 (regarding the mechanism of this etching, refer to Tadashi Shibata, Susumu Kohyama and Hisakazu Iizuka: "A New Field Isolation Technology for High Density MOS LSI", Japanese Journal of Applied Physics, Vol. 18, pp. 263-267 (1979)). On the other hand, the other portions of the $SiO_2$ layer 14 that are not in contact with the resist layer 16 are substantially left without being etched. Subsequently, the resist layer 16 is removed.

As a result, as illustrated in FIGS. 2GA to 2GD, the $SiO_2$ layer 14 is divided into a $SiO_2$ layer 14a, which is covered by the SiN layer 15, and $SiO_2$ layers 14b, 14c, and 14d, which are upper regions in the Si pillars 6a, 6b, and 6c. Subsequently, the TiN layers 12a and 12b are etched through the $SiO_2$ layers 14a, 14b, 14c, and 14d and the SiN layer 15 as masks. As a result, the TiN layer 12a is divided into a TiN layer 18a, which is in lower regions around the Si pillars 6a and 6b and covered by the SiN layer 15, a TiN layer 18c, which is covered by the $SiO_2$ layer 14b, and a TiN layer 18d, which is covered by the $SiO_2$ layer 14c; and the TiN layer 12b is divided into a TiN layer 18b, which is in a lower region around the Si pillar 6c and covered by the SiN layer 15, and a TiN layer 18e, which is covered by the $SiO_2$ layer 14d. Subsequently, the $HfO_2$ layer 11 is etched through the $SiO_2$ layers 14a, 14b, and 14c and the TiN layers 18a, 18b, 18c, 18d, and 18e as masks. As a result, the $HfO_2$ layer 11 is divided into a $HfO_2$ layer 11a, which is in lower regions around the Si pillars 6a, 6b, and 6c and covered by the TiN layers 18a and 18b, and HfO$_2$ layers 11b, 11c, and 11d, which are in upper regions around the Si pillars 6a, 6b, and 6c and respectively covered by the TiN layers 18c, 18d, and 18e. Subsequently, an exposed portion of the TiN layer 18a around the Si pillar 6a, an exposed portion of the TiN layer 18a around the Si pillar 6b, and the exposed portions of the TiN layers 18b, 18c, 18d, and 18e are oxidized to thereby form TiO (titanium oxide) layers 20a, 20b, 20c, 20d, 20e, and 20f. Subsequently, SiO$_2$ layers (not shown) are removed that are formed on the side surfaces of the Si pillars 6a, 6b, and 6c during formation of the TiO layers 20a, 20b, 20c, 20d, 20e, and 20f.

Subsequently, as illustrated in FIGS. 2HA to 2HD, for example, a bias sputtering process is carried out in the following manner: a substrate metal plate on which the SiO$_2$ layer substrate 1 is disposed and an opposite metal plate separated from the substrate metal plate are prepared; a direct-current voltage is applied to the substrate metal plate, and an RF voltage is applied across these two parallel metal plates, to thereby sputter the material atoms of the opposite metal plate onto the SiO$_2$ layer substrate 1. In this way, Ni atoms are directed to, in a direction perpendicular to, the upper surface of the SiO$_2$ layer substrate 1, to thereby form a Ni layer 21a on the SiN layer 15. Similarly, bias sputtering processes are carried out to thereby sequentially stack the following layers: a P-type poly-Si layer 22a containing boron (B) as an impurity, a SiO$_2$ layer 23a, a Ni layer 21b, a P-type poly-Si layer 22b, and a SiO$_2$ layer 23b. Incidentally, the SiO$_2$ layer 23b is formed such that its upper surface is in contact with the SiO$_2$ layers 14b, 14c, and 14d, which cover upper portions of the Si pillars 6a, 6b, and 6c. The Ni atoms, the poly-Si atoms, and the SiO$_2$ atoms are directed to, in a direction perpendicular to, the upper surface of the SiO$_2$ layer substrate 1. As a result, sealed spaces 25a, 25b, and 25c are formed between the outer peripheral side surfaces of the Si pillars 6a, 6b, and 6c and the Ni layers 21a and 21b, the P-type poly-Si layers 22a and 22b, and the SiO$_2$ layers 23a and 23b. Subsequently, stacked films (not shown) are removed that are formed over the top of the Si pillars 6a, 6b, and 6c during formation of the stacked films on the SiN layer 15 that are constituted by the Ni layers 21a and 21b, the P-type poly-Si layers 22a and 22b, and the SiO$_2$ layers 23a and 23b.

Subsequently, as illustrated in FIGS. 2IA to 2ID, a resist layer 27 is formed so as to cover the Si pillar 6a. Subsequently, ion implantation of arsenic (As) atoms is carried out from above the upper surface of the SiO$_2$ layer substrate 1, to thereby turn the P-type poly-Si layers 22a and 22b in the outer peripheral portions around the Si pillars 6b and 6c, into N$^+$ layers. Thus, N$^+$-type poly-Si layers 26a and 26b are formed. Subsequently, the resist layer 27 is removed.

Figure 2J:
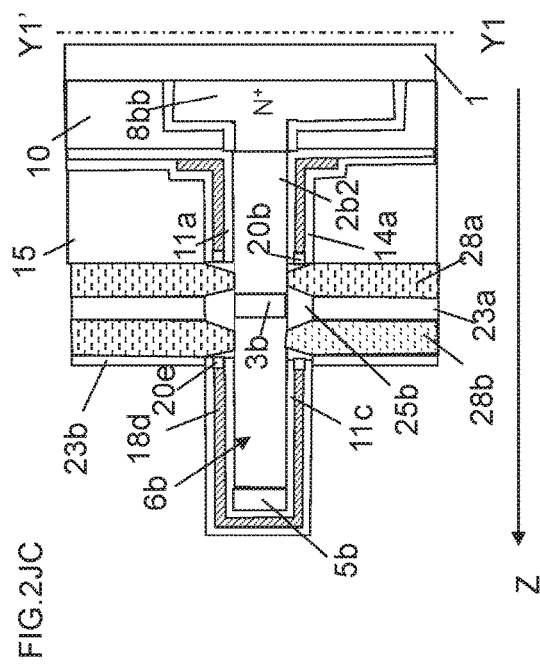
FIGS. 2JA to 2JD are a plan view and sectional structural views that illustrate a method for producing an SGT-including pillar-shaped semiconductor device according to a first embodiment.
Figure 2J:
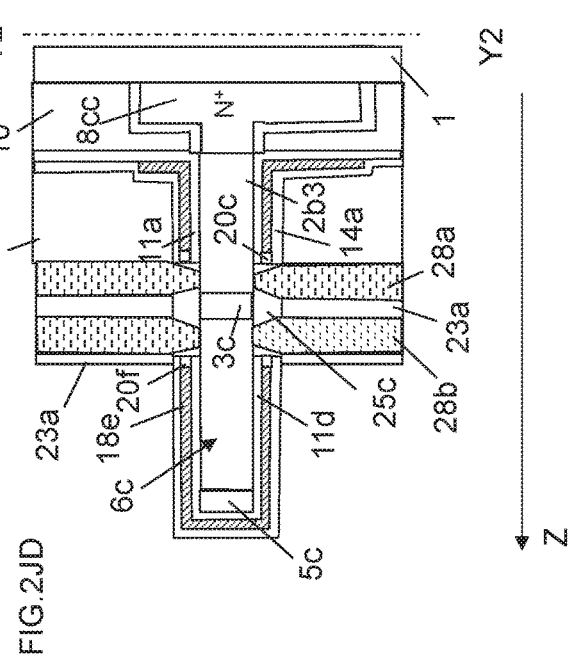
Figure 2J:
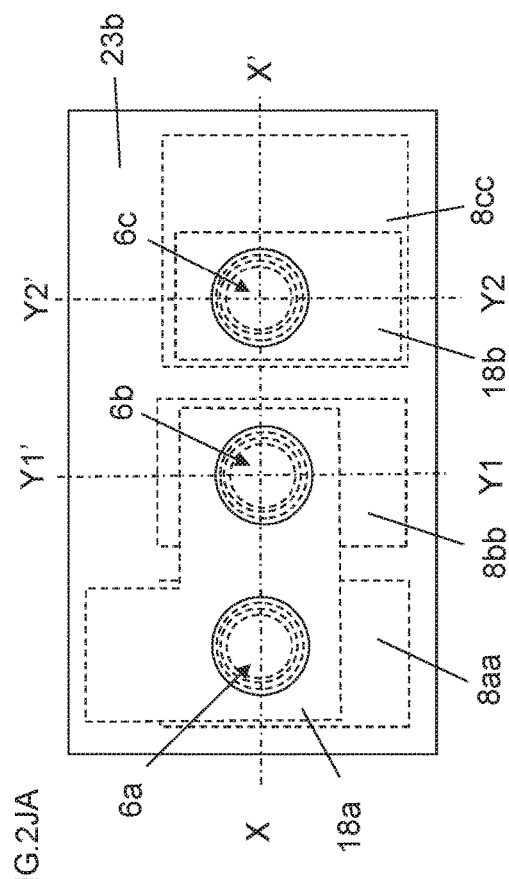
Figure 2J:
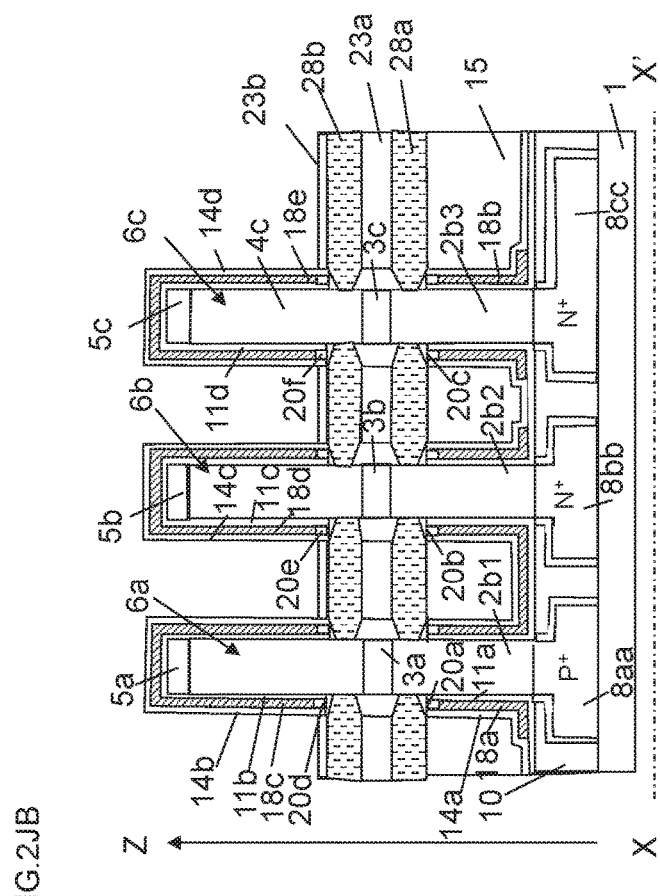

Subsequently, as illustrated in FIGS. 2JA to 2JD, for example, a heat treatment at 550° C. is carried out, so that Ni atoms in the Ni layers 21a and 21b are diffused into the P-type poly-Si layers 22a and 22b and the N$^+$-type poly-Si layers 26a and 26b, to thereby form nickel silicide (NiSi) layers 28a and 28b. The NiSi layers 28a and 28b have volumes expanded from the volumes of the P-type poly-Si layers 22a and 22b and the N$^+$-type poly-Si layers 26a and 26b (regarding this expansion in the volumes, refer to T. Morimoto, T. Ohguro, H. Sasaki, M. S. Momose, T. Iinuma, I. Kunishima, K. Suguro, I. Katakabe, H. Nakajima, M. Tsuchiaki, M. Ono, Y. Katsumata, and H. Iwai: "Self-Aligned Nickel-Mono-Silicide Technology for High-Speed Deep Submicrometer Logic CMOS ULSI" IEEE Transaction on Electron Devices, Vol. 42, No. 5, pp. 915-922 (1995)). Since the P-type poly-Si layers 22a and 22b and the N$^+$-type poly-Si layers 26a and 26b are held between the SiN layer 15 and the SiO$_2$ layers 23a and 23b, the NiSi layers 28a and 28b mainly protrude into the spaces 25a, 25b, and 25c. The As atoms contained in the N$^+$-type poly-Si layers 26a and 26b and the B atoms contained in the P-type poly-Si layers 22a and 22b are pushed outward in the NiSi layers 28a and 28b (regarding this push-out phenomenon, refer to T. Morimoto, T. Ohguro, H. Sasaki, M. S. Momose, T. Iinuma, I. Kunishima, K. Suguro, I. Katakabe, H. Nakajima, M. Tsuchiaki, M. Ono, Y. Katsumata, and H. Iwai: "Self-Aligned Nickel-Mono-Silicide Technology for High-Speed Deep Submicrometer Logic CMOS ULSI" IEEE Transaction on Electron Devices, Vol. 42, No. 5, pp. 915-922 (1995)). As a result of this impurity-atom push-out effect, protrusions (not shown) having high contents of impurity atoms are formed in the surface layers of the sides of the NiSi layers 28a and 28b, which protrude into the spaces 25a, 25b, and 25c. The side surfaces of the protrusions are in contact with the surfaces of the Si pillars 6a, 6b, and 6c.

Figure 2K:
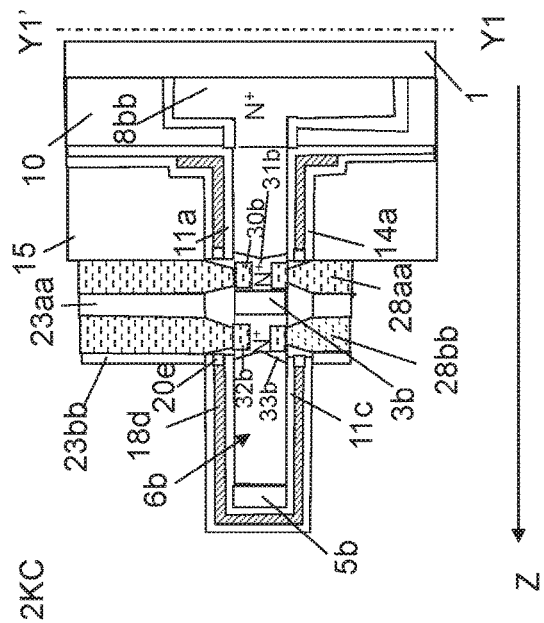
FIGS. 2KA to 2KD are a plan view and sectional structural views that illustrate a method for producing an SGT-including pillar-shaped semiconductor device according to a first embodiment.
Figure 2K:
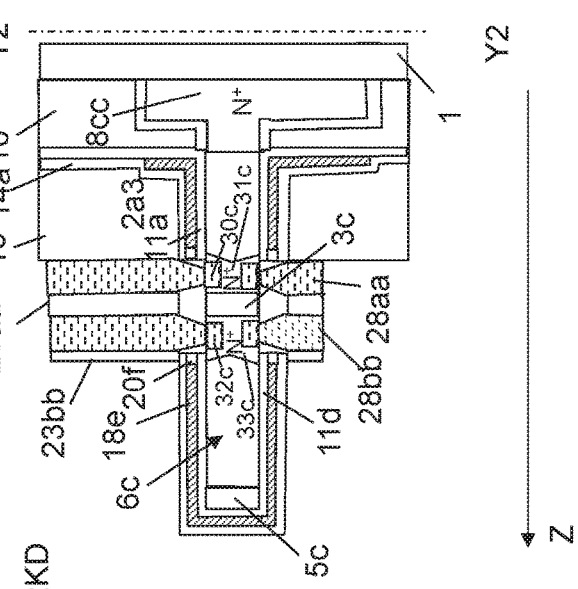
Figure 2K:
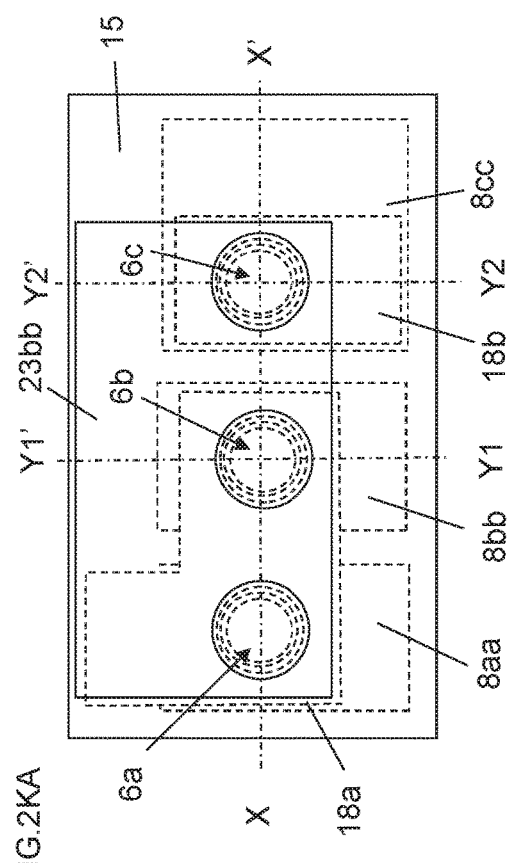
Figure 2K:
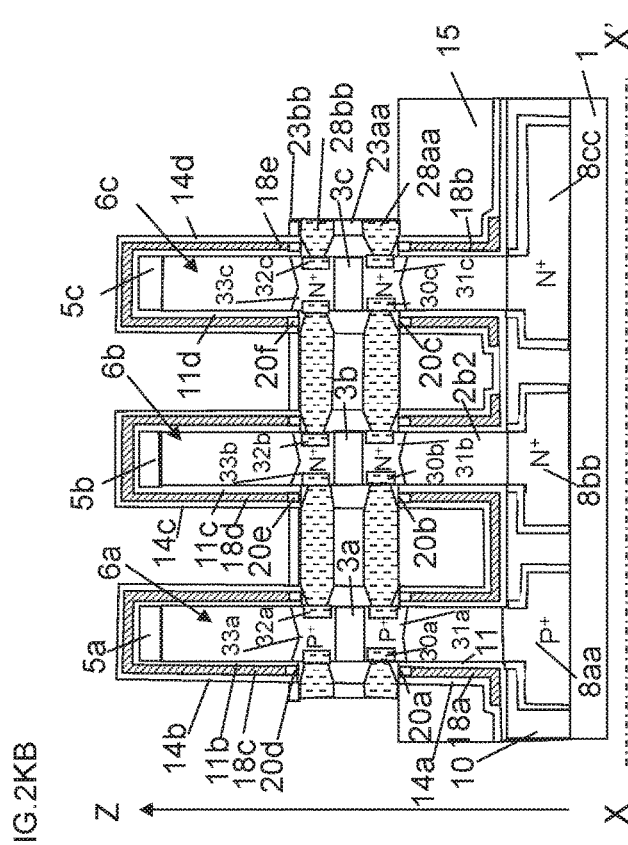

Subsequently, as illustrated in FIGS. 2KA to 2KD, a heat treatment is carried out to cause silicide expansion of the NiSi layers 28a and 28b, and to diffuse, by the impurity push-out effect, from the protrusions, As atoms and B atoms into the Si pillars 6a, 6b, and 6c. As a result, NiSi layers 30a, 30b, and 30c are respectively formed in the surface layers of the sides of the Si pillars 6a, 6b, and 6c in contact with the NiSi layer 28a; and B atoms and As atoms are diffused, by the impurity push-out effect, into the Si pillars 6a, 6b, and 6c, to thereby form a P$^+$ layer 31a and N$^+$ layers 31b and 31c respectively within the Si pillars 6a, 6b, and 6c. Similarly, NiSi layers 32a, 32b, and 32c are respectively formed in the surface layers of the sides of the Si pillars 6a, 6b, and 6c in contact with the NiSi layer 28b; and B atoms and As atoms are diffused, by the impurity push-out effect, into the Si pillars 6a, 6b, and 6c, to thereby respectively form a P$^+$ layer 33a and N$^+$ layers 33b and 33c within the Si pillars 6a, 6b, and 6c. In the SiO$_2$ layers 3a, 3b, and 3c, thermal diffusion of donor and acceptor impurity atoms is suppressed and simultaneously formation of silicide is suppressed. As a result, the P$^+$ layer 31a and the N$^+$ layers 31b and 31c are isolated from the P$^+$ layer 33a and the N$^+$ layers 33b and 33c by the SiO$_2$ layers 3a, 3b, and 3c. Subsequently, a lithographic process and an RIE process are carried out to pattern the NiSi layers 28a and 28b and the SiO$_2$ layers 23a and 23b so as to remain in the outer peripheral portions around the Si pillars 6a, 6b, and 6c. As a result, NiSi layers 28aa and 28bb and SiO$_2$ layers 23aa and 23bb are formed.

Figure 2L:
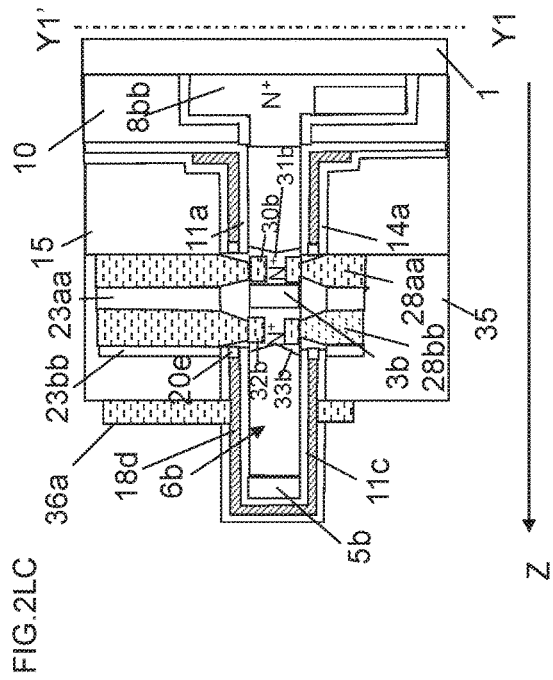
FIGS. 2LA to 2LD are a plan view and sectional structural views that illustrate a method for producing an SGT-including pillar-shaped semiconductor device according to a first embodiment.
Figure 2L:
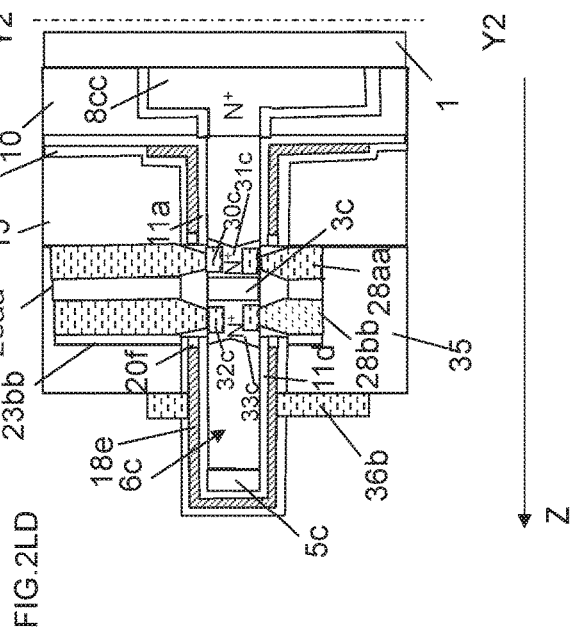
Figure 2L:
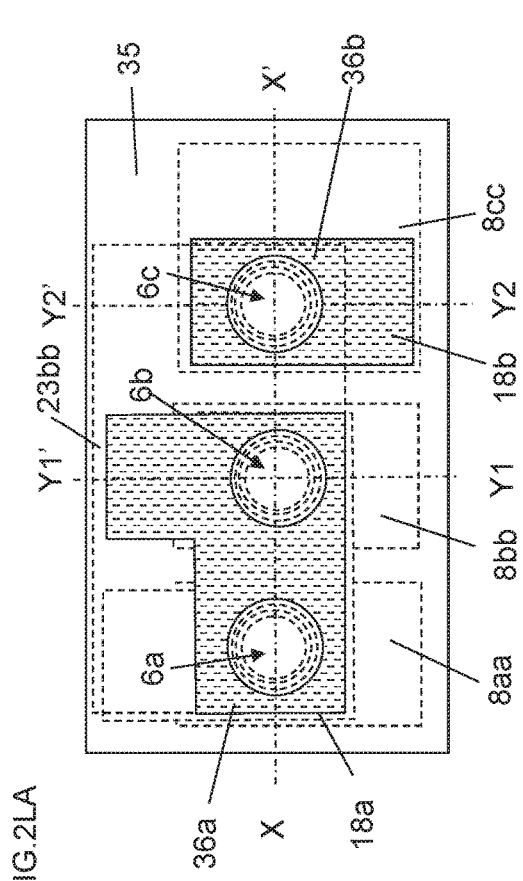
Figure 2L:
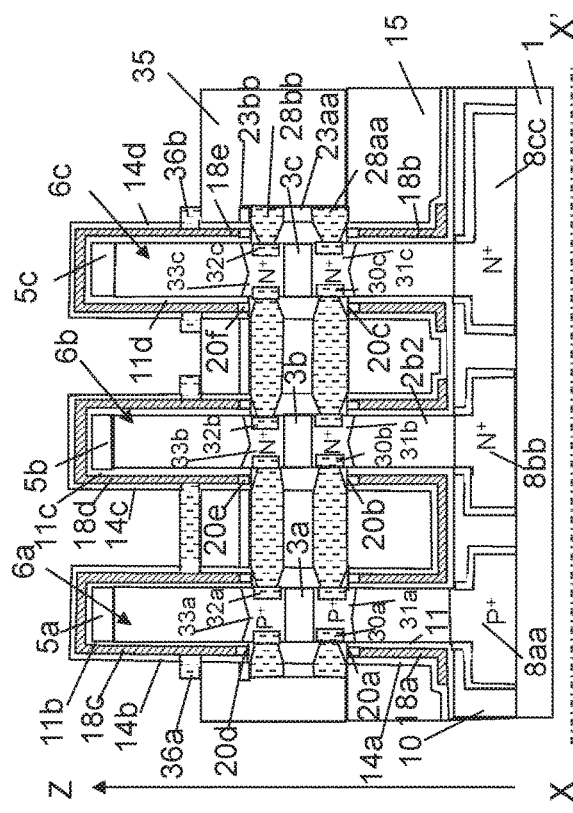

Subsequently, as illustrated in FIGS. 2LA to 2LD, the same process as in the formation of the SiN layer 15 is carried out to form a SiN layer 35 such that its upper surface is positioned in the middle of (in the height direction of) the TiN layers 18c, 18d, and 18e. Subsequently, the same process as in the formation of the spaces 25a, 25b, and 25c is carried out to form openings in the outer peripheries of the TiN layers 18c, 18d, and 18e. Subsequently, a NiSi layer 36a in contact with the TiN layers 18c and 18d, and a NiSi layer 36b in contact with the TiN layer 18e are formed.

Figure 2M:
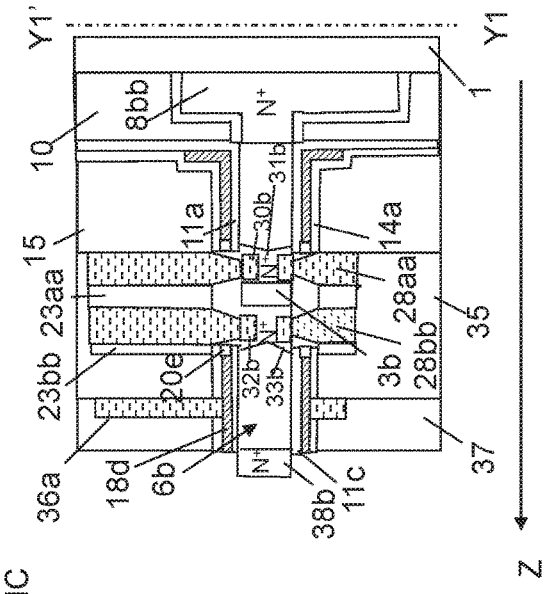
FIGS. 2MA to 2MD are a plan view and sectional structural views that illustrate a method for producing an SGT-including pillar-shaped semiconductor device according to a first embodiment.
Figure 2M:
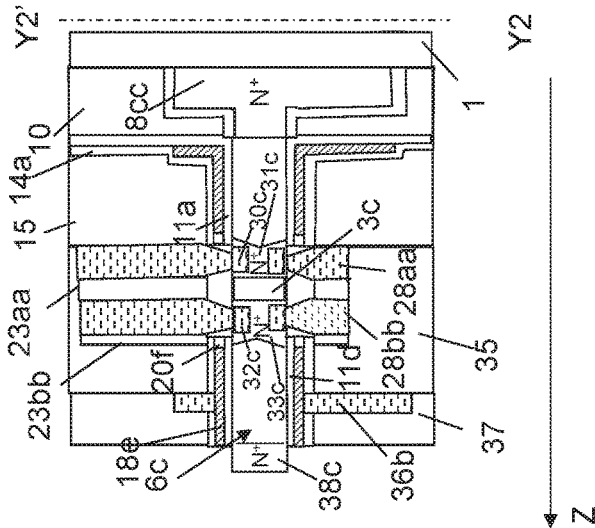
Figure 2M:
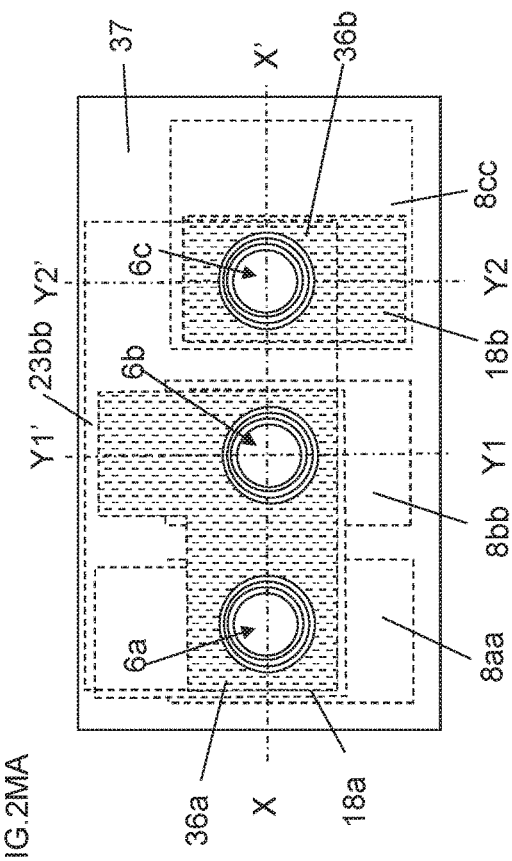
Figure 2M:
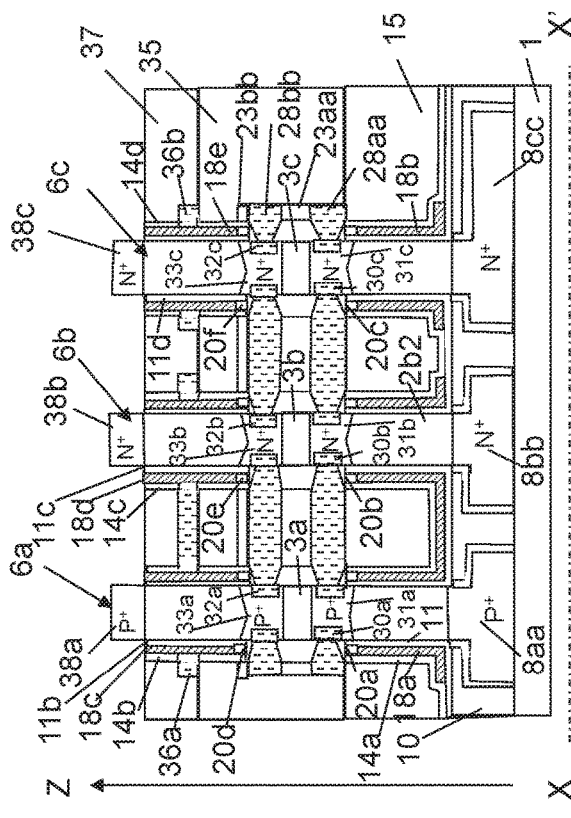

Subsequently, as illustrated in FIGS. 2MA to 2MD, a SiO$_2$ layer 37 is formed such that its upper surface is positioned higher than the surfaces of the NiSi layers 36a and 36b and lower than the top portions of the Si pillars 6a, 6b, and 6c. Subsequently, the SiO$_2$ layers 14b, 14c, and 14d, the TiN layers 18c, 18d, and 18e, and the HfO$_2$ layers 11b, 11c, and 11d in the top portions of the Si pillars 6a, 6b, and 6c are etched off through the SiO$_2$ layer 37 as a mask. Subsequently, a lithographic process and an ion implantation process are carried out with the SiO$_2$ layers 37, 14$b$, 14$c$, and 14$d$, the TiN layers 18$c$, 18$d$, and 18$e$, and the HfO$_2$ layers 11$b$, 11$c$, and 11$d$ as masks, such that boron (B) is ion-implanted into the top portion of the Si pillar 6$a$ to form a P$^+$ layer 38$a$, and arsenic (As) is ion-implanted into the top portions of the Si pillars 6$b$ and 6$c$ to form N$^+$ layers 38$b$ and 38$c$.

Figure 2N:
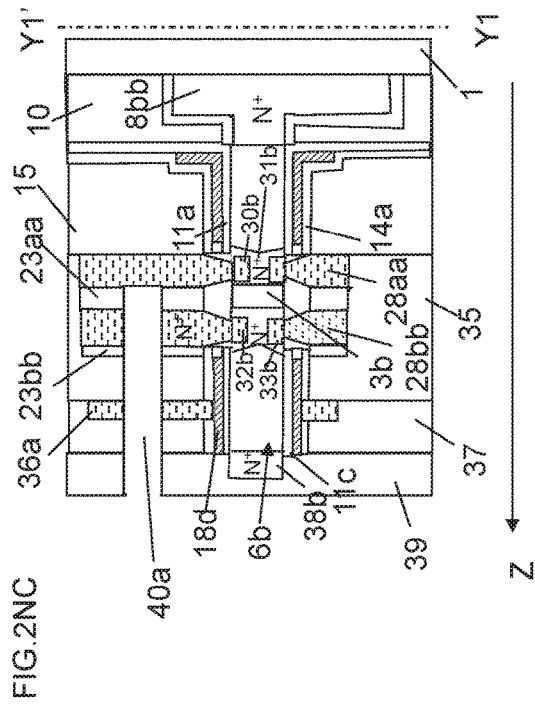
FIGS. 2NA to 2NE are a plan view and sectional structural views that illustrate a method for producing an SGT-including pillar-shaped semiconductor device according to a first embodiment.
Figure 2N:
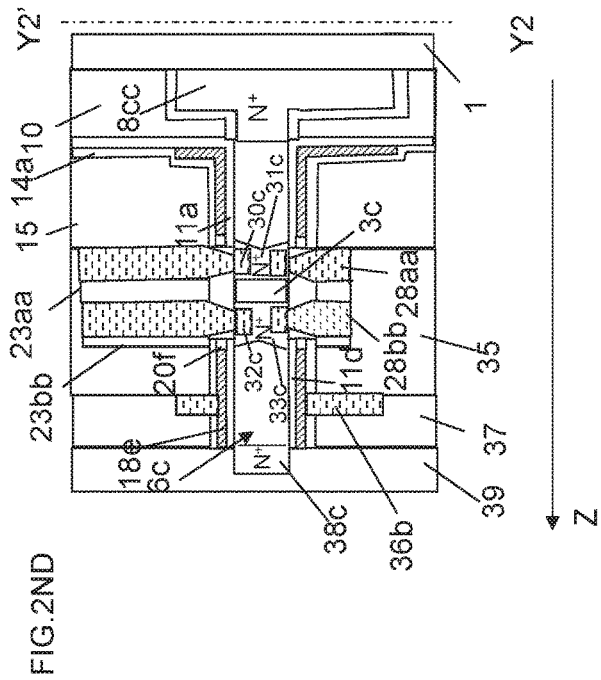
Figure 2N:
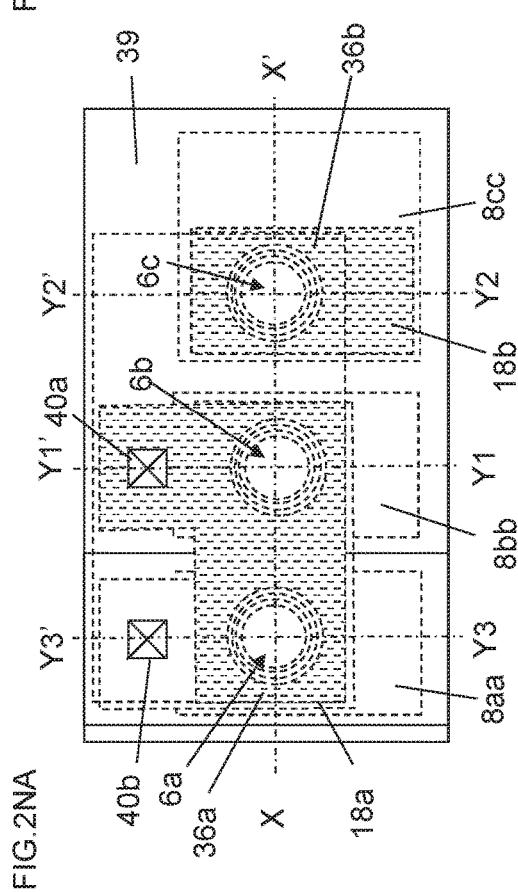
Figure 2N:
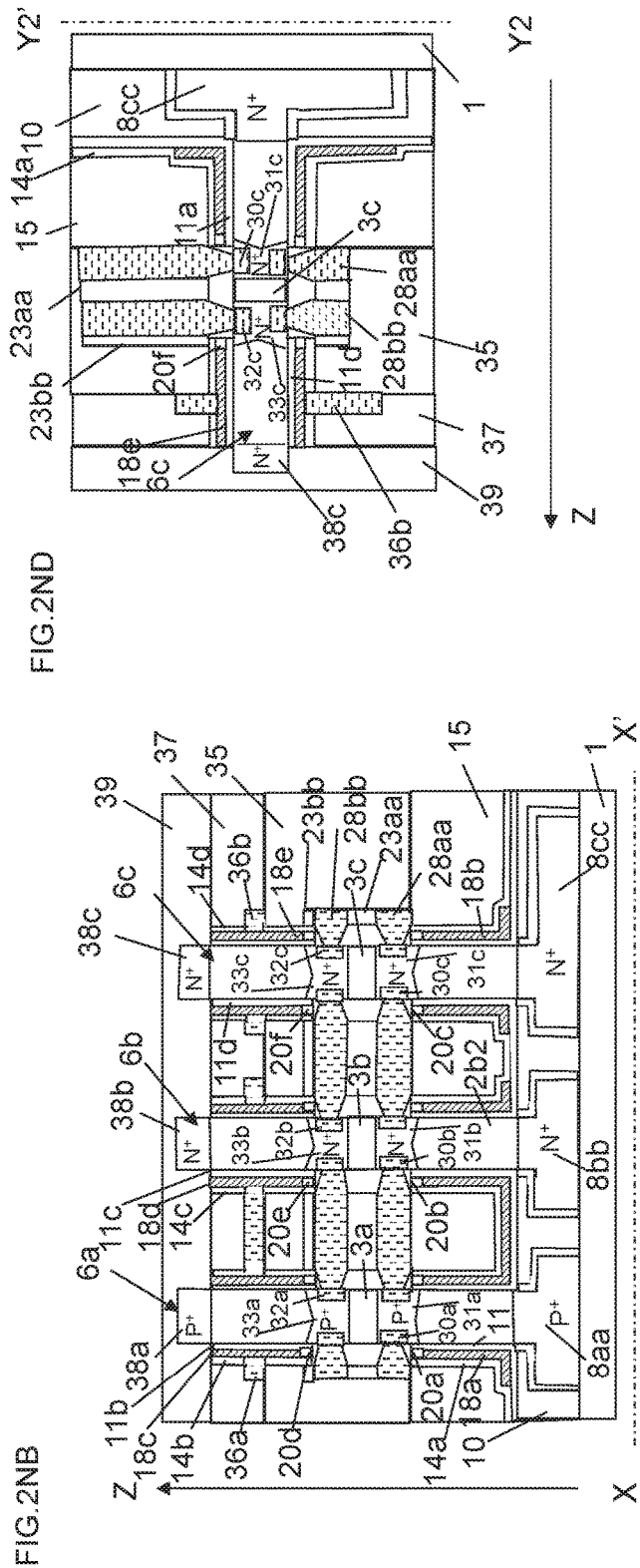
Figure 2N:
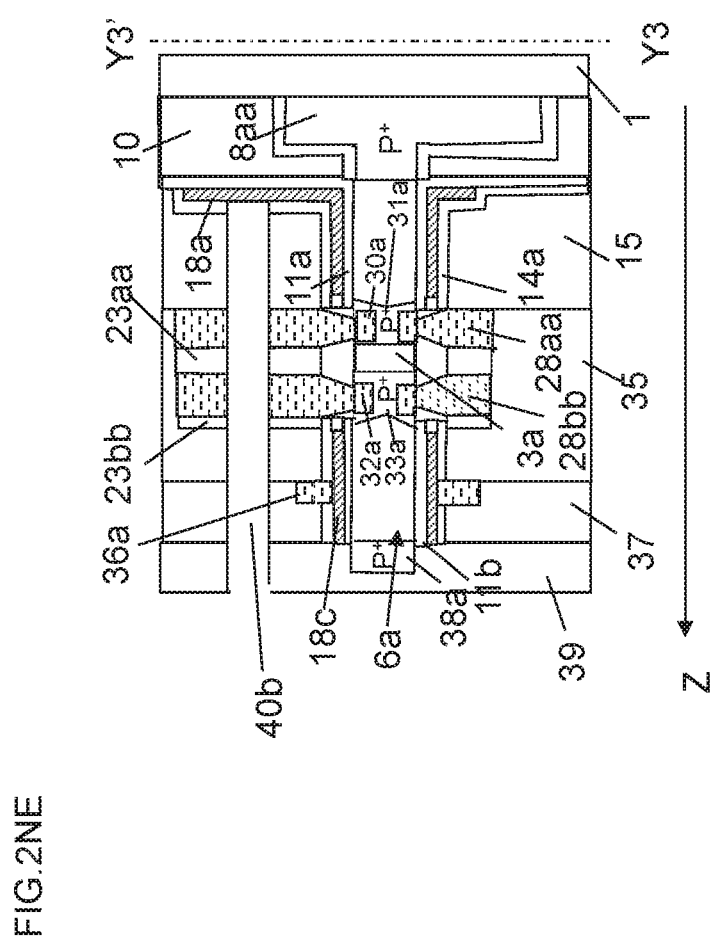

FIGS. 2NA to 2NE illustrate the following steps. Among FIG. 2NE to FIG. 2SE, figures suffixed with E are sectional structural views taken along lines Y3-Y3' in the corresponding figures suffixed with A. A SiO$_2$ layer 39 is formed over the entire structure by a CVD process and a MCP process. Subsequently, a lithographic process and an RIE process are carried out to form a contact hole 40$a$, which extends through the SiO$_2$ layers 39 and 37, the NiSi layer 36$a$, the SiN layer 35, the SiO$_2$ layer 23$bb$, the NiSi layer 28$bb$, and the SiO$_2$ layer 23$aa$ to the NiSi layer 28$aa$. Similarly, a lithographic process and an RIE process are carried out to form a contact hole 40$b$, which extends through the SiO$_2$ layers 39, 37, and 23$aa$, the SiN layer 35, the SiO$_2$ layer 23$bb$, the NiSi layer 28$bb$, the SiO$_2$ layer 23$aa$, the SiN layer 15, and the SiO$_2$ layer 14$a$ to the TiN layer 18$a$.

Figure 2O:
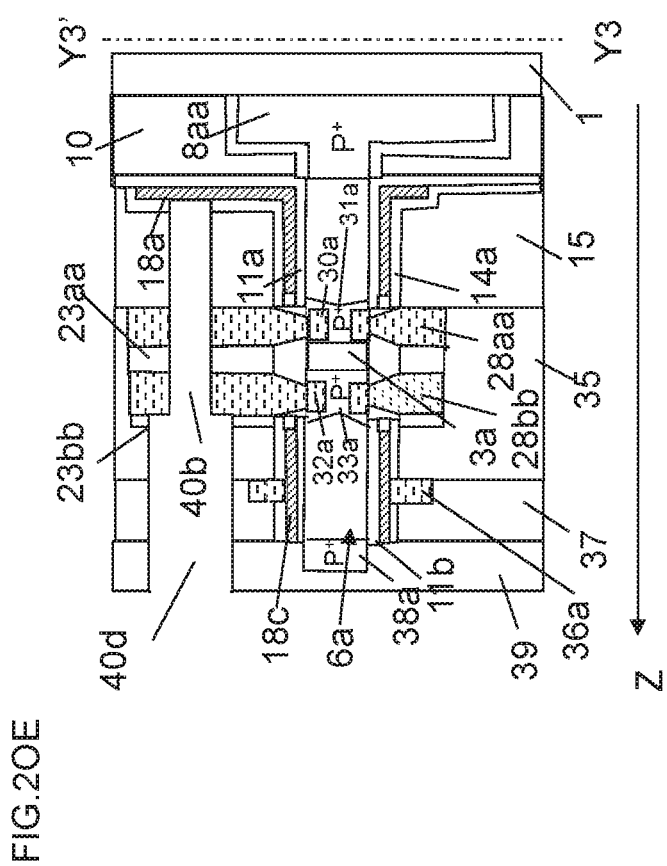
FIGS. 2OA to 2OE are a plan view and sectional structural views that illustrate a method for producing an SGT-including pillar-shaped semiconductor device according to a first embodiment.

Subsequently, as illustrated in FIGS. 2OA to 2OE, a contact hole 40$c$ is formed so as to surround the contact hole 40$a$ in plan view, extend through the SiO$_2$ layers 39 and 37 to the NiSi layer 36$a$, and connect to the contact hole 40$a$. Similarly, a contact hole 40$d$ is formed so as to surround the contact hole 40$b$ in plan view, extend through the SiO$_2$ layers 39 and 37, the SiN layer 35, and the SiO$_2$ layer 23$bb$ to the NiSi layer 28$bb$, and connect to the contact hole 40$b$.

Figure 2P:
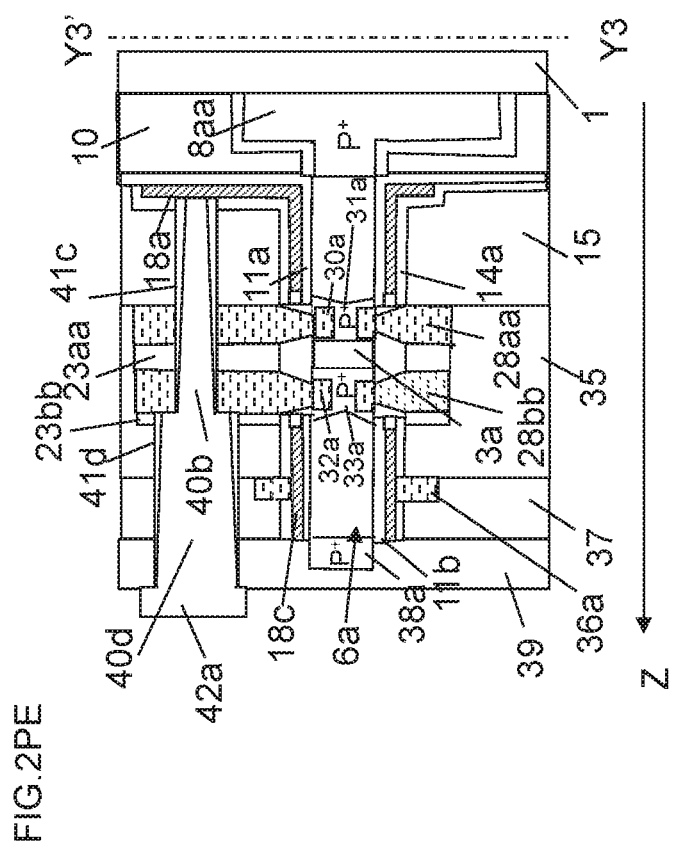
FIGS. 2PA to 2PE are a plan view and sectional structural views that illustrate a method for producing an SGT-including pillar-shaped semiconductor device according to a first embodiment.

Subsequently, as illustrated in FIGS. 2PA to 2PE, an ALD process is carried out to deposit, for example, a SiO$_2$ film (not shown) over the entire structure; and subsequently an RIE process is carried out to etch the entire structure such that the SiO$_2$ film on the NiSi layer 28$aa$ at the bottom of the contact hole 40$a$ and on the NiSi layer 36$a$ at the bottom of the contact hole 40$b$ is removed while a SiO$_2$ layer 41$a$ is left on the inner side surface of the contact hole 40$a$ and a SiO$_2$ layer 41$b$ is similarly left on the inner side surface of the contact hole 40$b$. Similarly, the SiO$_2$ film on the TiN layer 18$a$ at the bottom of the contact hole 40$b$ and on the NiSi layer 28$bb$ at the bottom of the contact hole 40$d$ is removed while a SiO$_2$ layer 41$c$ is left on the inner side surface of the contact hole 40$b$ and a SiO$_2$ layer 41$d$ is similarly left on the inner side surface of the contact hole 40$d$. Subsequently, a wiring metal layer 42$b$, which connects the NiSi layers 28$aa$ and 36$a$ to each other through the contact holes 40$a$ and 40$c$, is formed; and a wiring metal layer 42$a$, which connects the TiN layer 18$a$ and the NiSi layer 28$bb$ to each other through the contact holes 40$b$ and 40$d$, is formed. As a result, the wiring metal layer 42$b$ and the NiSi layer 28$bb$ are insulated from each other by the SiO$_2$ layer 41$a$. Similarly, the wiring metal layer 42$a$ and the NiSi layer 28$aa$ are insulated from each other by the SiO$_2$ layer 41$c$.

Subsequently, as illustrated in FIGS. 2QA to 2QE, a SiO$_2$ layer 44 is formed over the whole structure. Subsequently, a contact hole 45$a$ is formed so as to extend through the SiO$_2$ layers 44 and 39 to the P$^+$ layer 38$a$, which is in the top portion of the Si pillar 6$a$; a contact hole 45$b$ is formed so as to extend to the N$^+$ layer 38$b$, which is in the top portion of the Si pillar 6$b$; a contact hole 45$c$ is formed so as to extend to the P$^+$ layer 8$aa$; and a contact hole 45$d$ is formed so as to extend to the N$^+$ layer 8$bb$. Subsequently, a power supply wiring metal layer VDD is formed so as to connect to the P$^+$ layers 38$a$ and Baa via the contact holes 45$a$ and 45$c$ and so as to extend along line Y3-Y3' in plan view. In addition, a ground wiring metal layer VSS is formed so as to connect to the N$^+$ layers 38$b$ and 8$bb$ via the contact holes 45$b$ and 45$d$ and so as to extend along line Y1-Y1' in plan view.

Figure 2R:
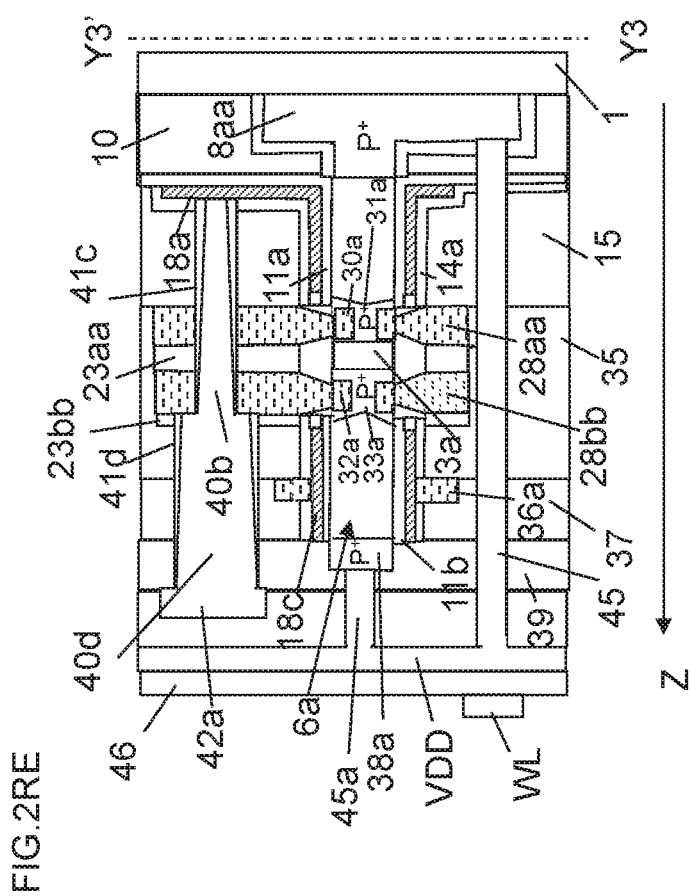
FIGS. 2RA to 2RE are a plan view and sectional structural views that illustrate a method for producing an SGT-including pillar-shaped semiconductor device according to a first embodiment.

Subsequently, as illustrated in FIGS. 2RA to 2RE, a SiO$_2$ layer 46 is formed over the whole structure. Subsequently, a contact hole 47 is formed so as to extend through the SiO$_2$ layers 46, 44, 39, and 37, the NiSi layer 36$b$, the SiN layers 35 and 15, and the SiO$_2$ layer 14$a$ to the TiN layer 18$b$. Subsequently, a word line wiring metal layer WL is formed so as to connect the TiN layer 18$b$ and the NiSi layer 36$b$ to each other via the contact hole 47 and so as to extend along line X-X'.

Figure 2S:
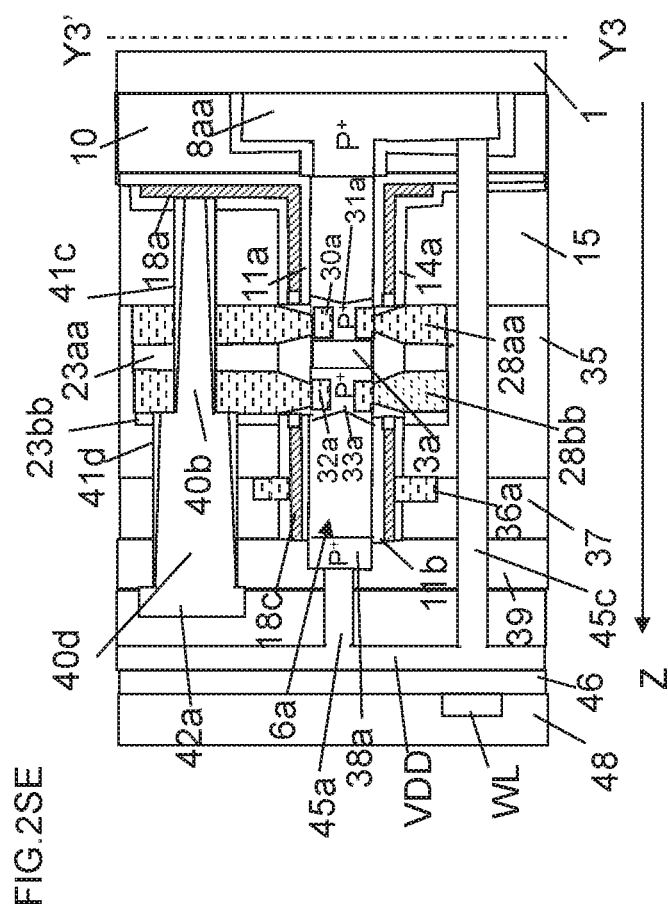
FIGS. 2SA to 2SE are a plan view and sectional structural views that illustrate a method for producing an SGT-including pillar-shaped semiconductor device according to a first embodiment.

Subsequently, as illustrated in FIGS. 2SA to 2SE, a SiO$_2$ layer 48 is formed over the whole structure. Subsequently, a contact hole 49$a$ is formed so as to extend through the SiO$_2$ layers 48, 46, 44, and 39 to the N$^+$ layer 38$c$, which is in the top portion of the Si pillar 6$c$; and a contact hole 49$b$ is formed so as to extend through the SiO$_2$ layers 48, 46, 44, 39, and 37, the SiN layers 35 and 15, the SiO$_2$ layer 14$a$, the HfO$_2$ layer 11$a$, and the SiO$_2$ layers 10 and 7$c$ to the N$^+$ layer 8$cc$. Subsequently, a bit line wiring metal layer BL is formed so as to connect via the contact hole 49$a$ to the N$^+$ layer 38$c$ and so as to extend along line Y2-Y2' in plan view; and an inverted bit line wiring metal layer BLR is formed so as to connect via the contact hole 49$b$ to the N$^+$ layer 8$cc$ and so as to extend along the bit line wiring metal layer BL in plan view.

As illustrated in FIGS. 2SA to 2SE, in an upper portion of the Si pillar 6$a$, an SGT (corresponding to the P-channel SGT Pc1 in FIG. 1B) is formed that includes the P+ layers 33$a$ and 38$a$ as the drain and the source, includes the TiN layer 18$c$ as the gate, and includes, as the channel, a region between the P$^+$ layers 33$a$ and 38$a$ in the Si pillar 6$a$; and, in a lower portion of the Si pillar 6$a$, an SGT (corresponding to the P-channel SGT Pc2 in FIG. 1B) is formed that includes the P$^+$ layers Baa and 31$a$ as the source and the drain, includes the TiN layer 18$a$ as the gate, and includes, as the channel, a region between the P$^+$ layers Baa and 31$a$ in the Si pillar 6$a$.

In addition, in an upper portion of the Si pillar 6$b$, an SGT (corresponding to the N-channel SGT Nc1 in FIG. 1B) is formed that includes the N$^+$ layers 38$b$ and 33$b$ as the source and the drain, includes the TiN layer 18$d$ as the gate, and includes, as the channel, a region between the N$^+$ layers 38$b$ and 33$b$ in the Si pillar 6$b$; and, in a lower portion of the Si pillar 6$b$, an SGT (corresponding to the N-channel SGT Nc2 in FIG. 1B) is formed that includes the N$^+$ layers 8$bb$ and 31$b$ as the source and the drain, includes the TiN layer 18$a$ as the gate, and includes, as the channel, a region between the N$^+$ layers 8$bb$ and 31$b$ in the Si pillar 6$a$.

In addition, in an upper portion of the Si pillar 6$c$, an SGT (corresponding to the N-channel SGT SN1 in FIG. 1B) is formed that includes the N$^+$ layers 38$c$ and 33$c$ as the source and the drain, includes the TiN layer 18$e$ as the gate, and includes, as the channel, a region between the N$^+$ layers 38$c$ and 33$c$ in the Si pillar 6$c$; and, in a lower portion of the Si pillar 6$c$, an SGT (corresponding to the N-channel SGT Nc2 in FIG. 1B) is formed that includes the N$^+$ layers 8$cc$ and 31$c$ as the source and the drain, includes the TiN layer 18$b$ as the gate, and includes, as the channel, a region between the N$^+$ layers 8$cc$ and 31$c$ in the Si pillar 6$c$.

These SGTs (corresponding to the SGTs Pc1, Pc2, Nc1, Nc2, SN1, and SN2 in FIG. 1B) are connected together via wires to thereby provide an SRAM cell circuit constituted by, as in the schematic structural view in FIG. 1B, a circuit area (corresponding to the circuit area C1 in FIG. 1B) including, in upper portions of the Si pillars 6$a$, 6$b$, and 6$c$, a P-channel SGT (corresponding to the P-channel SGT Pc1 in FIG. 1B) and N-channel SGTs (corresponding to the N-channel SGTs Nc1 and SN1 in FIG. 1B), and a circuit area (corresponding to the circuit area C2 in FIG. 1B) including, in lower portions of the Si pillars 6a, 6b, and 6c, a P-channel SGT (corresponding to the P-channel SGT Pc2 in FIG. 1B) and N-channel SGTs (corresponding to the N-channel SGTs Nc2 and SN2 in FIG. 1B).

The production method according to the first embodiment provides the following advantages.

1. The SiO$_2$ layer 41a is formed on a side surface (in the contact hole 40a) of the NiSi layer 28bb. As a result, although the NiSi layers 28aa, 28bb, and 36a overlap in plan view, the contact hole 40a extending through these layers enables insulation between the wiring metal layer 42b and the NiSi layer 28bb, and connection between the NiSi layer 28aa and the NiSi layer 36a. This enables a reduction in the area of the SRAM cell.

Similarly, the SiO$_2$ layer 41c is formed on a side surface (in the contact hole 40b) of the NiSi layer 28aa. As a result, although the TiN layer 18a and the NiSi layers 28aa and 28bb overlap in plan view, the contact hole 40b extending through these layers enables insulation between the wiring metal layer 42d and the NiSi layer 28aa, and connection between the TiN layer 18a and the NiSi layer 28bb. This enables a reduction in the area of the SRAM cell.

2. In the structure including layers overlapping in plan view that are the NiSi layer 28aa as a lower wiring conductor layer, the NiSi layer 28bb as an intermediate wiring conductor layer, and the NiSi layer 36a as an upper wiring conductor layer, the contact hole 40a is formed so as to extend through the NiSi layers 28bb and 36a to the NiSi layer 28aa, and the contact hole 40c is formed so as to surround the contact hole 40a in plan view and extend to the NiSi layer 36a. The SiO$_2$ layer 41a, which is formed on the inner side surface of the contact hole 40a, enables insulation between the wiring metal layer 42b and the NiSi layer 28bb; the upper surface of the NiSi layer 28aa and the upper surface of the NiSi layer 36a are connected to the wiring metal layer 42a. This enables a high-density wiring of the NiSi layer 28aa and the NiSi layer 36a.

Similarly, in the structure including layers overlapping in plan view that are the TiN layer 18a as a lower wiring conductor layer, the NiSi layer 28aa as an intermediate wiring conductor layer, and the NiSi layer 28bb as an upper wiring conductor layer, the contact hole 40b is formed so as to extend through the NiSi layers 28aa and 28bb to the TiN layer 18a, and the contact hole 40d is formed so as to surround the contact hole 40b in plan view and extend to the NiSi layer 28bb. The SiO$_2$ layer 41c, which is formed on the inner side surface of the contact hole 40b, enables insulation between the wiring metal layer 42a and the NiSi layer 28aa; the upper surface of the TiN layer 18a and the upper surface of the NiSi layer 28bb are connected to the wiring metal layer 42a. This enables a high-density wiring of the TiN layer 18a and the NiSi layer 28bb.

In summary, the SRAM cell circuit area according to this embodiment includes, in plan view, three Si pillars 6a, 6b, and 6c, and nine contact holes 40c (the contact holes 40c and 40a are formed so as to overlap), 40d (the contact holes 40d and 40b are formed so as to overlap), 45a, 45b, 45c, 45d, 47, 49a, and 49b. In general, when a single SGT is formed per semiconductor pillar, it is necessary to form at least three contacts (connections via contact holes) from the source, the drain, and the gate to wiring metal layers. By contrast, in this embodiment, although two SGTs are formed per semiconductor pillar (Si pillar), the SRAM cell circuit is provided with three contacts per semiconductor pillar. This enables a high-density SGT-including SRAM cell circuit. Therefore, in a circuit including pillar-shaped semiconductors such as SGTs, when wiring conductor layers connecting to nodes such as the source, the drain, and the gate are formed so as to overlap in plan view and a wiring conductor layer that needs to be insulated is present between wiring conductor layers that are connected to each other, the connection between wiring conductor layers according to this embodiment enables an increase in the density of the circuit.

Second Embodiment

Hereinafter, with reference to FIG. 3AA to FIG. 3EE, a method for producing an SGT-including pillar-shaped semiconductor device according to a second embodiment of the present invention will be described. Among FIG. 3AA to FIG. 3EE, figures suffixed with A are plan views; figures suffixed with B are sectional structural views taken along lines X-X' in the corresponding figures suffixed with A; figures suffixed with C are sectional structural views taken along lines Y1-Y1' in the corresponding figures suffixed with A; figures suffixed with D are sectional structural views taken along lines Y2-Y2' in the corresponding figures suffixed with A; and figures suffixed with E are sectional structural views taken along lines Y3-Y3' in the corresponding figures suffixed with A. The production method according to the second embodiment is the same as in the steps according to the first embodiment in FIGS. 2AA to 2SE except for the following differences.

Figure 3A:
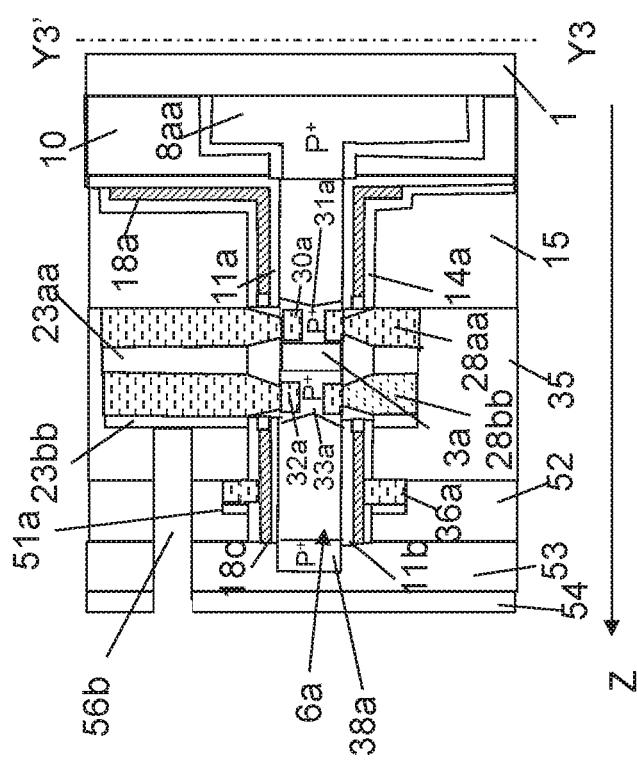
FIGS. 3AA to 3AE are a plan view and sectional structural views that illustrate a method for producing an SGT-including pillar-shaped semiconductor device according to a second embodiment of the present invention.

The same steps as in FIG. 2AA to FIG. 2MD are basically carried out prior to the step illustrated in FIGS. 3AA to 3AE. However, as the interlayer insulating layers, instead of the SiO$_2$ layers 37 and 39, SiN layers 52 and 53 are formed. A SiO$_2$ layer 51a is formed so as to overlap the NiSi layer 36a. Similarly, a SiO$_2$ layer 51b is formed so as to overlap the NiSi layer 36b. As illustrated in FIGS. 3AA to 3AE, a lithographic process and an RIE process are carried out with a resist layer 54 as a mask, to form a contact hole 56a so as to extend through the SiN layers 52 and 53 to the SiO$_2$ layer 51a. Similarly, a contact hole 56b is formed so as to extend through the SiN layers 53, 52, and 35 to the SiO$_2$ layer 23bb.

Figure 3B:
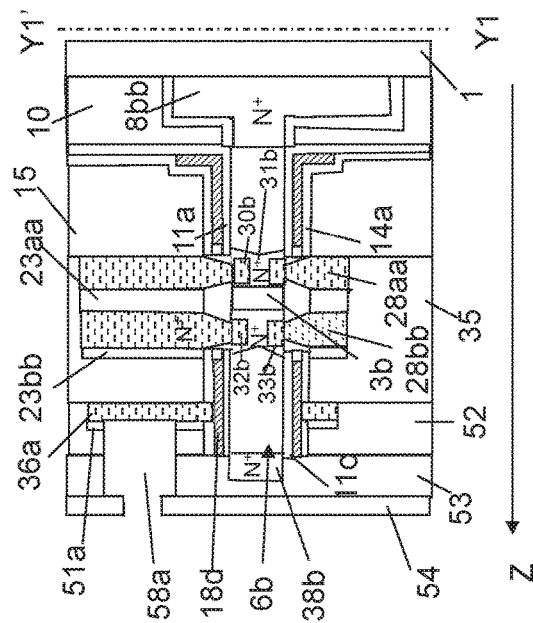
FIGS. 3BA to 3BE are a plan view and sectional structural views that illustrate a method for producing an SGT-including pillar-shaped semiconductor device according to a second embodiment.
Figure 3B:
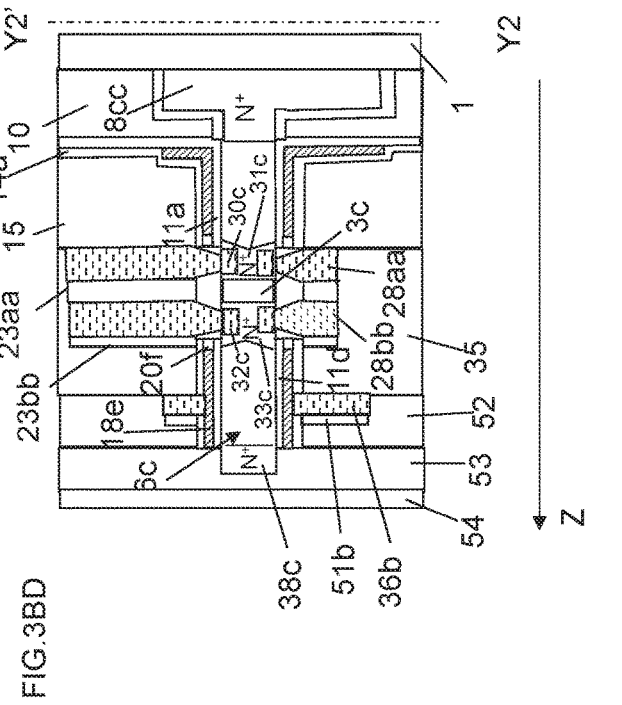
Figure 3B:
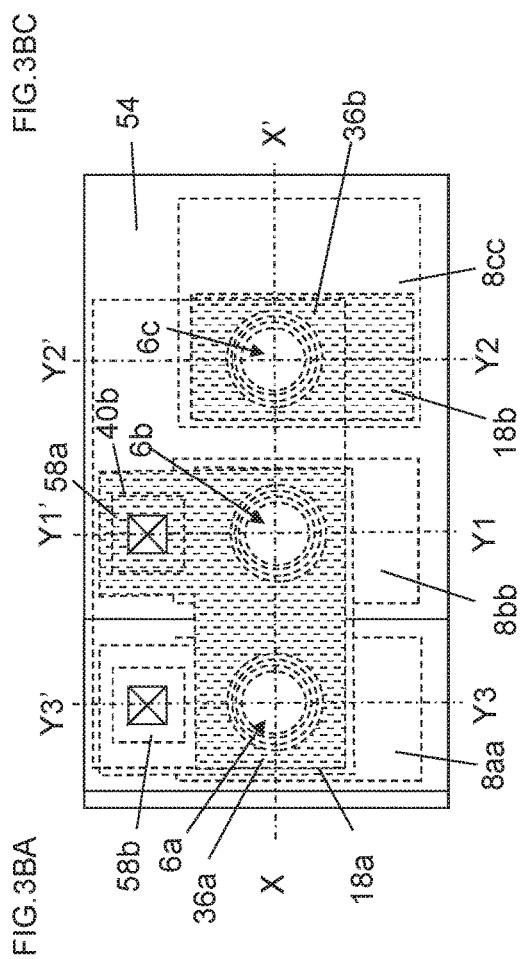
Figure 3B:
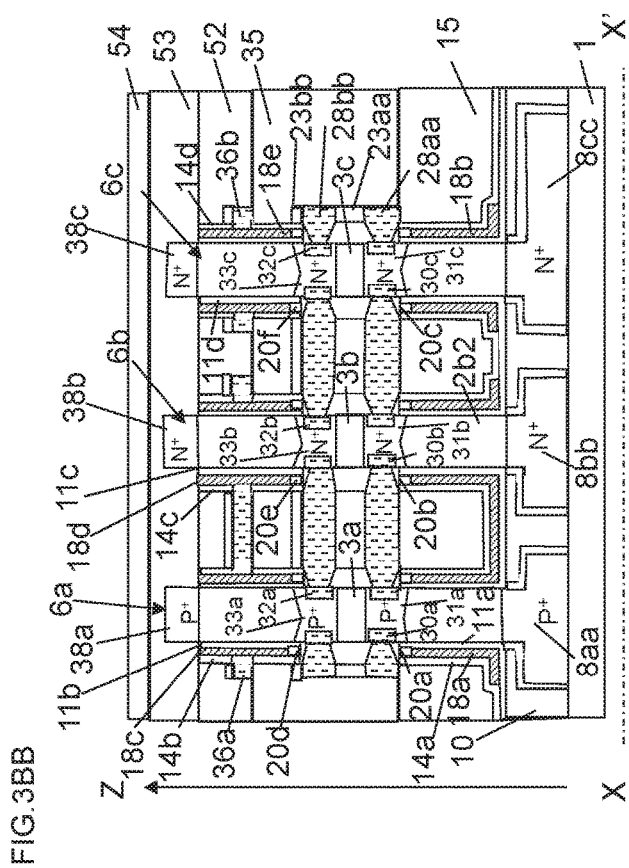
Figure 3B:
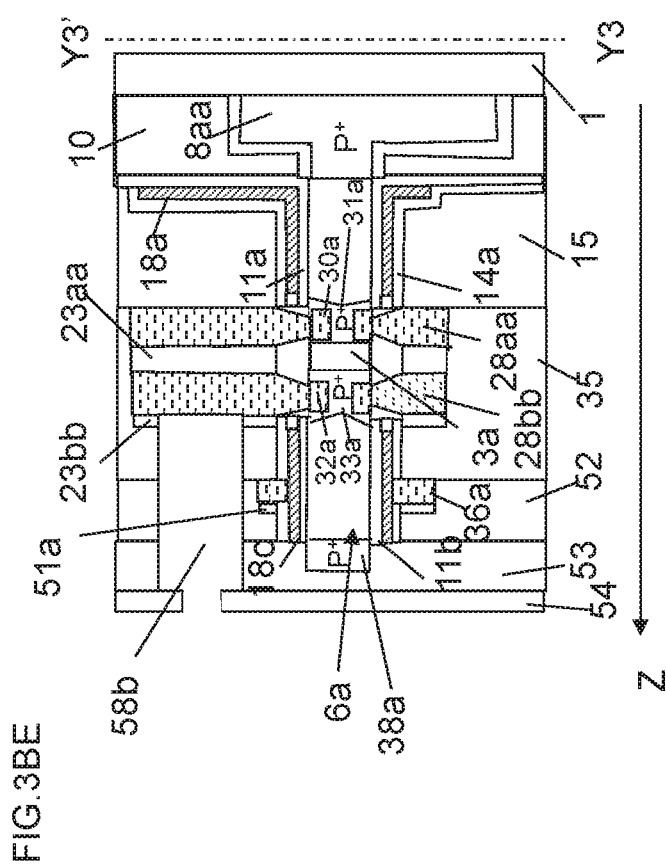

Subsequently, as illustrated in FIGS. 3BA to 3BE, the SiN layers 52 and 53 are subjected to plasma isotropic etching with the resist layer 54 as a mask, to expand the contact hole 56a. Subsequently, the SiO$_2$ layer 51a is etched to form a contact hole 58a. Similarly, the SiN layers 35, 52, and 53 are subjected to plasma isotropic etching with the resist layer 54 as a mask, to expand the contact hole 56b. Subsequently, the SiO$_2$ layer 23bb is etched to form a contact hole 58b.

Figure 3C:
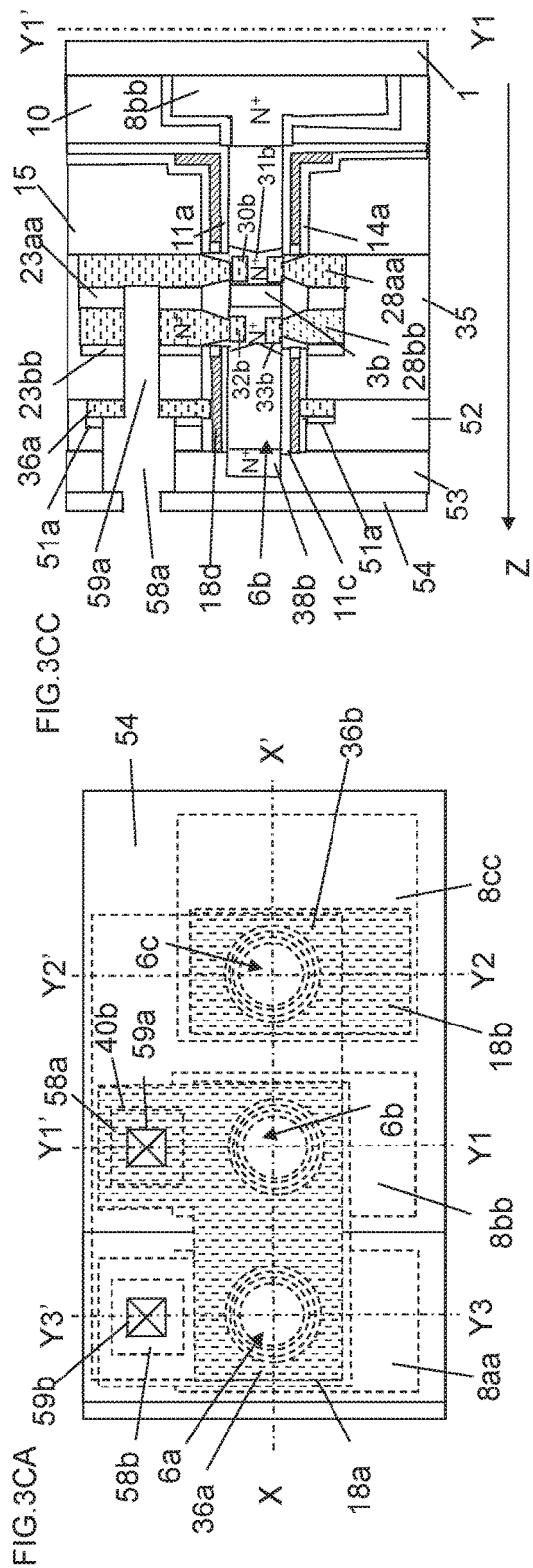
FIGS. 3CA to 3CE are a plan view and sectional structural views that illustrate a method for producing an SGT-including pillar-shaped semiconductor device according to a second embodiment.
Figure 3C:
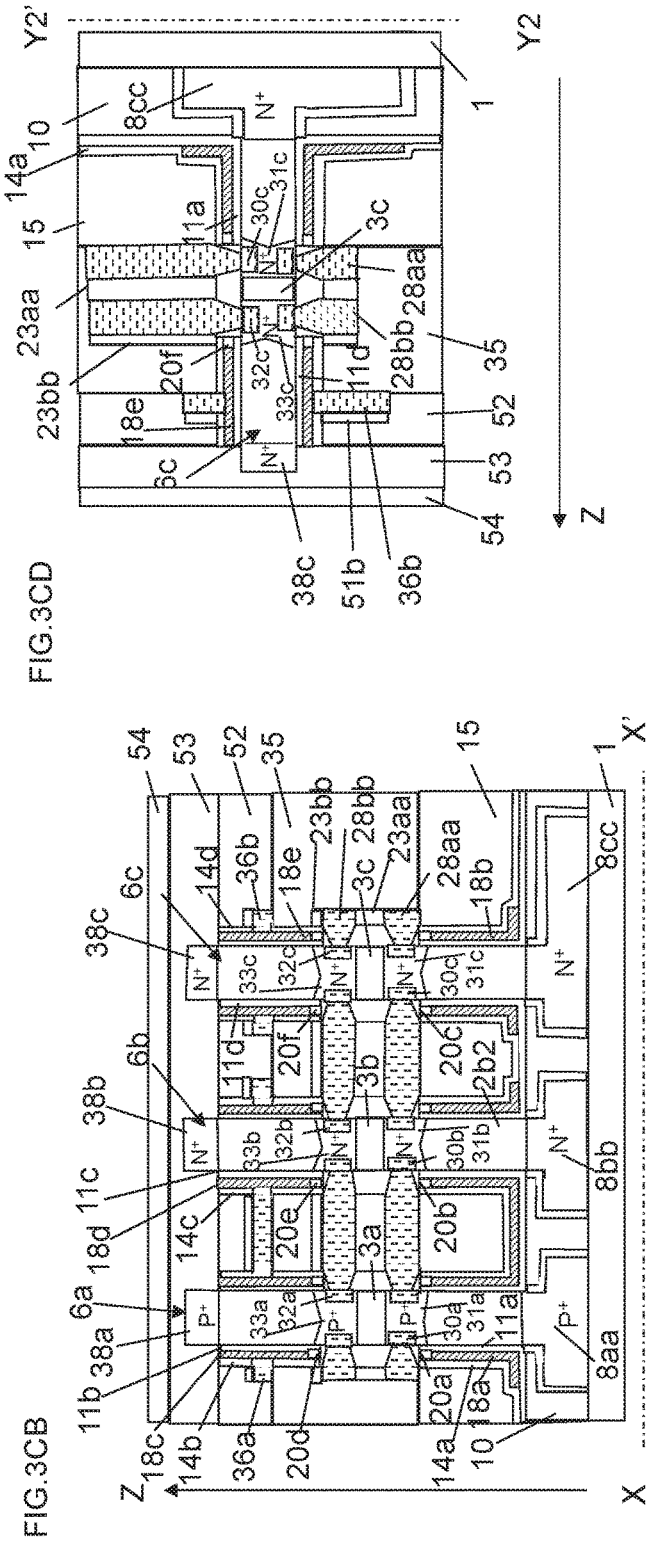
Figure 3C:
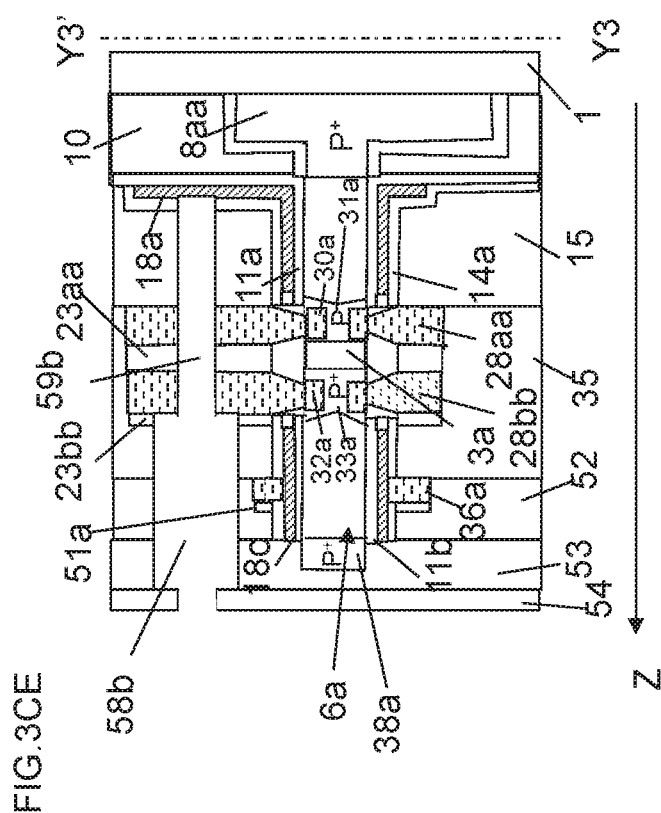

Subsequently, as illustrated in FIGS. 3CA to 3CE, RIE (etching in the vertical direction) is carried out with the resist layer 54 as a mask, to form a contact hole 59a so as to extend through the NiSi layer 36a, the SiN layer 35, the SiO$_2$ layer 23bb, the NiSi layer 28bb, and the SiO$_2$ layer 23aa to the NiSi layer 28aa. Similarly, RIE (etching in the vertical direction) is carried out with the resist layer 54 as a mask, to form a contact hole 59b so as to extend through the NiSi layer 28bb, the SiO$_2$ layer 23aa, the NiSi layer 28aa, the SiN layer 15, and the SiO$_2$ layer 14a to the TiN layer 18a. Subsequently, the resist layer 54 is removed.

Figure 3D:
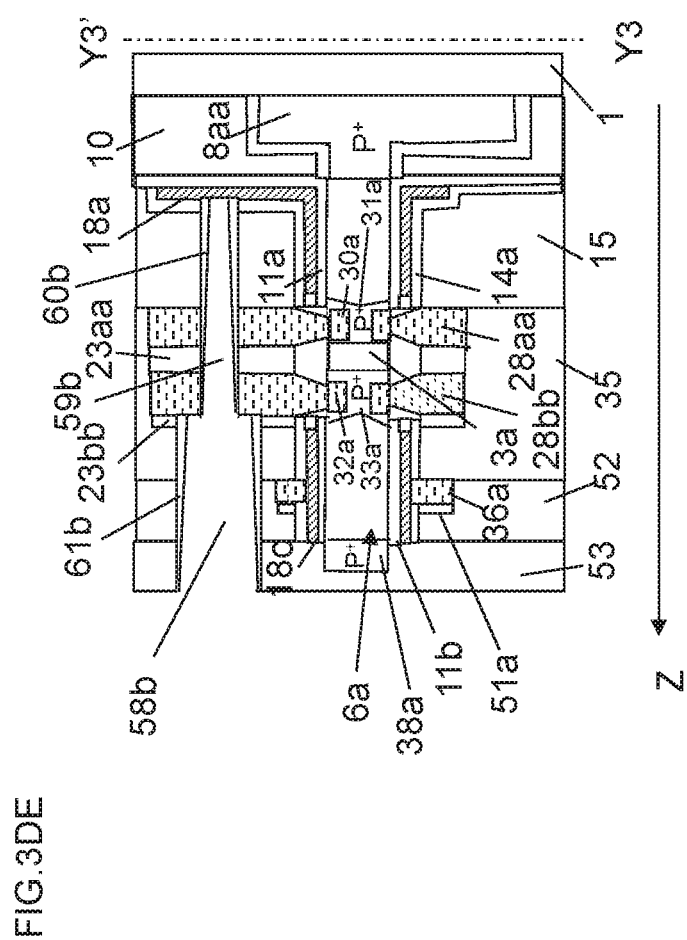
FIGS. 3DA to 3DE are a plan view and sectional structural views that illustrate a method for producing an SGT-including pillar-shaped semiconductor device according to a second embodiment.

Subsequently, as illustrated in FIGS. 3DA to 3DE, an ALD process is carried out to deposit a SiO$_2$ layer (not shown) over the whole structure including the inner side surfaces of the contact holes 58a, 58b, 59a, and 59b. Subsequently, RIE is carried out to remove, within the contact holes 58a and 59a, portions of the SiO$_2$ layer on the upper surfaces of the NiSi layers 28aa and 36a. Similarly, RIE is carried out to remove, within the contact holes 58b and 59b, portions of the SiO₂ layer on the upper surfaces of the TiN layer 18a and the NiSi layer 28bb. As a result, a SiO₂ layer 61a is formed on the side surface of the contact hole 58a, and a SiO₂ layer 60a is formed on the side surface of the contact hole 59a. Similarly, a SiO₂ layer 61b is formed on the side surface of the contact hole 58b, and a SiO₂ layer 60b is formed on the side surface of the contact hole 59b.

Figure 3E:
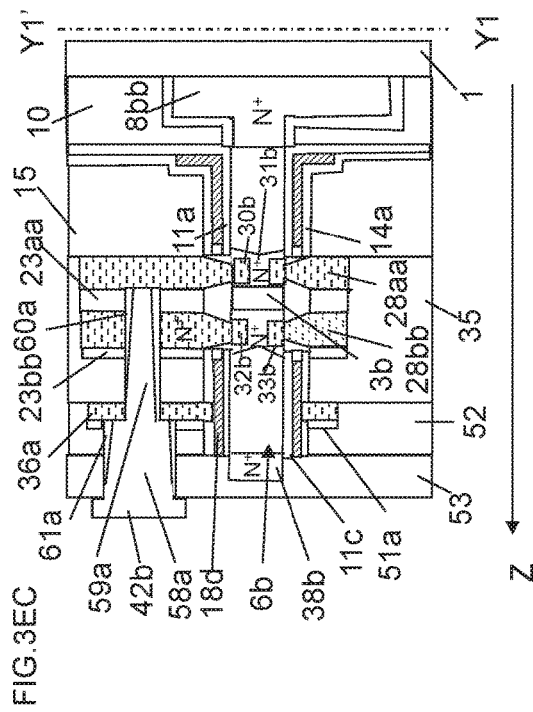
FIGS. 3EA to 3EE are a plan view and sectional structural views that illustrate a method for producing an SGT-including pillar-shaped semiconductor device according to a second embodiment.
Figure 3E:
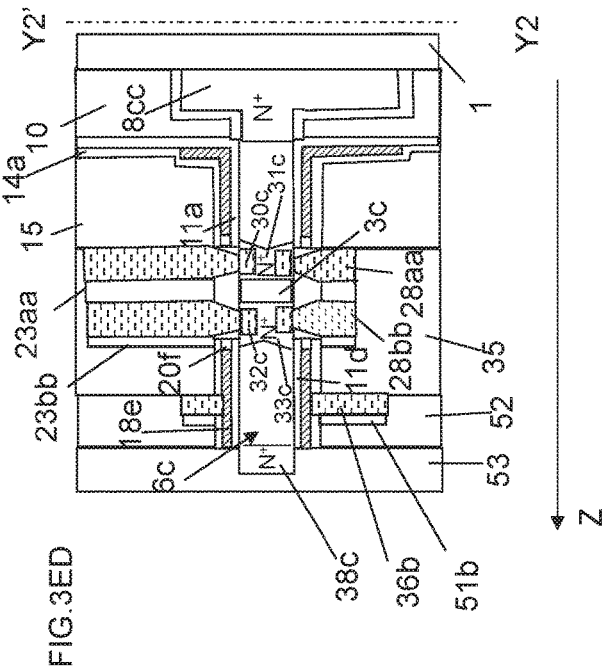
Figure 3E:
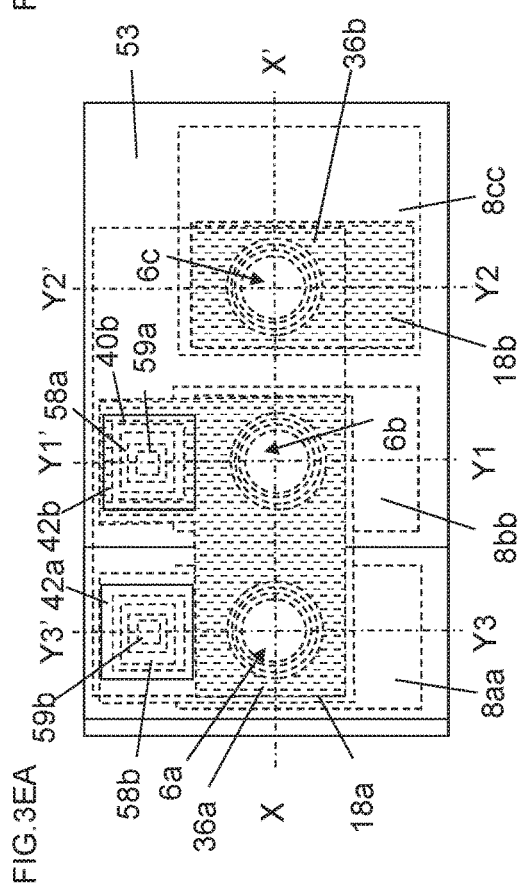
Figure 3E:
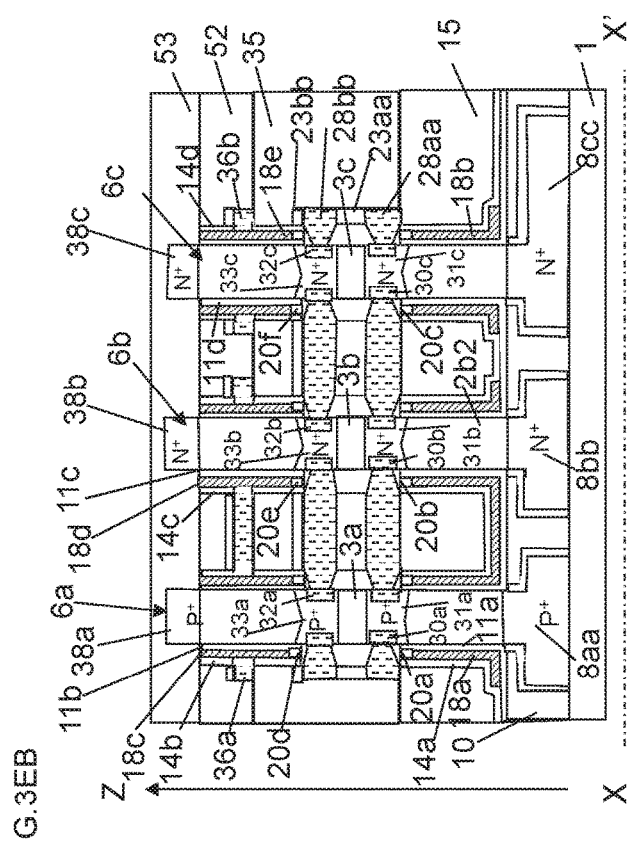
Figure 3E:
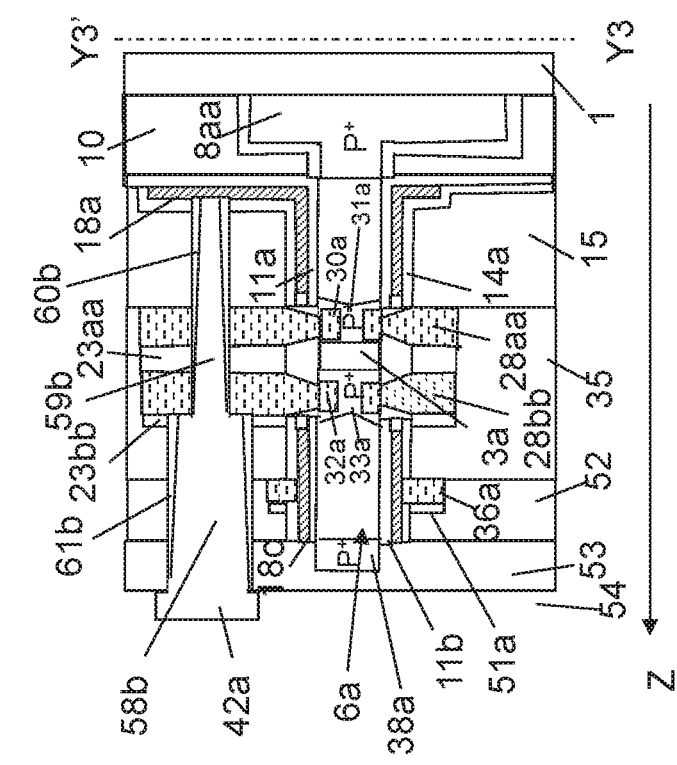

Subsequently, as illustrated in FIGS. 3EA to 3EE, a wiring metal layer 42b is formed in the contact holes 58a and 59a. As a result, the NiSi layer 28aa and the NiSi layer 36a are connected to each other via the wiring metal layer 42b. In this case, the SiO₂ layer 60a formed on the side surface of the contact hole 59a enables insulation between the NiSi layer 28bb and the wiring metal layer 42b. Similarly, a wiring metal layer 42a is formed in the contact holes 58b and 59b. As a result, the TiN layer 18a and the NiSi layer 28bb are connected to each other via the wiring metal layer 42a. The SiO₂ layer 60b formed on the side surface of the contact hole 59b enables insulation between the NiSi layer 28aa and the wiring metal layer 42a.

Subsequently, the same steps as in FIG. 2QA to FIG. 2SE are carried out to thereby provide, on the SiO₂ layer substrate 1, an SRAM cell circuit having the same structure as in the schematic structural view of FIG. 1B according to the first embodiment.

The production method for the SGT-including pillar-shaped semiconductor device according to the second embodiment provides the following advantages.

In this embodiment, the contact hole 58a and the contact hole 59a are formed in a self-aligned manner with the same resist layer 54 as the etching mask. Similarly, the contact hole 58b and the contact hole 59b are formed in a self-aligned manner with the same resist layer 54 as the etching mask. This enables an increase in the degree of integration of the SRAM cell circuit.

Third Embodiment

Figure 4C:
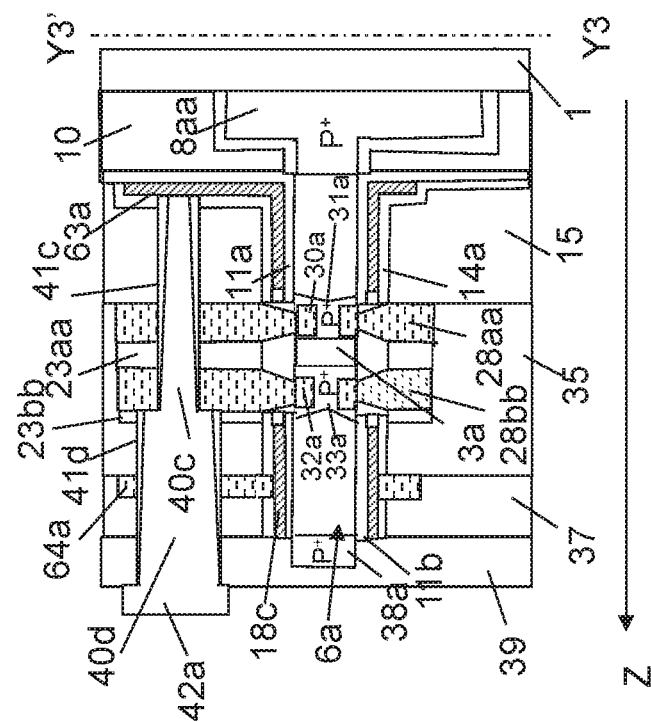
FIGS. 4CA to 4CE are a plan view and sectional structural views that illustrate a method for producing an SGT-including pillar-shaped semiconductor device according to a third embodiment.

Hereinafter, with reference to FIG. 4AA to FIG. 4CE, a method for producing an SGT-including pillar-shaped semiconductor device according to a third embodiment of the present invention will be described. Among FIG. 4AA to FIG. 4CE, figures suffixed with A are plan views; figures suffixed with B are sectional structural views taken along lines X-X' in the corresponding figures suffixed with A; figures suffixed with C are sectional structural views taken along lines Y1-Y1' in the corresponding figures suffixed with A; figures suffixed with D are sectional structural views taken along lines Y2-Y2' in the corresponding figures suffixed with A; and a figure suffixed with E is a sectional structural view taken along lines Y3-Y3' in the corresponding figure suffixed with A. The production method according to the third embodiment is the same as in the steps according to the first embodiment in FIGS. 2AA to 2SE except for the following differences.

FIGS. 4AA to 4AD correspond to the step in FIGS. 2EA to 2ED according to the first embodiment. The steps carried out prior to this step are the same as in the first embodiment. In plan view, a rectangular TiN layer 63a (the TiN layer 12a in FIG. 2EA has an L-shape) is formed so as to surround the Si pillars 6a and 6b, and a rectangular TiN layer 63b (having the same shape as the TiN layer 12b in FIG. 2EA) is formed so as to surround the Si pillar 6c. Subsequently, the same steps as in FIG. 2FA to FIG. 2KD according to the first embodiment are carried out.

Subsequently, the step in FIGS. 4BA to 4BD corresponding to FIGS. 2LA to 2LD is carried out. As illustrated in FIGS. 4BA to 4BD, in plan view, a rectangular NiSi layer 64a is formed so as to surround the Si pillars 6a and 6b and connect to the TiN layers 18c and 18d, and a rectangular NiSi layer 64b is formed so as to surround the Si pillar 6c and connect to the TiN layer 18e. Subsequently, the same steps as in FIG. 2MA to FIG. 2QE according to the first embodiment are carried out.

Subsequently, the step in FIGS. 4CA to 4CE corresponding to FIGS. 2PA to 2PE is carried out. As illustrated in FIGS. 4CA to 4CE, a contact hole 40c is formed so as to extend through the NiSi layer 28bb, the SiO₂ layer 23aa, the NiSi layer 28aa, the SiN layer 15, and the SiO₂ layer 14a to the TiN layer 63a; a contact hole 40d is formed so as to extend through the SiO₂ layers 39 and 37, the NiSi layer 64a, the SiN layer 35, and the SiO₂ layer 23bb; a SiO₂ layer 41c is formed on the side surface of the contact hole 40c; and a SiO₂ layer 41d is formed on the side surface on the contact hole 40d. Subsequently, a wiring metal layer 42a is formed so as to connect the TiN layer 63a and the NiSi layer 28bb to each other via the contact holes 40c and 40d. In this case, the SiO₂ layer 41c formed on the side surface of the contact hole 40c and the SiO₂ layer 41d formed on the side surface of the contact hole 40d enable insulation of the wiring metal layer 42a from the NiSi layers 28aa and 64a.

Subsequently, the same steps as in FIG. 2QA to FIG. 2SE according to the first embodiment are carried out. This provides, on the SiO₂ layer substrate 1, an SRAM cell circuit having the same structure as in the schematic structural view of FIG. 1B according to the first embodiment.

The production method for the SGT-including pillar-shaped semiconductor device according to the third embodiment provides the following advantages.

An increase in the density of the semiconductor device is achieved by a reduction in the size of the shape (in plan view) of material layers patterned by a lithographic process. In this case, the shape (in plan view) of material layers patterned by a lithographic process is desirably rectangular or square. In this embodiment, in plan view, instead of the TiN layer 12a having an L-shape in the first embodiment, a rectangular TiN layer 63a is formed. Similarly, in plan view, instead of the NiSi layer 36a having an inverted L-shape in the first embodiment, a rectangular NiSi layer 64a is formed. As a result, all the material layers patterned by the lithographic process have a shape (in plan view) that is rectangular or square. This enables an increase in the density of the SRAM cell circuit.

Fourth Embodiment

Hereinafter, with reference to FIG. 5AA to FIG. 5EE, a method for producing an SGT-including pillar-shaped semiconductor device according to a fourth embodiment of the present invention will be described. Among FIG. 5AA to FIG. 5EE, figures suffixed with A are plan views; figures suffixed with B are sectional structural views taken along lines X-X' in the corresponding figures suffixed with A; figures suffixed with C are sectional structural views taken along lines Y1-Y1' in the corresponding figures suffixed with A; figures suffixed with D are sectional structural views taken along lines Y2-Y2' in the corresponding figures suffixed with A; and figures suffixed with E are sectional structural views taken along lines Y3-Y3' in the corresponding figures suffixed with A. The production method according to the fourth embodiment is the same as in the steps according to the first embodiment in FIGS. 2AA to 2SE except for the following differences.

Figure 5A:
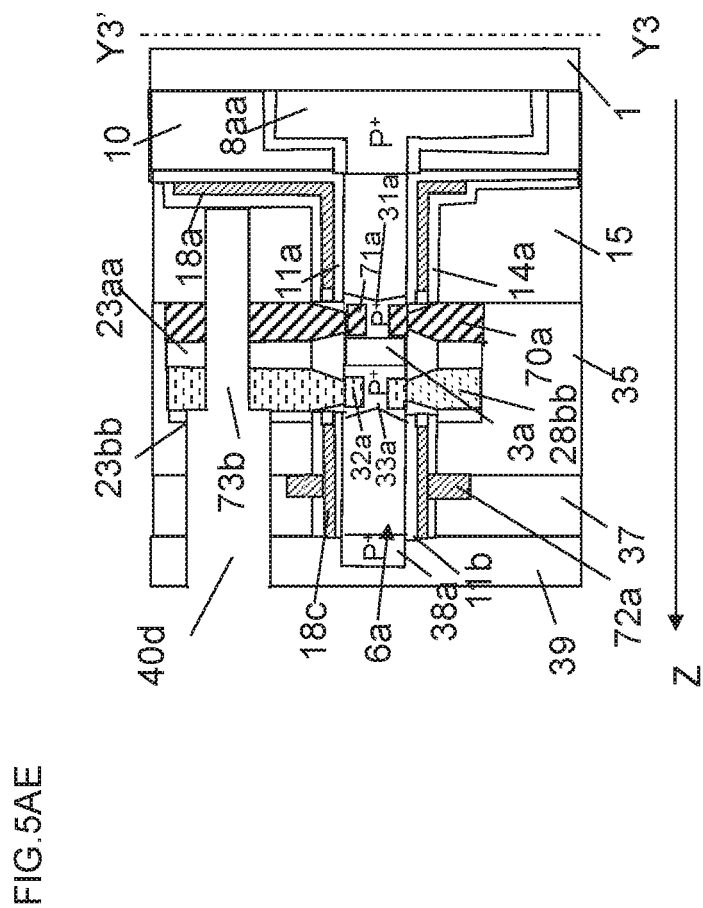
FIGS. 5AA to 5AE are a plan view and sectional structural views that illustrate a method for producing an SGT-including pillar-shaped semiconductor device according to a fourth embodiment of the present invention.

FIGS. 5AA to 5AE illustrate the step corresponding to that in FIGS. 20A to 20E. As illustrated in FIGS. 5AA to 5AE, instead of the NiSi layer 28aa, a CoSi layer 70a is formed, for example; instead of the NiSi layers 30a, 30b, and 30c, CoSi layers 71a, 71b, and 71c are formed, for example; instead of the NiSi layer 36a, a TiN layer 72a is formed, for example; and, instead of the NiSi layer 36b, a TiN layer 72b is formed, for example. Subsequently, a contact hole 73a is formed so as to extend to the SiO₂ layer 23aa (in FIG. 20C, formed so as to extend to the NiSi layer 28aa). Subsequently, the contact hole 73b is formed so as to extend to the SiO₂ layer 14a (in FIG. 20E, formed so as to extend to the TiN layer 18a).

Figure 5B:
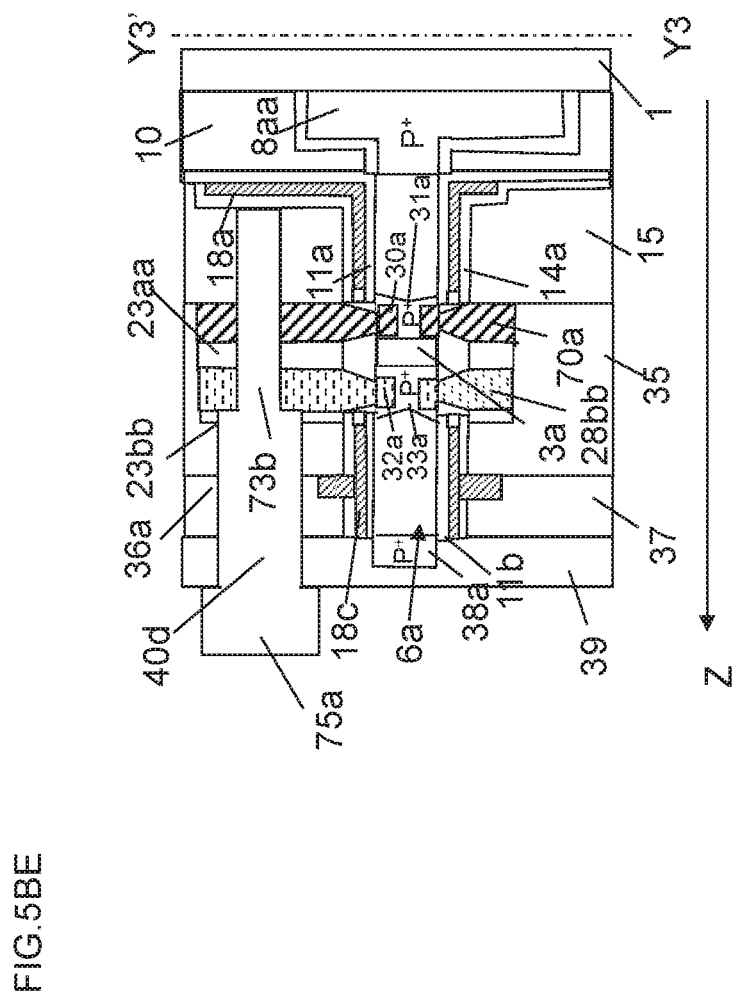
FIGS. 5BA to 5BE are a plan view and sectional structural views that illustrate a method for producing an SGT-including pillar-shaped semiconductor device according to a fourth embodiment.

Subsequently, as illustrated in FIGS. 5BA to 5BE, a resist layer 75a is formed so as to cover the contact holes 73b and 40d. Subsequently, for example, an isotropic plasma etching process is carried out with a reactive gas that etches NiSi but does not etch TiN, to etch the exposed side surface of the NiSi layer 28bb. As a result, in plan view, the outer peripheral shape of the contact hole 73a around the NiSi layer 28bb is expanded, compared with the outer peripheral shape of the contact hole 73a prior to the etching.

Figure 5C:
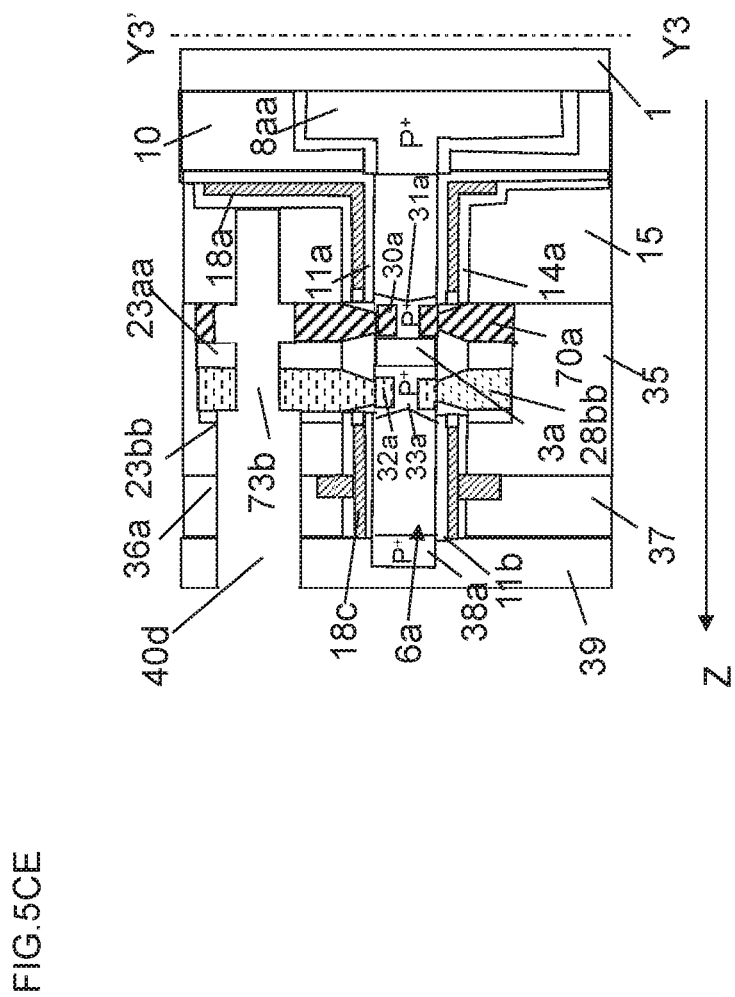
FIGS. 5CA to 5CE are a plan view and sectional structural views that illustrate a method for producing an SGT-including pillar-shaped semiconductor device according to a fourth embodiment.

Subsequently, as illustrated in FIGS. 5CA to 5CE, a resist layer 75b is formed so as to cover the contact holes 73a and 40c. Subsequently, for example, an isotropic plasma etching process is carried out with a reactive gas that etches CoSi but does not etch NiSi, to etch the exposed side surface of the CoSi layer 70a. As a result, in plan view, the outer peripheral shape of the contact hole 73b around the CoSi layer 70a is expanded, compared with the outer peripheral shape of the contact hole 73b prior to the etching.

Figure 5D:
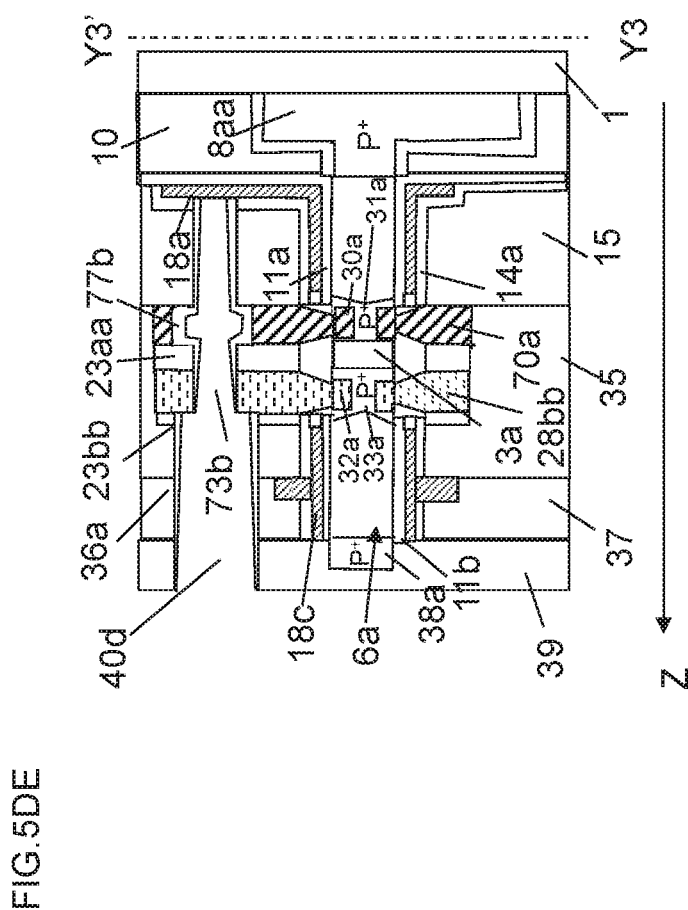
FIGS. 5DA to 5DE are a plan view and sectional structural views that illustrate a method for producing an SGT-including pillar-shaped semiconductor device according to a fourth embodiment.

Subsequently, as illustrated in FIGS. 5DA to 5DE, an ALD process is carried out to deposit a SiO₂ film (not shown) over the whole structure including the inner side surfaces and bottom portions of the contact holes 73a, 40c, 73b, and 40d. Subsequently, an RIE process is carried out to etch this SiO₂ film such that SiO₂ layers 77a and 77b are left on the inner side surfaces of the contact holes 73a, 40c, 73b, and 40d. Since the SiO₂ film is etched by an RIE process, portions of the SiO₂ film are etched off at the bottom portions of the contact holes 73a and 73b (on the CoSi layer 70a and on the TiN layer 18a) and at the bottom portions of the contact holes 40c and 40d (on the TiN layer 72a and on the NiSi layer 28bb). In this RIE, since the side surface of the NiSi layer 28aa is recessed in plan view with respect to the side surfaces of the SiO₂ layers 23aa and 23bb, and similarly the side surface of the CoSi layer 70a is recessed with respect to the side surfaces of the SiO₂ layers 23aa and 23bb, the remaining SiO₂ layers 77a and 77b on the side surfaces of the NiSi layer 28aa and the CoSi layer 70a still have the original thickness of the SiO₂ film at the time of deposition.

Figure 5E:
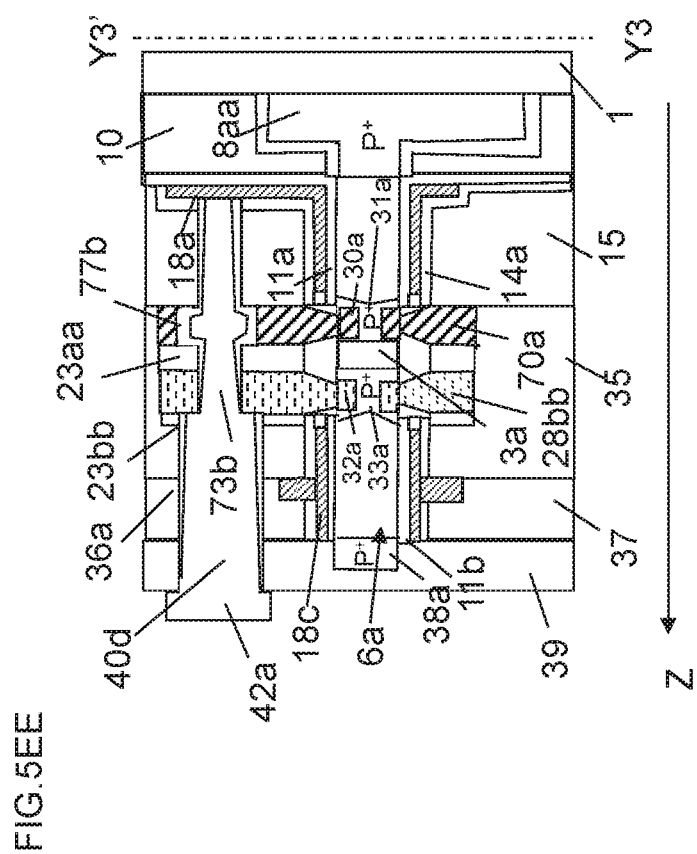
FIGS. 5EA to 5EE are a plan view and sectional structural views that illustrate a method for producing an SGT-including pillar-shaped semiconductor device according to a fourth embodiment.

Subsequently, as illustrated in FIGS. 5EA to 5EE, a wiring metal layer 42b is formed so as to cover the contact holes 73a and 40c, and a wiring metal layer 42a is formed so as to cover the contact holes 73b and 40d. Subsequently, the steps in FIG. 2QA to FIG. 2SE are carried out to provide the same SRAM cell circuit as in the first embodiment.

The production method for the SGT-including pillar-shaped semiconductor device according to the fourth embodiment provides the following advantages.

1. Since the SiO₂ layer 77a, which covers the side surface of the NiSi layer 28aa within the contact hole 73a, is left without being etched by RIE, insulation between the wiring metal layer 42b and the NiSi layer 28aa is achieved with certainty. Similarly, the SiO₂ layer 77b, which covers the side surface of the CoSi layer 70a within the contact hole 73b, is left without being etched by RIE, insulation between the wiring metal layer 42a and the CoSi layer 70a is achieved with certainty.

2. Since the SiO₂ layer 77a, which covers the side surface of the NiSi layer 28aa, has a larger thickness than the SiO₂ layer 41a in the first embodiment, which enables a decrease in the coupling capacitance between the NiSi layer 28aa and the wiring metal layer 42b, which connects to the TiN layer 72a and the CoSi layer 70a. Similarly, since the SiO₂ layer 77b, which covers the side surface of the CoSi layer 70a, has a larger thickness than the SiO₂ layer 41c in the first embodiment, which enables a decrease in the coupling capacitance between the CoSi layer 70a and the wiring metal layer 42b, which connects to the TiN layer 18a and the NiSi layer 28bb.

Fifth Embodiment

Hereinafter, with reference to FIG. 6AA to FIG. 6BE, a method for producing an SGT-including pillar-shaped semiconductor device according to a fifth embodiment of the present invention will be described. Among FIG. 6AA to FIG. 6BE, figures suffixed with A are plan views; figures suffixed with B are sectional structural views taken along lines X-X' in the corresponding figures suffixed with A; figures suffixed with C are sectional structural views taken along lines Y1-Y1' in the corresponding figures suffixed with A; figures suffixed with D are sectional structural views taken along lines Y2-Y2' in the corresponding figures suffixed with A; and a figure suffixed with E is a sectional structural view taken along line Y3-Y3' in the corresponding figure suffixed with A. The production method according to the fifth embodiment is the same as in the steps according to the first embodiment in FIG. 2AA to FIG. 2SE except for the following differences.

Figure 6A:
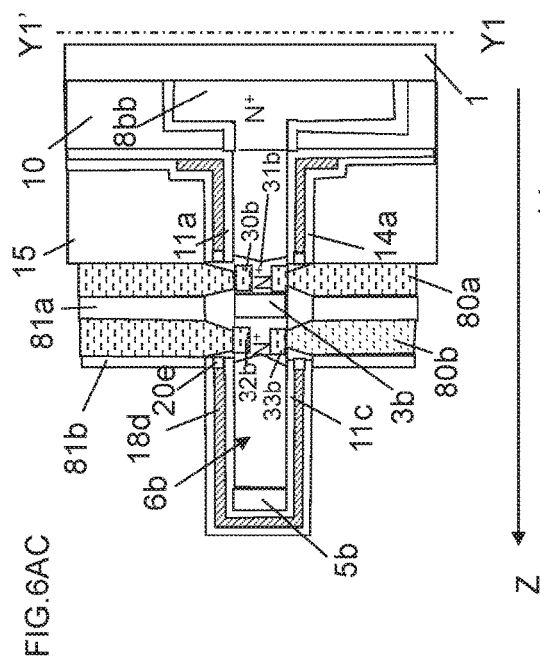
FIGS. 6AA to 6AD are a plan view and sectional structural views that illustrate a method for producing an SGT-including pillar-shaped semiconductor device according to a fifth embodiment of the present invention.
Figure 6A:
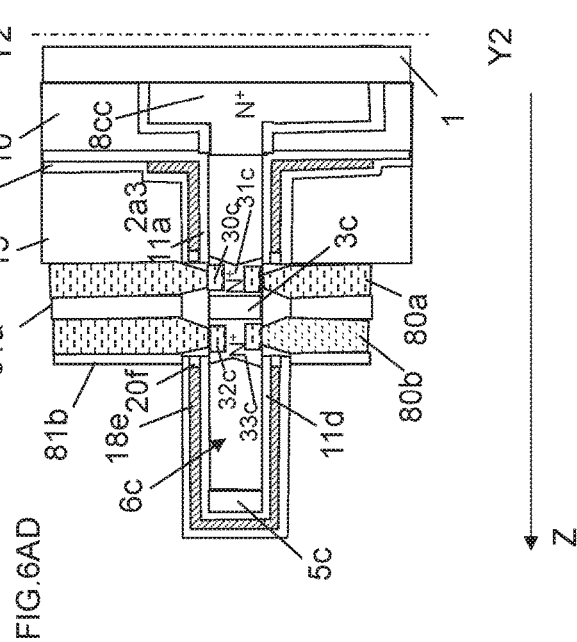
Figure 6A:
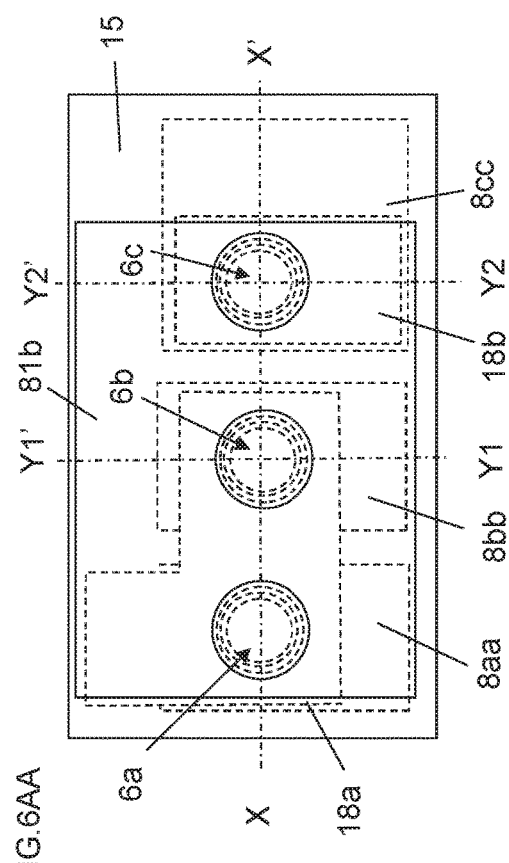
Figure 6A:
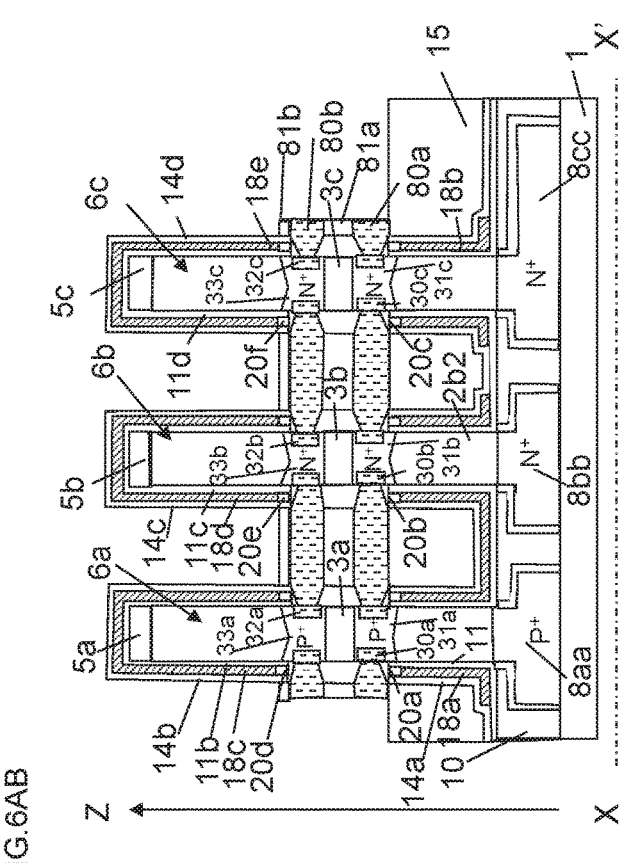

As illustrated in FIGS. 6AA to 6AD, compared with the NiSi layers 28aa and 28bb and the SiO₂ layers 23aa and 23bb in FIGS. 2KA to 2KD, NiSi layers 80a and 80b and SiO₂ layers 81a and 81b are formed so as to extend downward in plan view (that is, to a lower portion in the drawing) such that the lower end portions overlap the P⁺ layer Baa and the N⁺ layers 8bb and 8cc.

Figure 6B:
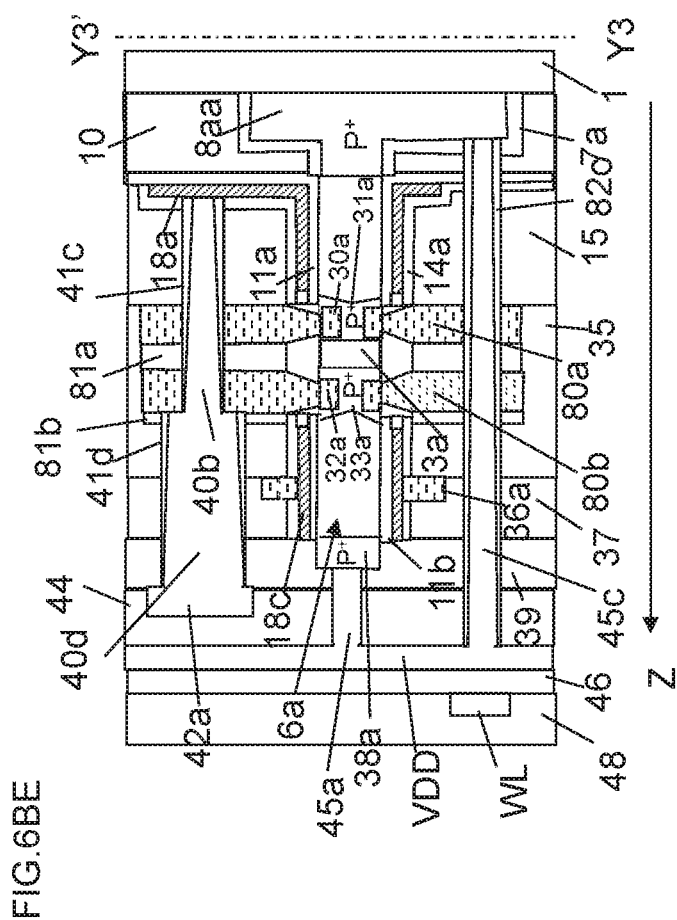
FIGS. 6BA to 6BE are a plan view and sectional structural views that illustrate a method for producing an SGT-including pillar-shaped semiconductor device according to a fifth embodiment of the present invention.
Figure 7E:
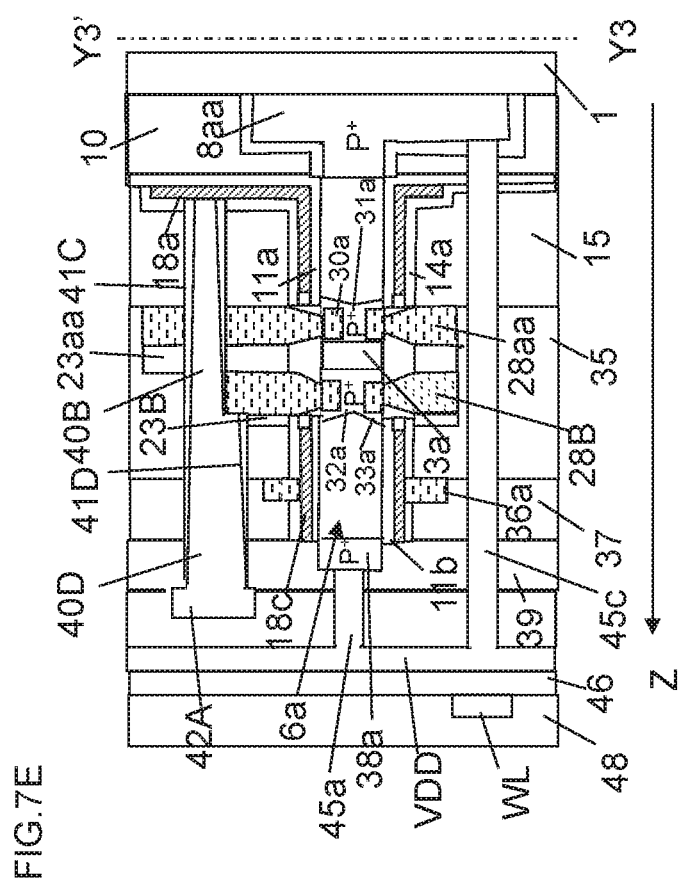
Figure 8:
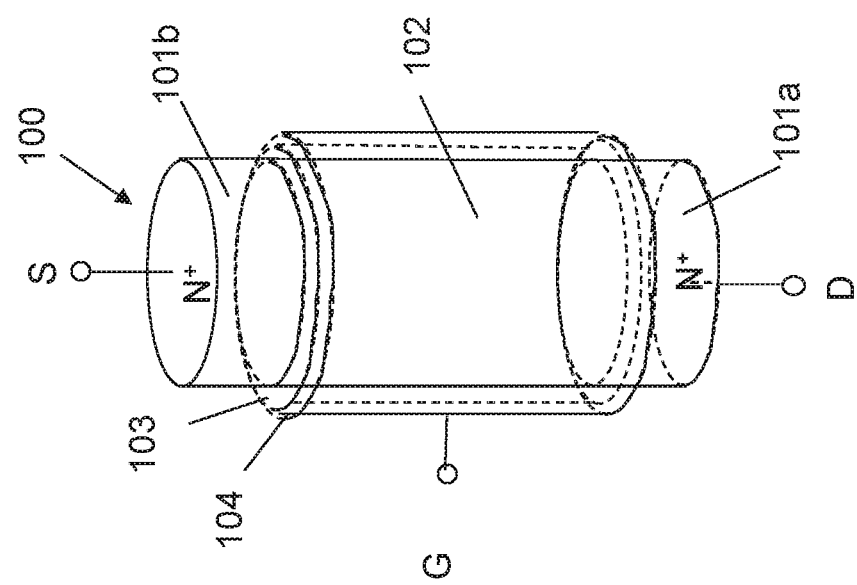
FIG. 8 is a schematic structural view of an existing SGT.

Subsequently, as illustrated in FIG. 6BC, a SiO₂ layer 82a is formed on the inner wall of the contact hole 45d, which extends through the SiO₂ layers 44, 39, and 37, the SiN layer 35, the SiO₂ layer 81b, the NiSi layer 80b, the SiO₂ layer 81a, the NiSi layer 80a, the SiN layer 15, and the SiO₂ layer 14a. Subsequently, a ground wiring metal layer VSS is formed so as to connect via the contact hole 45d to the N⁺ layer 8bb. The NiSi layers 80a and 80b are insulated from the ground wiring metal layer VSS by means of the SiO₂ layer 82a, which is an insulating layer.

Subsequently, as illustrated in FIG. 6BD, a contact hole 83a is formed so as to extend through the NiSi layer 36b, the SiN layer 35, the SiO₂ layer 81b, the NiSi layer 80b, the SiO₂ layer 81a, the NiSi layer 80a, the SiN layer 15, and the SiO₂ layer 14a to the TiN layer 18b. Subsequently, a contact hole 83b is formed so as to surround, in plan view, the outer periphery of the contact hole 83a and extend through the SiO₂ layers 46, 44, 39, and 37 to the NiSi layer 36b. Subsequently, a SiO₂ layer 82b is formed on the inner walls of the contact holes 83a and 83b. Subsequently, a word line wiring metal layer WL is formed so as to connect via the contact holes 83a and 83b to the TiN layer 18b. The NiSi layers 80a and 80b are insulated from the word line wiring metal layer WL by means of the SiO₂ layer 82b, which is an insulating layer.

Subsequently, as illustrated in FIG. 6BE, a contact hole 45c is formed so as to extend through the SiO₂ layers 44, 39, and 37, the SiN layer 35, the SiO₂ layer 81b, the NiSi layer 80b, the SiO₂ layer 81a, the NiSi layer 80a, the SiN layer 15, the SiO₂ layer 14a, the HfO₂ layer 11a, and the SiO₂ layers 10 and 7a; and a SiO₂ layer 82c is formed on the inner wall of the contact hole 45c. Subsequently, a power supply wiring metal layer VDD is formed so as to connect via the contact hole 45c to the P⁺ layer 8aa. The NiSi layers 80a and 80b are insulated from the power supply wiring metal layer VDD by means of the SiO₂ layer 82c, which is an insulating layer. Thus, an SRAM cell circuit as in the first embodiment is formed.

The production method for the SGT-including pillar-shaped semiconductor device according to the fifth embodiment provides the following advantages.

As illustrated in FIG. 6BD, the contact hole 83a, which extends between the NiSi layer 36b as an upper wiring conductor layer and the TiN layer 18b as a lower wiring conductor layer (the NiSi layer 36b and the TiN layer 18b are connected to each other), extends through two NiSi layers 80a and 80b as intermediate wiring conductor layers between the NiSi layer 36b and the TiN layer 18b, which are connected to each other. The word line wiring metal layer WL, which connects to the NiSi layer 36b and the TiN layer 18b, is insulated from the NiSi layers 80a and 80b by means of the SiO₂ layer 82b.

Similarly, as illustrated in FIG. 6BE, the contact hole 45c, which connects the power supply wiring metal layer VDD (an upper wiring conductor layer connecting to the P⁺ layer 38a) and the P⁺ layer Baa (a lower wiring conductor layer) to each other, extends through two NiSi layers 80a and 80b, which are insulated intermediate wiring conductor layers.

In the first embodiment, two contact holes each connecting an upper wiring conductor layer and a lower wiring conductor layer to each other, each extend through a single insulated intermediate wiring conductor layer. By contrast, in this embodiment, a contact hole connecting an upper wiring conductor layer and a lower wiring conductor layer to each other, extends through two insulated intermediate wiring conductor layers. This provides flexible design of circuits, which enables design of circuits with a higher density.

The present invention is also applicable to the following structure: a contact hole connecting an upper wiring conductor layer and a lower wiring conductor layer to each other, extends through two or more insulated intermediate wiring conductor layers.

Sixth Embodiment

Hereinafter, with reference to FIGS. 7A to 7E, a method for producing an SGT-including pillar-shaped semiconductor device according to a sixth embodiment of the present invention will be described. Among FIGS. 7A to 7E, a figure suffixed with A is a plan view; a figure suffixed with B is a sectional structural view taken along line X-X' in the corresponding figure suffixed with A; a figure suffixed with C is a sectional structural view taken along line Y1-Y1' in the corresponding figure suffixed with A; a figure suffixed with D is a sectional structural view taken along line Y2-Y2' in the corresponding figure suffixed with A; and a figure suffixed with E is a sectional structural view taken along line Y3-Y3' in the corresponding figure suffixed with A. The production method according to the sixth embodiment is the same as in the steps according to the first embodiment in FIGS. 2AA to 2SE except for the following differences.

In this embodiment, a NiSi layer 36A (corresponding to the NiSi layer 36a in FIGS. 2SA to 2SE) and a NiSi layer 28B (corresponding to the NiSi layer 28bb in FIGS. 2SA to 2SE) are formed such that, in plan view, side surfaces of the NiSi layers 36A and 28B are in contact with or traverse a region where the contact hole 40A (corresponding to the contact hole 40a) is to be formed. The NiSi layer 36A is also formed such that, in plan view, a side surface of the NiSi layer 36A traverses a region where the contact hole 40C (corresponding to the contact hole 40c in FIGS. 2SA to 2SE) is to be formed. As a result, as illustrated in FIGS. 7A to 7E, in plan view, the NiSi layers 36A and 28B are in contact with at least portions of the outer periphery of the contact hole 40A, and the NiSi layer 36A at least partially overlaps the contact hole 40C. In addition, in this embodiment, as illustrated in FIGS. 7A to 7E, SiO₂ layers 41A and 41B (corresponding to the SiO₂ layers 41a and 41b in FIGS. 2SA to 2SE) are formed on the inner side surfaces of the contact holes 40A and 40C; and a wiring metal layer 42B (corresponding to the wiring metal layer 42b in FIGS. 2SA to 2SE) in the contact holes 40A and 40C connects the NiSi layer 28aa and the NiSi layer 36A to each other.

Similarly, the NiSi layer 28B is formed such that, in plan view, a side surface of the NiSi layer 28B is in contact with or traverses a region where the contact hole 40B (corresponding to the contact hole 40b in FIGS. 2SA to 2SE) is to be formed. The NiSi layer 28B is also formed such that, in plan view, a side surface of the NiSi layer 28B traverses a region where the contact hole 40D (corresponding to the contact hole 40d in FIGS. 2SA to 2SE) is to be formed. As a result, as illustrated in FIGS. 7A to 7E, in plan view, the NiSi layer 28B is in contact with at least a portion of the outer periphery of the contact hole 40B, and the NiSi layer 28B at least partially overlaps the contact hole 40D. In addition, in this embodiment, as illustrated in FIGS. 7A to 7E, SiO₂ layers 41C and 41D (corresponding to the SiO₂ layers 41c and 41d in FIGS. 2SA to 2SE) are formed on the inner side surfaces of the contact holes 40B and 40D; and the TiN layer 18a and the NiSi layer 28B are connected to each other via the wiring metal layer 42A (corresponding to the wiring metal layer 42a in FIGS. 2SA to 2SE) within the contact holes 40B and 40D.

In the first embodiment, in plan view, the NiSi layer 28bb surrounds the contact holes 40a and 40b, and the NiSi layer 36a surrounds the contact hole 40a. On the other hand, in this embodiment, in plan view, the NiSi layer 28B is formed so as to be in contact with at least portions of the outer peripheries of the contact holes 40A and 40B; and the NiSi layer 36A is formed so as to be in contact with at least a portion of the outer periphery of the contact hole 40A. Alternatively, the NiSi layers 28B and 36A may be obviously formed so as not to be in contact with the contact holes 40A and 40B.

This enables an increase in the mask alignment tolerance between the contact hole 40A and the NiSi layers 28B and 36A, and an increase in the mask alignment tolerance between the contact hole 40B and the NiSi layer 28B. This leads to a reduction in the area of the SRAM cell.

In addition, in the first embodiment, in plan view, the NiSi layers 36a and 28a overlap the entirety of the contact holes 40c and 40d. On the other hand, in this embodiment, in plan view, the NiSi layers 36A and 28B are formed so as to overlap at least portions of the contact holes 40C and 40D.

This enables an increase in the mask alignment tolerance between the contact holes 40C and 40D and the NiSi layers 36A and 28B. This leads to a reduction in the area of the SRAM cell.

Incidentally, the first embodiment describes the SGT-including SRAM circuit as an example. However, the present invention is also applicable to formation of other SGT-including circuits. SGTs have a feature of providing a high-density structure in the formation of a circuit. Thus, for example, as described in the first embodiment, the following elements are formed so as to partially overlap in plan view: the power supply wiring metal layer VDD, the ground wiring metal layer VSS, the bit line wiring metal layer BL, and the inverted bit line wiring metal layer BLR, which are individually disposed in a horizontal direction and connect to some of the $N^+$ layers 31b, 31c, 32b, and 32c and the $P^+$ layers 31a and 32a within the Si pillars 6a, 6b, and 6c, and the $N^+$ layers 38b and 38c and the $P^+$ layer 38a in the top portions of the Si pillars 6a, 6b, and 6c; the NiSi layers 28aa, 28bb, 36a, and 36b, which are wiring conductor layers disposed in a horizontal direction and connect to the gate TiN layers 18c, 18d, and 18e surrounding the outer peripheries of the Si pillars 6a, 6b, and 6c; and the gate TiN layers 18a and 18b disposed in a horizontal direction. Such overlapping between wiring conductor layers in plan view similarly occurs in formation of other SGT-including circuits. The same applies to other embodiments according to the present invention.

SGTs have another feature as follows: impurity regions serving as the source and the drain are formed in a semiconductor pillar, and a gate insulating layer and a gate conductor layer are formed so as to surround the semiconductor pillar. As a result, in plan view, the source/drain impurity regions, the gate insulating layer, and the gate conductor layer are substantially integrated within the semiconductor pillar. The source/drain impurity regions, the gate insulating layer, and the gate conductor layer connect to wiring conductor layers formed in a horizontal direction. In the first embodiment, the gate TiN layers 18a and 18b in the lower SGTs are constituted by gate conductor layer portions surrounding the outer peripheries of the Si pillars 6a, 6b, and 6c, and wiring conductor layer portions that extend horizontally. Similarly, the source P+ layer Baa and the $N^+$ layers 8bb and 8cc in the lower SGTs are constituted by the source impurity regions in the bottom portions of the Si pillars 6a, 6b, and 6c and wiring conductor layer portions that extend horizontally. Similarly, the drain $P^+$ layer 38a and $N^+$ layers 38b and 38c of the upper SGTs in the top portions of the Si pillars 6a, 6b, and 6c are connected to, via the contact holes 45a, 45b, and 45c, the wiring metal layers VDD, VSS, and BL, which are wiring conductor layers that extend horizontally. This embodiment according to the present invention provides advantages of enabling formation of high-density connections between wiring conductor layers connecting to SGTs. The same applies to other embodiments according to the present invention.

Incidentally, in the first embodiment, the source impurity regions in the bottom portions of the Si pillars 6a, 6b, and 6c and wiring conductor layer portions extending horizontally therefrom, which constitute the source P+ layer Baa and the $N^+$ layers 8bb and 8cc of the lower SGTs, are formed as the layers of the same material. Alternatively, for example, the wiring conductor layer portions may be formed of silicide or metal. The same applies to other embodiments according to the present invention.

In the first embodiment, the contact holes 40a and 40c are formed in a region where, in plan view, the NiSi layer 28aa as a lower wiring conductor layer, the NiSi layer 28bb as an intermediate wiring conductor layer, and the NiSi layer 36a as an upper wiring conductor layer are formed so as to overlap. In this case, the NiSi layer 28aa connects to the drain $N^+$ layer 31b of a lower SGT; the NiSi layer 28bb is connected to the drain $N^+$ layer 32b of an upper SGT; and the NiSi layer 36a is connected to the gate TiN layer 18d of an upper SGT. In the fifth embodiment, the lower wiring conductor layer connects to the gate TiN layer 18b of a lower SGT; the intermediate wiring conductor layer connects to the drain $N^+$ layers 31c and 33c of a lower SGT and an upper SGT; and the upper wiring conductor layer connects to the gate TiN layer 18e of an upper SGT. Thus, depending on the design of an SGT-including circuit, the combination of the source impurity regions, the drain impurity regions, and the gate conductor layers of SGTs that connect to the upper wiring conductor layer, the intermediate wiring conductor layer, and the lower wiring conductor layer can be appropriately changed. The same applies to other embodiments according to the present invention.

The first embodiment describes an SRAM cell circuit. However, the conductor wiring structure of the pillar-shaped semiconductor device according to the first embodiment is also applicable to other SGT circuits, such as DRAM circuits, MRAM circuits, and RRAM circuits as long as such circuits have a configuration in which plural wiring conductor layers connected to SGTs and horizontally extending partially overlap in plan view. The same applies to other embodiments according to the present invention.

The vertical NAND-type flash memory circuit includes plural memory cells stacked in the vertical direction, the memory cells each including a semiconductor pillar as the channel and including, around the semiconductor pillar, a tunnel oxide layer, a charge storage layer, an interlayer insulating layer, and a control conductor layer. Semiconductor pillars at both ends of these memory cells include a source line impurity layer corresponding to a source, and a bit line impurity layer corresponding to a drain. In addition, when one of memory cells on both sides of a memory cell functions as a source, the other functions as a drain. Thus, the vertical NAND-type flash memory circuit is one of SGT circuits. Therefore, the present invention is also applicable to NAND-type flash memory circuits.

In the first embodiment, the contact holes 40a and 40b are formed so as to extend from the $SiO_2$ layer 39 as the uppermost layer to the upper surfaces of the NiSi layer 28aa and the TiN layer 18a. However, overetching for the contact holes 40a and 40b may be obviously carried out such that the contact holes 40a and 40b extend from the $SiO_2$ layer 39 into the NiSi layer 28aa and the TiN layer 18a. The same applies to other embodiments according to the present invention.

In the first embodiment, two SGTs are formed in each of the Si pillars 6a, 6b, and 6c. However, the present invention is also applicable to formation of a circuit in which one or three or more SGTs are formed. Similarly, this is also applicable to other embodiments according to the present invention.

In the first embodiment, silicide is formed in the P-type poly-Si layers 22a and 22b and $N^+$-type poly-Si layers 26a and 26b due to Ni atoms in the Ni layers 21a and 21b, to thereby make the NiSi layers 28a and 28b protrude into the spaces 25a, 25b, and 25c. Instead of the Ni layers 21a and 21b, layers of another metal such as titanium (Ti) or cobalt (Co) may be employed to achieve protrusion of silicide layers into the spaces 25a, 25b, and 25c. Alternatively, silicide layers having a high content of metal atoms may be formed by, for example, sputtering deposition, and subsequently the silicide layers may be made to protrude into the spaces 25a, 25b, and 25c. Alternatively, another method may be employed to form connections between N$^+$ layers 31b, 31c, 32b, and 32c and the P$^+$ layers 31a and 32a, and the NiSi layers 28aa, 28bb, 36a, and 36b, which are wiring conductor layers horizontally disposed and connect to the gate TiN layers 18c, 18d, and 18e surrounding the outer peripheries of the Si pillars 6a, 6b, and 6c. Similarly, this is also applicable to other embodiments according to the present invention.

The first embodiment describes a configuration in which the SiO$_2$ layers 41a and 41c are formed on the side surfaces of the NiSi layers 36a and 28bb serving as upper wiring conductor layers, the side surfaces being at the side surfaces of the contact holes 40a and 40b. Alternatively, overetching by RIE may be carried out to remove the SiO$_2$ layers 41a and 41c from the side surfaces of the NiSi layers 36a and 28bb. Similarly, this is also applicable to other embodiments according to the present invention.

The first embodiment describes a configuration in which the Si pillars 6a, 6b, and 6c are formed on the SiO$_2$ layer substrate 1 to form the SRAM cell circuit. Alternatively, instead of the SiO$_2$ layer substrate 1, another substrate such as an SOI (Silicon on Insulator) substrate or a Si substrate may be employed. In the case of employing a Si substrate, well structures may be formed in the surface layer of the Si substrate, the well structures corresponding to the N$^+$ layer or P$^+$ layer functioning as the source or drain in the bottom portions of the Si pillars 6a, 6b, and 6c. Similarly, this is also applicable to other embodiments according to the present invention.

In the first embodiment, the wiring metal layers 42a, 42b, VDD, VSS, WL, BL, and BLR, which fill or connect to the contact holes 40a, 40b, 40c, 40d, 45a, 45b, 45c, 45d, 47, 49a, and 49b, may be constituted by plural conductor layers including, for example, a contact layer and a barrier layer. Some or all of the contact holes 40a, 40b, 40c, 40d, 45a, 45b, 45c, 45d, 47, 49a, and 49b may be filled with metal layers formed of, for example, tungsten (W) or copper (Cu), and other metal layers may be subsequently formed to form wiring conductor layers. The same applies to other embodiments according to the present invention.

In the first embodiment, formation of connections between the side surfaces of the Si pillars 6a, 6b, and 6c and the NiSi layers 28aa and 28bb, formation of the NiSi layers 30a, 30b, 30c, 32a, 32b, and 32c within the Si pillars 6a, 6b, and 6c, and formation of the P$^+$ layers 31a and 33a and the N$^+$ layers 31b, 31c, 33b, and 33c are carried out by a heat treatment in FIGS. 2KA to 2KD. These formation of connections between the side surfaces of the Si pillars 6a, 6b, and 6c and the NiSi layers 28aa and 28bb, formation of the NiSi layers 30a, 30b, 30c, 32a, 32b, and 32c within the Si pillars 6a, 6b, and 6c, and formation of the P$^+$ layers 31a and 33a and N$^+$ layers 31b, 31c, 33b, and 33c, are achieved at any appropriate timing by the final step for the production of the SGTs. The same applies to other embodiments according to the present invention.

The first embodiment describes a configuration employing the SiN layers 15 and 35, which are layers formed of a single material. Alternatively, composite material layers may be employed, for example, a composite material layer including a lower portion that is a SiO$_2$ layer and an upper portion that is a SiN layer. Alternatively, instead of the SiN layers 15 and 35, insulating material layers having a low diffusion coefficient of HF ions may be employed. This is also applicable to other embodiments according to the present invention.

The above embodiments describe examples in which semiconductor regions such as the semiconductor pillars, sources, and drains are formed of Si (silicon). However, this does not limit the present invention. The technical idea of the present invention is also applicable to SGT-including semiconductor devices that employ Si-containing semiconductor materials such as SiGe, or semiconductor materials other than Si.

The first embodiment relates to a configuration in which the gate conductive layers are the TiN layers 18a, 18b, 18c, and 18d. However, the gate conductive layers are not limited to this example and may be formed of another metal material. Alternatively, the gate conductive layers may have a multilayer structure including a metal layer and, for example, a poly-Si layer. Similarly, this is also applicable to other embodiments according to the present invention.

The fourth embodiment describes a configuration in which the wiring conductor layers are the TiN layers 18a and 18b, the CoSi layer 70a, the NiSi layer 28bb, and the TiN layers 72a and 72b. Alternatively, another combination of materials for the wiring conductor layers may be selected as long as it provides the intended properties in this embodiment. Similarly, this is also applicable to other embodiments according to the present invention.

In the fourth embodiment, the SiO$_2$ layer 77a is formed also on the side surface of the SiN layer 35 in the contact hole 73a. Alternatively, the SiO$_2$ layer may be completely removed from this side surface so that the SiO$_2$ layer 77a is left only on the side surface of the NiSi layer 28aa. In this case, the wiring metal layer 42b formed within the contact hole 73a is also insulated from the NiSi layer 28aa. Similarly, this is also applicable to other embodiments according to the present invention.

The present invention encompasses various embodiments and various modifications without departing from the broad spirit and scope of the present invention. The above-described embodiments are provided for understanding of examples of the present invention and do not limit the scope of the present invention. Features of the above-described examples and modifications can be appropriately combined. The above-described embodiments from which some optional features have been eliminated depending on the need still fall within the spirit and scope of the present invention.

Methods for producing SGT-including pillar-shaped semiconductor devices according to embodiments of the present invention provide highly integrated semiconductor devices.

The invention claimed is:

1. A method for producing an SGT-including pillar-shaped semiconductor device, the method comprising:
   a stack structure-providing step of providing a stack structure including
      at least one semiconductor structure including a semiconductor pillar formed on a substrate so as to be perpendicular to a surface of the substrate, a gate insulating layer formed so as to surround an outer periphery of the semiconductor pillar, a gate conductor layer formed so as to surround the gate insulating layer, a first impurity region formed within the semiconductor pillar, and a second impurity region formed within the semiconductor pillar,
      a first wiring conductor layer and at least one second wiring conductor layer present above the first wiring conductor layer that individually connect to any one of the gate conductor layer, the first impurity region, and the second impurity region of the at least one semiconductor structure, that extend in a horizontal direction along the surface of the substrate, and that at least partially overlap in plan view, and an interlayer insulating layer present between the first wiring conductor layer and the at least one second wiring conductor layer;

a contact hole formation step of forming a contact hole so as to extend to an upper surface of or into the first wiring conductor layer, so as to extend through the at least one second wiring conductor layer or be in contact with the at least one second wiring conductor layer, and so as to extend through the interlayer insulating layer or be in contact with the interlayer insulating layer;

a tubular insulating film formation step of forming a tubular insulating film on a side surface of the contact hole except for an exposed surface of the first wiring conductor layer; and a lead-out conductor layer formation step of forming a lead-out conductor layer within the contact hole so as to connect to the exposed surface of the first wiring conductor layer.

2. The method for producing an SGT-including pillar-shaped semiconductor device according to claim 1, wherein, in the stack structure-providing step, a third wiring conductor layer is further formed that connects to any one of the gate conductor layer, the first impurity region, and the second impurity region of the at least one SGT, that extends in a horizontal direction along the surface of the substrate, that at least partially overlaps the first wiring conductor layer and the at least one second wiring conductor layer in plan view, and that is present above the at least one second wiring conductor layer, in the contact hole formation step, before or after formation of the contact hole, a second contact hole is further formed so as to extend to an upper surface of an uppermost layer of the third wiring conductor layer or into the third wiring conductor layer, in the tubular insulating film formation step, another tubular insulating film is further formed on a side surface of the second contact hole except for an exposed surface of the uppermost layer of the third wiring conductor layer, and in the lead-out conductor layer formation step, another lead-out conductor layer is further formed within the second contact hole so as to connect to the exposed surface of the uppermost layer of the third wiring conductor layer and to the tubular insulating film.

3. The method for producing an SGT-including pillar-shaped semiconductor device according to claim 2, wherein, in the contact hole formation step, after the contact hole is formed, the other contact hole is formed, and the other contact hole is formed so as to surround, in plan view, a whole or a portion of the contact hole.

4. The method for producing an SGT-including pillar-shaped semiconductor device according to claim 2, wherein the contact hole formation step includes a mask material layer formation step of forming, on the stack structure, a mask material layer having an opening, an upper contact hole formation step of etching, in a direction perpendicular to, the stack structure through the mask material layer as a mask to form the other contact hole that extends to the upper surface of the uppermost layer of the third wiring conductor layer or into the third wiring conductor layer, and subsequently subjecting the stack structure to isotropic etching such that the other contact hole in plan view is larger in width than the opening;

a lower contact hole formation step of etching, in a direction perpendicular to, the stack structure through the mask material layer as a mask, to form the contact hole that extends to the upper surface of or into the first wiring conductor layer, and that extends through the at least one second wiring conductor layer or is in contact with the at least one second wiring conductor layer; and a mask material layer removal step of removing the mask material layer.

5. The method for producing an SGT-including pillar-shaped semiconductor device according to claim 1, wherein, in the tubular insulating film formation step, an insulating material is filled into the contact hole, and the insulating material filled is etched off to the exposed surface of the first wiring conductor layer while an insulating film is left on the side surface of the stack structure, the side surface being in the contact hole.

6. The method for producing an SGT-including pillar-shaped semiconductor device according to claim 1, further comprising a contact hole expansion step of, after the contact hole formation step and before the tubular insulating film formation step, expanding a portion of the contact hole surrounded by the at least one second wiring conductor layer by etching, in plan view, outward with respect to the contact hole, a side surface of at least one of the at least one second wiring conductor layer, the side surface being in the contact hole.

* * * * *